US012749987B2

(12) United States Patent
Fukushima et al.

(10) Patent No.: US 12,749,987 B2
(45) Date of Patent: Sep. 29, 2026

(54) POWER CONVERSION DEVICE

(71) Applicant: DENSO CORPORATION, Kariya-city (JP)

(72) Inventors: Kazuma Fukushima, Kariya-city (JP); Hiroshi Taki, Kariya-city (JP)

(73) Assignee: DENSO CORPORATION, Kariya (JP)

( * ) Notice: Subject to any disclaimer, the term of this patent is extended or adjusted under 35 U.S.C. 154(b) by 159 days.

(21) Appl. No.: 18/911,330

(22) Filed: Oct. 10, 2024

(65) Prior Publication Data

US 2025/0038673 A1 Jan. 30, 2025

Related U.S. Application Data

(63) Continuation of application No. PCT/JP2023/014703, filed on Apr. 11, 2023.

(30) Foreign Application Priority Data

Apr. 29, 2022 (JP) ................................. 2022-075549

(51) Int. Cl.
*H02M 7/00* (2006.01)
*H05K 7/14* (2006.01)

(52) U.S. Cl.
CPC ........ *H02M 7/003* (2013.01); *H05K 7/14329* (2022.08)

(58) Field of Classification Search
CPC .... H02M 7/003; H02M 1/088; H02M 7/5387; H05K 7/14329; H05K 7/14322; H10W 40/226
See application file for complete search history.

(56) References Cited

U.S. PATENT DOCUMENTS 5,512,790 A 4/1996 Lachenmaier et al.
6,414,867 B2 * 7/2002 Suzuki ................. H02M 7/003 361/709

(Continued)

FOREIGN PATENT DOCUMENTS

DE 10 2015 218 622 A1 3/2017
EP 0431420 A2 6/1991

(Continued)

OTHER PUBLICATIONS

U.S. Appl. No. 18/910,088, filed Oct. 9, 2024 in the name of Shohei Nagai et al.

(Continued)

*Primary Examiner* — Kyle J Moody
(74) *Attorney, Agent, or Firm* — Oliff PLC

(57) ABSTRACT

An inverter device includes an inverter outer peripheral wall, a high voltage board, a control board, and an arm switch unit. The inverter outer peripheral wall has an inner peripheral surface. The high voltage board and the control board extend in a direction orthogonal to an axial direction. In the high voltage board and the control board, an outer peripheral end extends in a ring shape in a circumferential direction along the inner peripheral surface. In the arm switch unit, a drain terminal and a source terminal are connected to the high voltage board, and a gate terminal and a driver source terminal are connected to the control board. Multiple arm switch units are arranged in the circumferential direction along the outer peripheral end.

10 Claims, 41 Drawing Sheets

(56) References Cited

U.S. PATENT DOCUMENTS

| | | | | |
|---|---|---|---|---|
| 2001/0030039 | A1* | 10/2001 | Copeland | F28F 21/089 165/185 |
| 2002/0121358 | A1* | 9/2002 | Lee | H10W 40/226 165/185 |
| 2002/0195286 | A1* | 12/2002 | Shirakawa | B60L 15/007 257/E23.079 |
| 2011/0018374 | A1 | 1/2011 | Yamasaki et al. | |
| 2012/0076679 | A1 | 3/2012 | Saito et al. | |
| 2016/0020679 | A1 | 1/2016 | Nakayama | |
| 2017/0166303 | A1 | 6/2017 | Hartmann et al. | |
| 2018/0358863 | A1 | 12/2018 | Tanie et al. | |
| 2019/0001446 | A1 | 1/2019 | Podhrázký | |
| 2019/0229590 | A1 | 7/2019 | Wacknov et al. | |
| 2020/0395823 | A1 | 12/2020 | Zeng | |
| 2022/0045580 | A1 | 2/2022 | Poret et al. | |
| 2022/0077749 | A1 | 3/2022 | Cuenot et al. | |
| 2022/0329134 | A1 | 10/2022 | Wacknow et al. | |

FOREIGN PATENT DOCUMENTS

| | | |
|---|---|---|
| JP | 2005-143151 A | 6/2005 |
| JP | 2020-022287 A | 2/2020 |

OTHER PUBLICATIONS

U.S. Appl. No. 18/912,846, filed Oct. 11, 2024 in the name of Hiroshi Taki et al.

U.S. Appl. No. 18/912,869, filed Oct. 11, 2024 in the name of Takahiro Tera et al.

* cited by examiner

POWER CONVERSION DEVICE

CROSS REFERENCE TO RELATED APPLICATION

The present application is a continuation application of International Patent Application No. PCT/JP2023/014703 filed on Apr. 11, 2023, which designated the U.S. and claims the benefit of priority from Japanese Patent Application No. 2022-075549 filed on Apr. 29, 2022. The entire disclosures of all of the above applications are incorporated herein by reference.

TECHNICAL FIELD

The present disclosure relates to a power conversion device.

BACKGROUND

Conventionally, a power conversion device including a semiconductor module to convert electric power has been used.

SUMMARY

According to an aspect of the present disclosure, a power conversion device includes: a case; and a switch component that performs switching to convert electric power and accommodated in the case.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

Figure 1:
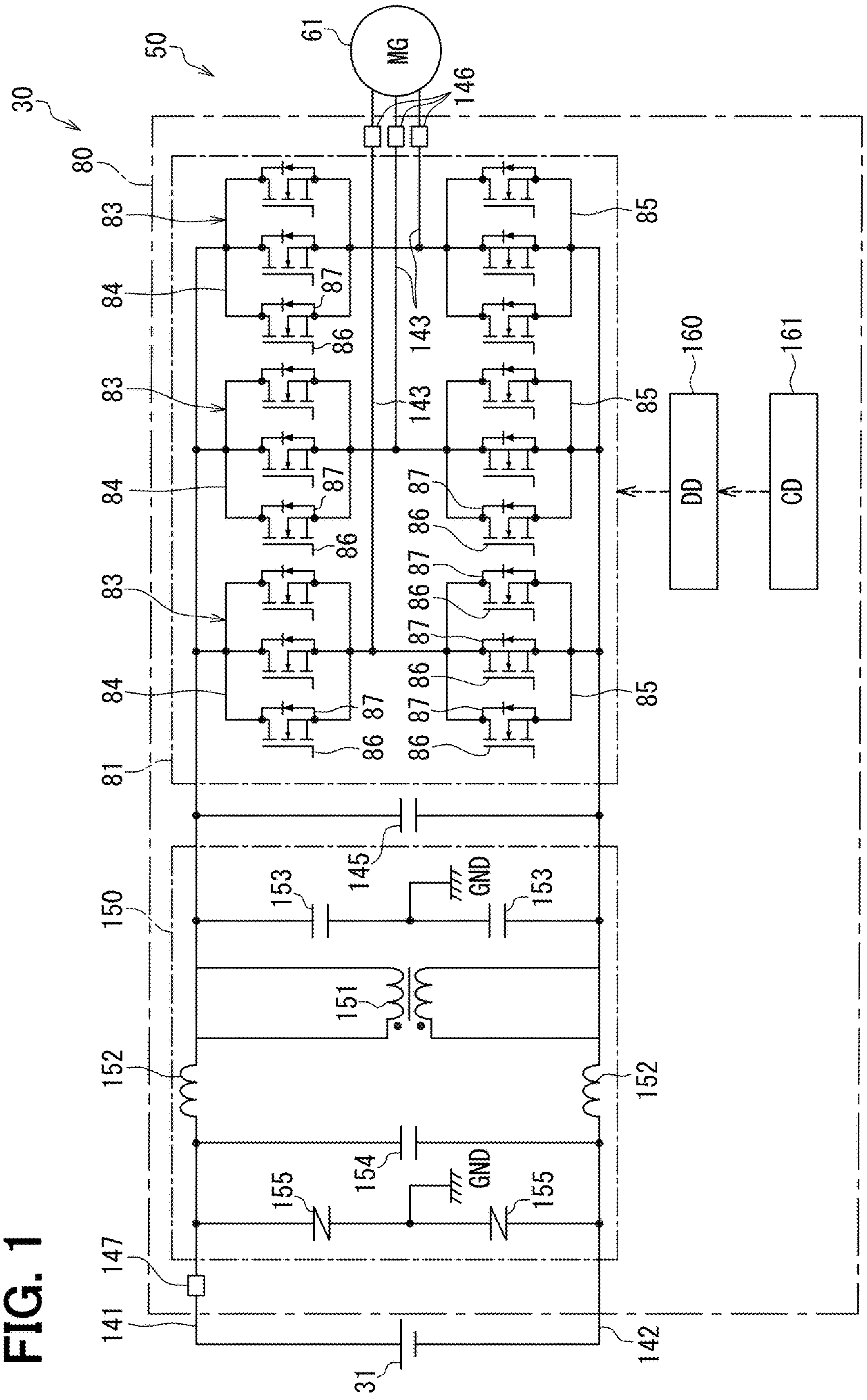
FIG. 1 is a diagram illustrating an electrical configuration of a drive system according to a first embodiment.

Hereinafter, examples of the present disclosure will be described.

According to an example of the present disclosure, in a power conversion device, a semiconductor module, a busbar and a control circuit board are accommodated in a case. The semiconductor module includes a power terminal and a control terminal. The power terminal is electrically connected to the busbar, and the control terminal is connected to the control circuit board. Multiple semiconductor modules are stacked in a thickness direction of an outer peripheral wall of the case. The multiple semiconductor modules are provided on one side of the busbar in a stacking direction in which the multiple semiconductor modules are stacked.

According to an example, the multiple semiconductor modules are provided on one side of the busbar in the stacking direction. Therefore, a positional relationship between the semiconductor module and the busbar and the control circuit board is likely to vary for each semiconductor module. In this case, for example, since a parasitic inductance generated in an energization path including the power terminal and the control terminal varies in each semiconductor module, there is a concern that the operation accuracy of the power conversion device will decrease.

According to an example, a power conversion device for converting electric power is provided according to a disclosed aspect. The power conversion device includes:

a case that includes an outer peripheral wall extending in a ring shape;

a switch component that includes a power terminal to which electric power is supplied, a control terminal configured to control conversion of electric power, and a switch main body supporting the power terminal and the control terminal, and that performs switching to convert electric power;

a power connection object that includes a power outer peripheral end extending in a circumferential direction of the outer peripheral wall along an inner peripheral surface of the outer peripheral wall and that is electrically connected to the power terminal; and a control connection object that includes a control outer peripheral end extending in the circumferential direction along the inner peripheral surface and that is electrically connected to the control terminal.

Multiple switch components are arranged in the circumferential direction along the power outer peripheral end and the control outer peripheral end.

According to the above aspect, the multiple switch components are arranged in the circumferential direction along the power outer peripheral end and the control outer peripheral end. In the configuration, a positional relationship between the switch component and the power connection object and the control connection object is unlikely to vary among the multiple switch components. Therefore, it is unlikely that the switching accuracy varies among the multiple switch components, for example, due to a variation in the parasitic inductance generated in the energization path including the power terminal and the control terminal among the multiple switch components. Accordingly, the operation accuracy of the power conversion device can be increased.

Hereinafter, multiple embodiments for carrying out the present disclosure will be described with reference to the drawings. In each of the embodiments, the same reference numerals are assigned to portions corresponding to the items described in the preceding embodiments, and a repetitive description thereof may be omitted. In each embodiment, when only a part of the configuration is described, another embodiment previously described can be employed for the other parts of the configuration. Not only portions which are specifically clarified so as to be combined in each embodiment are capable of being combined, but also embodiments are capable of being partially combined with each other even though the combination is not clarified as long as no adverse effect is particularly generated with respect to the combination.

First Embodiment

A drive system 30 illustrated in FIG. 1 is mounted on a moving object such as a vehicle or a flight vehicle. Examples of the vehicle on which the drive system 30 is mounted include an electric vehicle (EV), a hybrid vehicle (HV), and a fuel cell vehicle. Examples of the flight vehicle include an aircraft such as a vertical take-off and landing aircraft, a rotorcraft, or a fixed-wing aircraft. This aircraft is sometimes referred to as an electric aircraft. Examples of the vertical take-off and landing aircraft include an eVTOL. The eVTOL is an abbreviation for electric vertical take-off and landing aircraft.

The drive system 30 is a system that drives the moving object to move. If the moving object is a vehicle, the drive system 30 drives the vehicle to travel, and if the moving object is a flight vehicle, the driving system 30 drives the flight vehicle to fly.

The drive system 30 includes a battery 31 and an EPU 50. The battery 31 is electrically connected to the EPU 50. The battery 31 is an electric power supply unit that supplies electric power to the EPU 50, and corresponds to a power supply unit. The battery 31 is a DC voltage source that applies a DC voltage to the EPU 50. The battery 31 includes a rechargeable secondary battery. Examples of the secondary battery include a lithium-ion battery and a nickel-hydrogen battery. In addition to or instead of the battery 31, a fuel cell, a generator, or the like may be used as the power supply unit.

The EPU 50 is a rotary electric machine unit including a motor electric magnetic circuit 61 and an inverter device 80, and is a device that drives the moving object to move. The EPU 50 mounted on the vehicle drives and rotates, for example, wheels as objects to be driven. The EPU 50 mounted on the flight vehicle drives and rotates, for example, rotary wings as objects to be driven. The EPU 50 may be referred to as an electric-powered electric drive device, a propulsion device that propels a flight vehicle, and the like.

The EPU 50 includes a motor device 60 (see FIG. 2) and the inverter device 80. For example, the EPU 50 includes one motor device 60 and one inverter device 80. The motor device 60 includes the motor electric magnetic circuit 61. The inverter device 80 includes an inverter main circuit 81 including multiple switch elements. The motor device 60 corresponds to a rotary electric machine, and the inverter device 80 corresponds to a power conversion device. The battery 31 is electrically connected to the motor electric magnetic circuit 61 via the inverter main circuit 81. Electric power is supplied to the motor electric magnetic circuit 61 according to a voltage and a current supplied from the battery 31 to the inverter main circuit 81.

The motor electric magnetic circuit 61 is a multi-phase AC motor. The motor electric magnetic circuit 61 is, for example, a three-phase AC motor, and a brushless motor having a U phase, a V phase, and a W phase is used. The motor electric magnetic circuit 61 functions as a generator during regeneration. Although coils of the motor electric magnetic circuit 61 are normally of three phases of the U phase, the V phase, and the W phase, the number of phases and the method for connection are not limited.

The inverter main circuit 81 converts, by a high-speed switch, the electric power supplied to the motor electric magnetic circuit 61 from a direct current to an alternating current. The inverter main circuit 81 is a power conversion unit that converts electric power. The inverter main circuit 81 performs power conversion with respect to each of the multiple phases.

The inverter device 80 includes a P line 141 and an N line 142. The P line 141 and the N line 142 electrically connect the battery 31 and the inverter main circuit 81. The P line 141 is electrically connected to a positive electrode of the battery 31. The N line 142 is electrically connected to a negative electrode of the battery 31. The battery 31 has a function of supplying electric power and being charged with electric power.

The inverter device 80 includes a smoothing capacitor 145 and an EMI filter 150 in addition to the inverter main circuit 81. The smoothing capacitor 145 includes multiple capacitors connected in parallel, and is connected to the P line 141 and the N line 142. The smoothing capacitor 145 smoothens a current ripple flowing due to an intermittent operation of the inverter main circuit 81, and stabilizes the current supplied from the battery 31.

The EMI filter 150 is a filter circuit that reduces electromagnetic noise generated from the EPU 50 between the battery 31 and the inverter main circuit 81. The EMI filter 150 is connected to the P line 141, the N line 142, and the ground earth of the EPU. The EMI filter 150 may be omitted in an EPU system in which a case and a wiring are sufficiently shielded.

The EMI filter 150 includes components such as a common mode coil 151, a normal mode coil 152, a Y capacitor 153, an X capacitor 154, and a varistor 155. In the EMI filter 150, the number of stages, a circuit configuration, and a circuit component constant of the common mode coil 151, the normal mode coil 152, the Y capacitor 153, and the X capacitor 154 are designed in accordance with a required EMI standard. The varistor 155 absorbs a surge from the outside such as a lightning surge, and protects electronic components and the electric devices in the EPU 50 from the surge.

When one set of an upper arm 84 and a lower arm 85 is referred to as a single phase leg, the inverter main circuit 81 forms a circuit corresponding to the number of phases of the motor such as a U phase, a V phase, and a W phase by connecting multiple legs in parallel. A high potential side of the upper arm 84 is connected to the P line 141, and a low potential side of the lower arm 85 is connected to the N line 142. In each leg, a low potential side of the upper arm 84 and a high potential side of the lower arm 85 are tied together and are connected to an output line 143.

The upper arm 84 and the lower arm 85 include an arm switch 86 that has a function of selecting a conducting state or a non-conducting state and performing switch control, and a diode 87 that has a function of allowing a current to flow from a low potential side to a high potential side even in a non-conducting state. The arm switch 86 is, for example, a transistor such as a MOSFET or an RC-IGBT. The arm switch 86 is implemented by a single component having both the arm switch 86 and the diode 87. The arm switch 86 may be referred to as a transistor switch.

Figure 5:
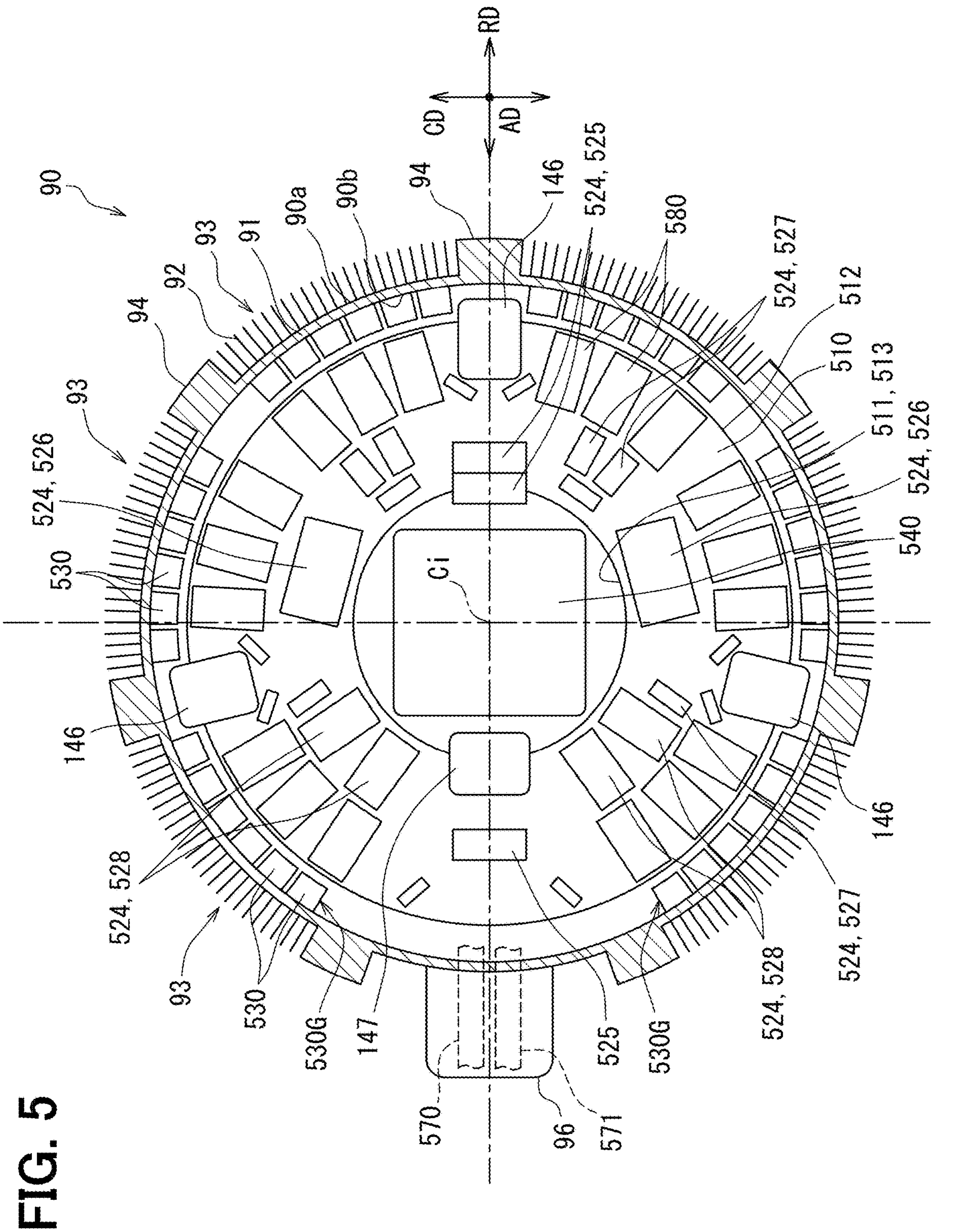
FIG. 5 is a top view of an inner portion of the inverter device in a configuration group A as viewed from a high voltage side.
Figure 11:
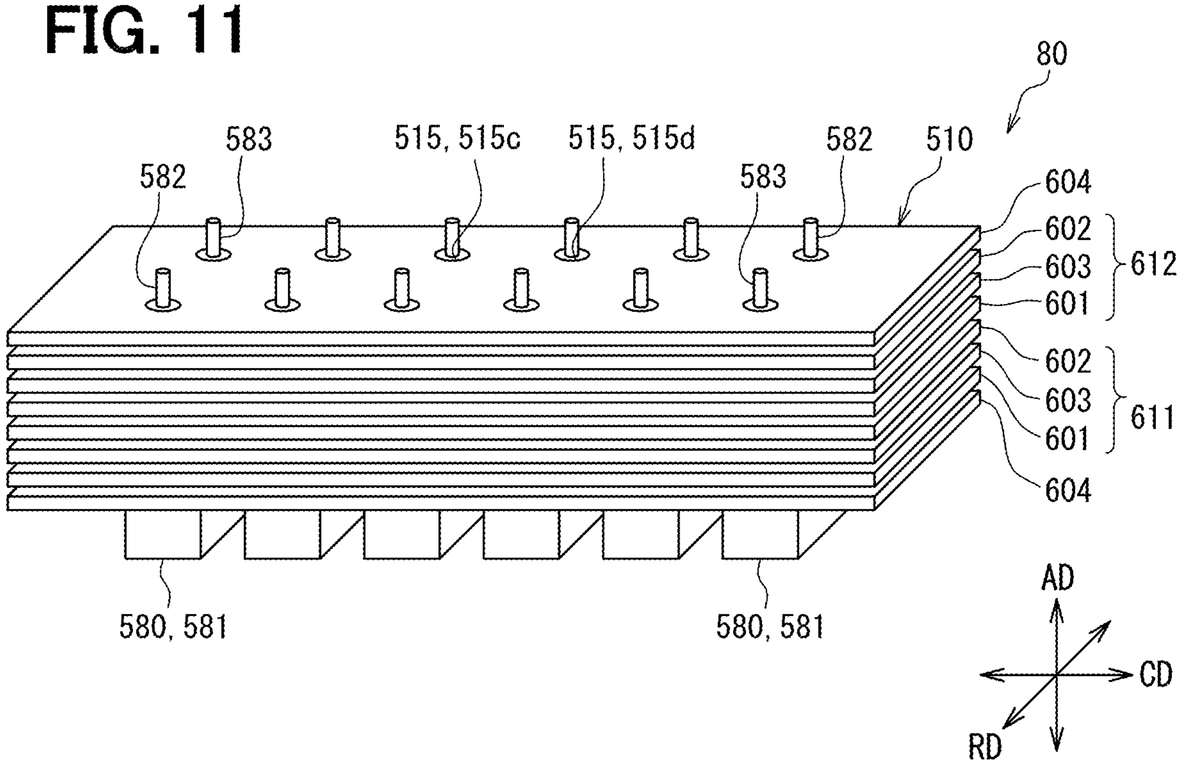
FIG. 11 is a perspective view of an internal structure of a high voltage board as viewed from the low voltage side in a configuration group B.

Each of the upper arm 84 and the lower arm 85 includes one or more arm switches 86 and one or more diodes 87. In the upper arm 84 and the lower arm 85, multiple elements may be connected in parallel. In FIGS. 1 and 11, three parallel connections are shown as an example. In FIG. 5 and the like, six parallel connections are shown as an example.

The inverter device 80 includes a drive circuit 160 and a control circuit 161. In FIG. 1, DD denotes the drive circuit 160 and CD denotes the control circuit 161.

The control circuit 161 is a control device such as an ECU, and controls the switch elements of the inverter main circuit 81. The ECU is an abbreviation for electric control unit. The control circuit 161 is mainly implemented by a microcomputer circuit including, for example, a processor, a memory, an I/O, a power supply circuit, and a wiring connecting these components.

The control circuit 161 determines the conducting state of the arm switch 86 of the inverter main circuit 81 by executing a control program stored in the memory. The control circuit 161 is electrically connected to an external device and various sensors. The external device is, for example, a host ECU such as an integrated ECU mounted on a moving object. The external device has a function of commanding a drive torque and a rotation speed of the EPU 50 and monitoring a state of the EPU 50. The various sensors are signal sources required by a control program, such as temperature, current, voltage, angle, and speed of each component.

The drive circuit 160 is electrically connected to each of the arm switches 86 of the inverter main circuit 81. The drive circuit 160 drives a gate of the arm switch 86 to the conducting state and the non-conducting state by using a function of insulating, performing level conversion on, and amplifying a command signal from the control circuit 161. The drive circuit 160 may be referred to as a driver. The conducting state is referred to as an on-state, and the non-conducting state is referred to as an off-state.

Examples of various sensors built in the inverter device 80 include a motor current sensor 146 and a battery current sensor 147. The motor current sensor 146 is electrically connected to the control circuit 161, and, for example, is provided for each of the U phase, the V phase, the W phase to detect a current flowing through the output line 143. The battery current sensor 147 is provided, for example, on the P line 141, is electrically connected to the control circuit 161, and detects a current flowing through the battery 31.

Figure 2:
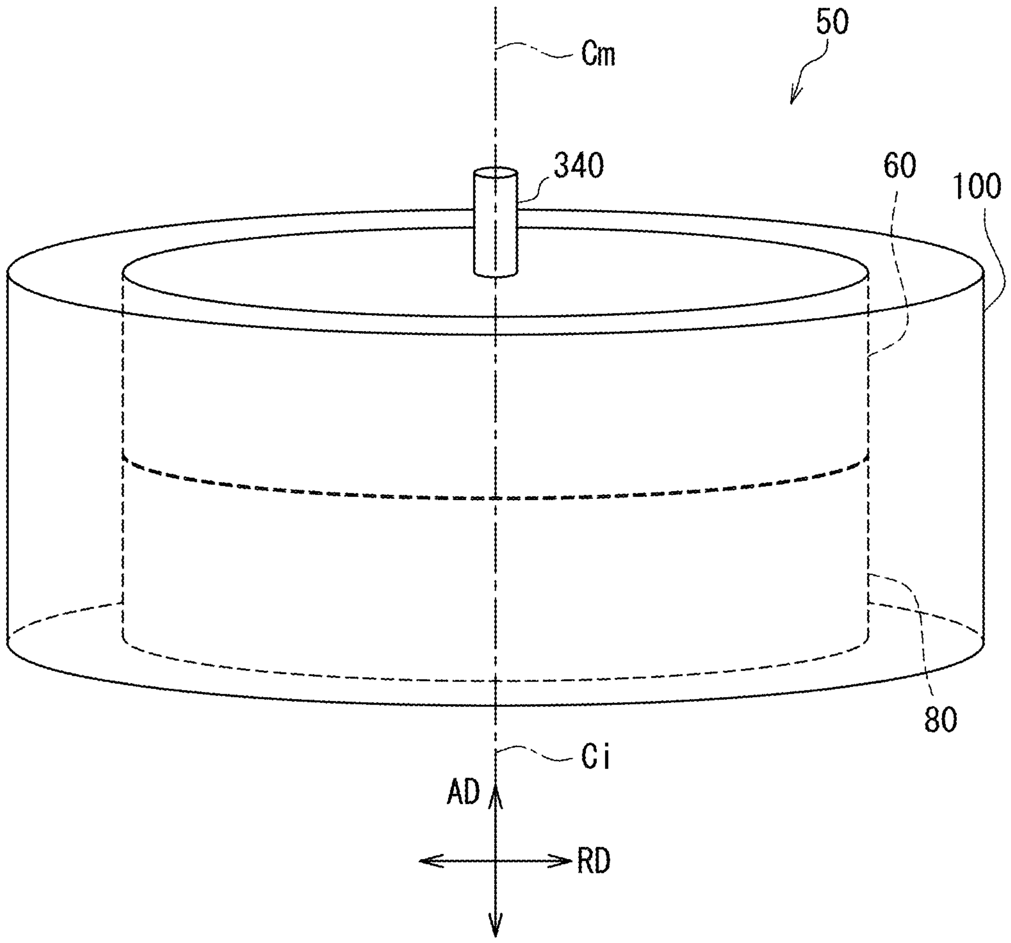
FIG. 2 is a perspective view of an EPU.
Figure 3:
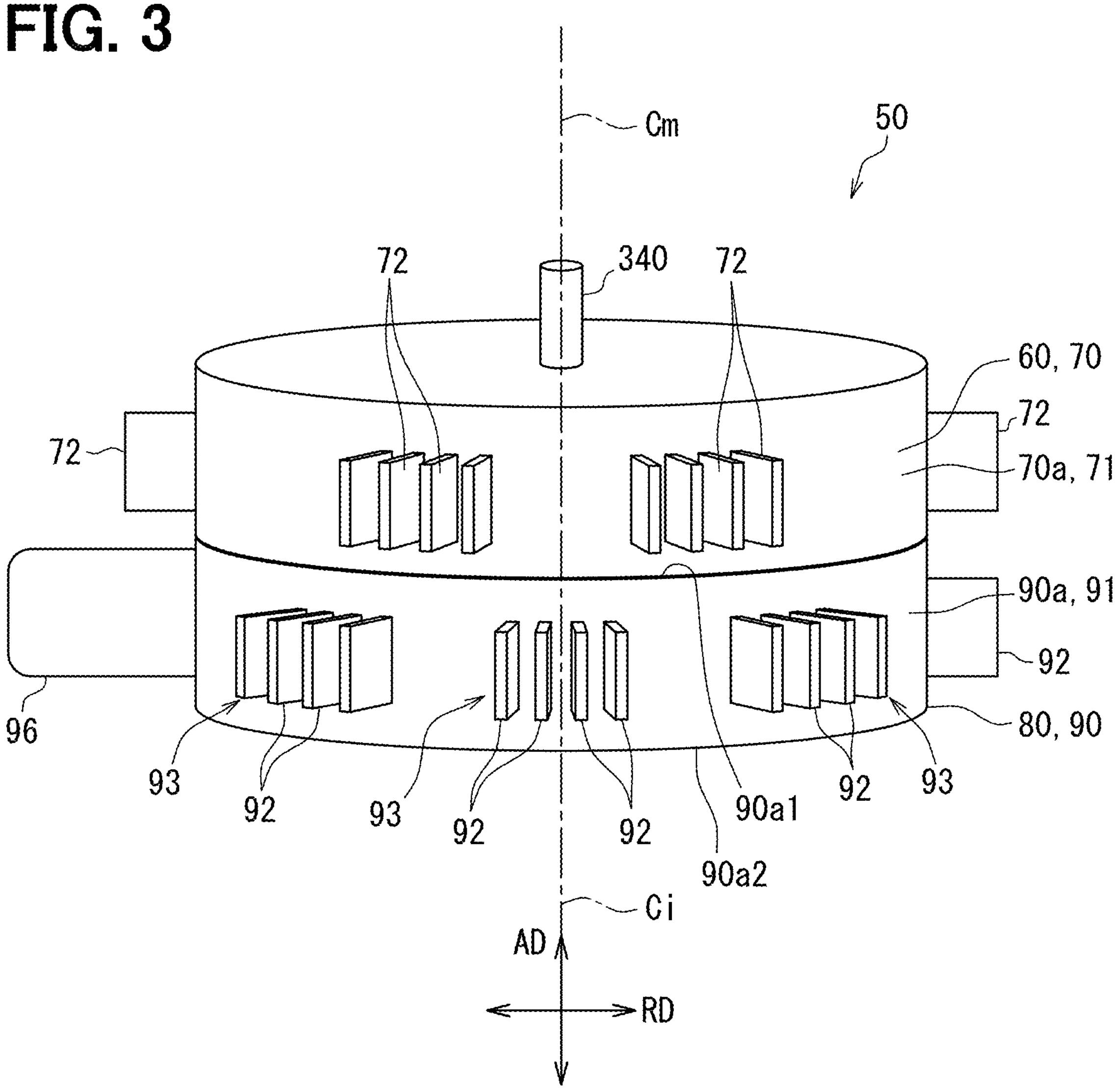
FIG. 3 is a perspective view of a motor device and an inverter device.
Figure 4:
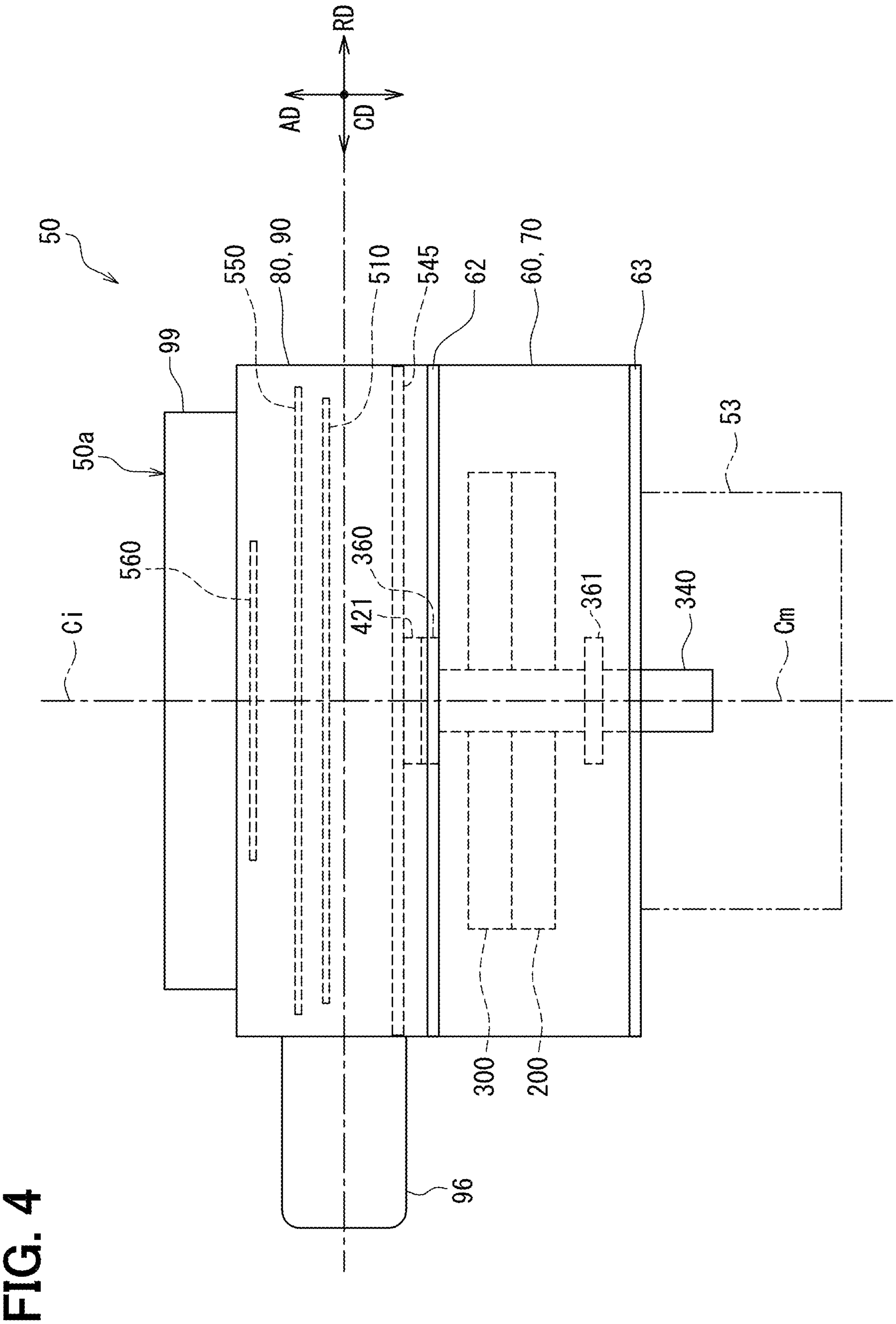
FIG. 4 is a schematic front view of the motor device and the inverter device.

As illustrated in FIGS. 2, 3, and 4, in the EPU 50, the inverter device 80 and the motor device 60 are arranged along a motor axis Cm of the motor device 60, overlap each other in an axial direction AD, and are fixed to each other by a fixing tool such as a bolt. Each of the motor device 60 and the inverter device 80 is formed in a columnar shape as a whole. Hereinafter, directions in the columnar shape will be described with the axial direction AD, a radial direction RD, and a circumferential direction CD that are orthogonal to one another.

The motor device 60 includes at least one stator 200 and at least one rotor 300 rotating about the motor axis Cm, which constitute the motor electric magnetic circuit 61. The motor device 60 is, for example, an axial gap motor and is arranged in the axial direction AD. For example, the stator 200 is provided between two rotors 300.

In FIG. 3, a motor housing 70 has, for example, a tubular shape and accommodates the motor device 60. The motor housing 70 is made of a metal material or the like, and has thermal conductivity.

The motor housing 70 includes a motor outer peripheral wall 71 and a motor fin 72. The motor outer peripheral wall 71 has a ring shape in the circumferential direction CD, and has an outer peripheral surface **70*a* for cooling the motor device 60. The motor fin 72 is a cooling fin provided on the outer peripheral surface 70*a* in order to enhance the heat dissipation effect, and protrudes toward a radially outer side to increase the surface area, and extends in the axial direction AD. Multiple motor fins 72** are arranged in the circumferential direction CD.

An inverter housing 90 has, for example, a tubular shape and accommodates the inverter device 80 including the inverter main circuit 81. An inverter axis Ci is a center line of the inverter housing 90, and coincides with the motor axis Cm. The inverter housing 90 is made of a metal material or the like and has thermal conductivity. The inverter housing 90 includes an inverter outer peripheral wall 91 and an inverter fin 92.

The inverter outer peripheral wall 91 has a ring shape in the circumferential direction CD, and mainly has an outer peripheral surface 90*a* and an inner peripheral surface 90*b* (see FIG. 5) for cooling the inverter main circuit 81. The inverter fin 92 is a heat dissipation fin provided on the outer peripheral surface 90*a* in order to enhance the heat dissipation effect, protrudes toward the radially outer side to increase the surface area, and extends in the axial direction AD. Multiple inverter fins 92 are arranged in the circumferential direction CD.

When the motor outer peripheral wall 71 and the inverter outer peripheral wall 91 have the same shape and size in a top view as viewed in the axial direction AD, the motor device 60 and the inverter device 80 are fixed in the axial direction AD, thereby easily making the cooling air to flow efficiently in the axial direction AD. However, if the motor device 60 and the inverter device 80 can be fixed in the axial direction AD, the motor outer peripheral wall 71 and the inverter outer peripheral wall 91 may be different in the shape and size in a top view.

As described above, in the case of an air-cooling type, the cooling of the motor device 60 and the inverter device 80 in the EPU 50 is achieved by an air current from a blower fan flowing along plate surfaces of the motor fin 72 and the inverter fin 92 in the axial direction AD.

As illustrated in FIG. 2, the EPU 50 has a unit duct 100 formed in a tubular shape as a whole to allow cooling air in the axial direction AD from the blower fan to flow without waste along the plate surfaces of the motor fin 72 and the inverter fin 92. The unit duct 100 covers the motor housing 70 and the inverter housing 90 from an outer peripheral side, and openings are formed at both ends in the axial direction AD.

Further, as a more favorable shape, there is a configuration in which an inner peripheral surface of the unit duct 100 approaches or contacts tip end surfaces of the motor fin 72 and the inverter fin 92. In the configuration, most of the cooling air passing in the axial direction AD passes between the motor fins 72 and the inverter fins 92, and the heat dissipation effect can be enhanced.

As illustrated in FIG. 4, the motor device 60 includes a shaft 340, a first bearing 360, a second bearing 361, and a rotation angle resolver 421. The shaft 340 is a rotation shaft that rotates together with the rotor 300.

The first bearing 360 and the second bearing 361 are arranged in the axial direction AD, and support and rotate the rotor 300 and the shaft 340. The first bearing 360 is provided on the inverter device 80 side of the second bearing 361 in the axial direction AD. The first bearing 360 is provided, for example, at a position inside the inverter device 80. At least a part of the first bearing 360 is accommodated in the inverter housing 90. The first bearing 360 is fixed to an end plate fixed to the motor housing 70 or an end plate sandwiched between the inverter housing 90 and the motor housing 70.

The rotation angle resolver 421 is a sensor that detects a rotation angle of the motor electric magnetic circuit 61. The rotation angle resolver 421 is electrically connected to the control circuit 161, and outputs a SIN/COS detection signal with respect to an excitation signal from the control circuit 161. The control circuit 161 measures a rotation angle and a rotation speed based on the SIN/COS detection signal. The control circuit 161 may detect the rotation from another sensor. The control circuit 161 may estimate the rotation angle based on, for example, a motor current, with a method that does not use a rotation angle sensor.

The rotation angle resolver 421 is provided, for example, at a position inside the inverter device 80. The rotation angle resolver 421 is provided, for example, on the inverter device 80 side of the first bearing 360 in the axial direction AD.

In the motor housing 70, the stator 200 and the rotor 300 are accommodated in an internal space of the motor outer peripheral wall 71. The motor outer peripheral wall 71 and the inverter outer peripheral wall 91 are arranged side by side in the axial direction AD. The inverter outer peripheral wall 91 corresponds to a device outer peripheral wall, and the motor outer peripheral wall 71 corresponds to an electric machine outer peripheral wall.

The motor device 60 includes a rear end plate 62 and a front end plate 63 in addition to the motor housing 70. The end plates 62 and 63 are made of a metal material or the like and have thermal conductivity. The end plates 62 and 63 extend in a plate shape in a direction orthogonal to the axial direction AD. The end plates 62 and 63 are arranged in the axial direction AD via the motor housing 70. The end plates 62 and 63 are fixed to the motor outer peripheral wall 71 while covering the inner space of the motor outer peripheral wall 71.

The rear end plate 62 is provided between the motor housing 70 and the inverter housing 90. The rear end plate 62 is sandwiched between the motor outer peripheral wall 71 and the inverter outer peripheral wall 91, for example. The rear end plate 62 covers the stator 200 and the rotor 300 from the inverter device 80 side. The rear end plate 62 is formed in an annular shape and is provided on the radially outer side of the first bearing 360. The rear end plate 62 corresponds to a cover portion.

The inverter device 80 includes a heat insulating portion 545. The heat insulating portion 545 has a heat insulating property, and is a heat insulating layer, an air layer, or the like. The heat insulating layer is made of a material having a heat insulating property. The heat insulating portion 545 extends in a plate shape in the direction orthogonal to the axial direction AD. The heat insulating portion 545 is provided between the rear end plate 62 and a high voltage board 510 in the axial direction AD. The heat insulating portion 545 extends along the rear end plate 62. The heat insulating portion 545 is provided, for example, on a side opposite to the rear end plate 62 with the rotation angle resolver 421 interposed therebetween.

A speed reducer 53 is attached to the EPU 50. The speed reducer 53 mechanically connects the motor electric magnetic circuit 61 and an external device. For example, the external device is mechanically connected to a rotation shaft of the motor electric magnetic circuit 61 via the speed reducer 53. The speed reducer 53 decelerates the rotation of the motor electric magnetic circuit 61 and transmits the rotation to the external device. Examples of the external device include a wheel and a rotary wing. The speed reducer 53 includes multiple gears and may be referred to as a reduction gear. The speed reducer 53 has a structure matching motor characteristics of the motor electric magnetic circuit 61. The speed reducer 53 is provided, for example, on a side opposite to the inverter device 80 with the motor device 60 interposed therebetween in the axial direction AD.

<Configuration Group A>

As illustrated in FIG. 4, the inverter device 80 includes an inverter lid portion 99 in addition to the inverter housing 90. The inverter lid portion 99 is made of a metal material or the like, has thermal conductivity, and can dissipate heat in an interior of the inverter device 80 to the outside. The inverter lid portion 99 closes the opening of the inverter housing 90 to prevent a foreign matter from entering the inverter. The inverter lid portion 99 is provided on a side opposite to the motor device 60 with the inverter housing 90 interposed therebetween in the axial direction AD. The inverter lid portion 99 bulges toward the side opposite to the motor device 60 in the axial direction AD. The inverter lid portion 99 includes a flat plate portion extending in a direction orthogonal to the motor axis Cm, and a ring-shaped wall portion extending in a ring shape along an outer peripheral edge of the flat plate portion. The inverter lid portion 99 has a function of sealing a gap between the inverter lid portion 99 and the inverter housing 90, a function of coupling with the inverter housing 90, and a function of reducing electromagnetic radiation and intrusion.

The inverter device 80 includes the high voltage board 510, a drive board 550, and a control board 560. The high voltage board 510 is a circuit board on which the inverter main circuit 81, the smoothing capacitor 145, and the EMI filter 150 are mounted. The drive board 550 is a circuit board on which the drive circuit 160 is mounted. The control board 560 is a circuit board on which the control circuit 161 is mounted.

The drive board 550 and the control board 560 are low-voltage boards to which a low voltage is applied. The low voltage is a voltage for driving the drive circuit 160 and the control circuit 161. In the inverter device 80, the voltage applied to the drive circuit 160 and the control circuit 161 is a low voltage. The boards 510, 550, and 560 may be referred to as an electric wiring board and a circuit board.

Figure 6:
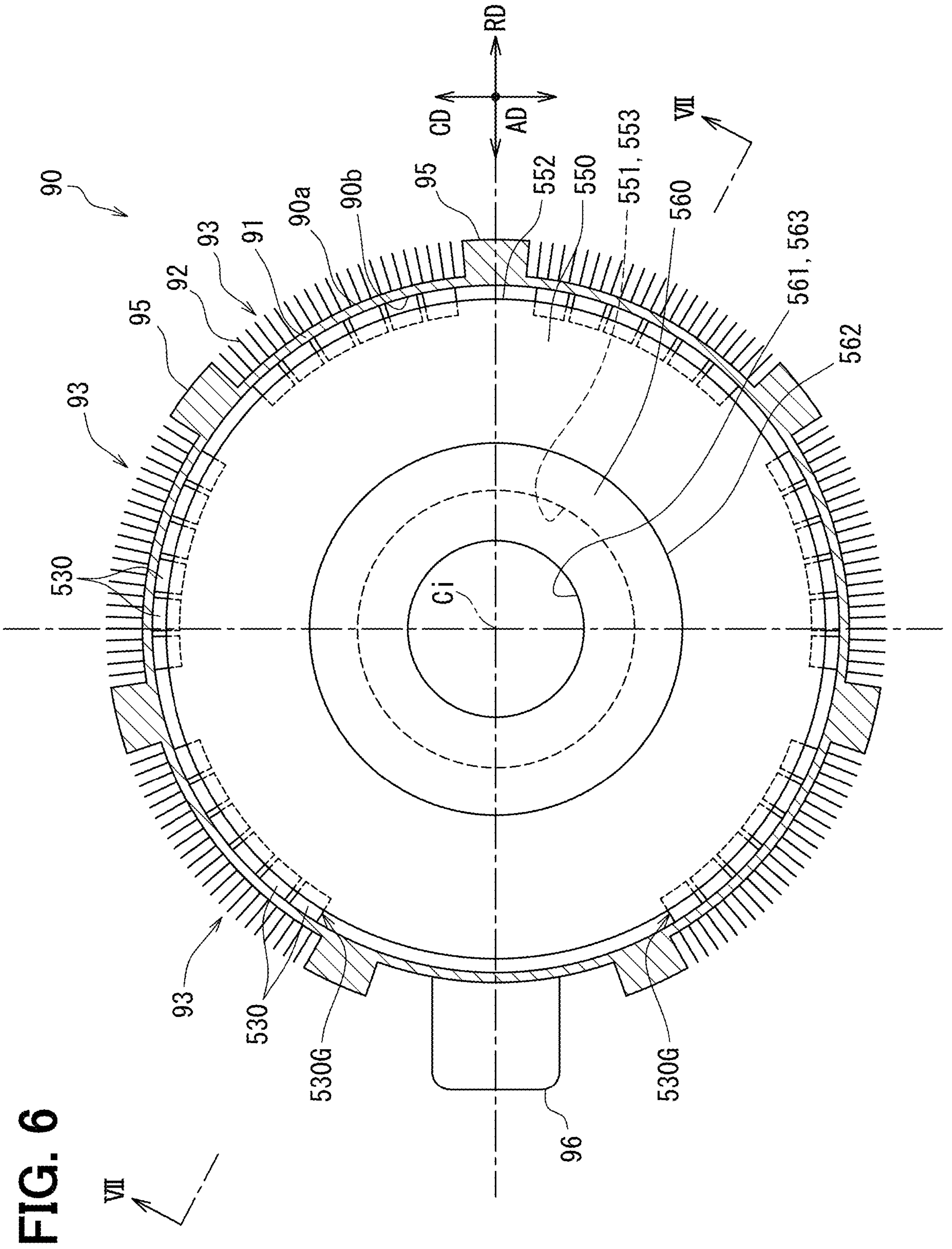
FIG. 6 is a top view of the inner portion of the inverter device as viewed from a low voltage side.

As illustrated in FIGS. 5 and 6, the high voltage board 510, the drive board 550, and the control board 560 have inner peripheral ends 511, 551, and 561 and outer peripheral ends 512, 552, and 562. The control board 560 may not have the inner peripheral end 561. The drive board 550 and the control board 560 may be integrated. In the high voltage board 510 and the drive board 550, the outer peripheral ends 512 and 552 are located on a radially inner side at positions spaced part from the inner peripheral surface 90*b* of the inverter outer peripheral wall 91, and a gap is formed.

As illustrated in FIG. 5, in the inverter device 80, multiple inverter fins 92 are arranged side by side in the circumferential direction CD, thereby forming an inverter fin group 93. The inverter fin group 93 is provided on the inverter housing 90.

Flanges 94 and 95 are projection portions provided on the outer peripheral surface 90*a* and protrude toward the radially outer side from the inverter outer peripheral wall 91. The flanges 94 and 95 are provided between two inverter fin groups 93 adjacent to each other in the circumferential direction CD. The high-voltage side flange 94 and the low-voltage side flange 95 are arranged side by side in the axial direction AD. For example, the motor housing 70 is fixed to the high-voltage side flange 94 by a fixing tool such as a bolt. For example, the inverter lid portion 99 is fixed to the low-voltage side flange 95 by a fixing tool.

The inverter housing 90, the motor housing 70, and an inside are cylindrical, and an O-ring 98 is sandwiched by the housings between the housings and an internal cylinder (not shown). The O-ring 98 seals a coupling portion between the inverter housing 90 and the motor housing 70.

The inverter device 80 includes a smoothing capacitor portion 580 and a filter component 524. The smoothing capacitor portion 580 and the filter component 524 are provided on the high voltage board 510 and are mechanically and electrically connected to each other. The smoothing capacitor portion 580 is implemented by mounting, in a dispersed manner, multiple smoothing capacitors 145 in FIG. 1.

Multiple filter components 524 include a common mode coil portion 525, a normal mode coil portion 526, a Y capacitor portion 527, and an X capacitor portion 528. The common mode coil portion 525 includes the common mode coil 151. The normal mode coil portion 526 includes the normal mode coil 152. The Y capacitor portion 527 includes the Y capacitor 153. The X capacitor portion 528 includes the X capacitor 154.

Multiple motor current sensors 146 are provided correspondingly to the U phase, the V phase, and the W phase. The battery current sensor 147 is provided on one or both of the P line 141 and the N line 142. The current sensors 146 and 147 are provided on the high voltage board 510.

The inverter device 80 includes an arm switch unit 530. The arm switch unit 530 has the functions of the arm switch 86 and the diode 87 of the inverter main circuit 81. Multiple arm switch units 530 are arranged side by side in the circumferential direction CD along the inner peripheral surface 90*b* of the inverter housing 90. The multiple arm switch units 530 are arranged along the outer peripheral ends 512 and 552 of the high voltage board 510 and the control board 560.

The inverter device 80 includes a fan device 540. The fan device 540 cools an internal high-temperature portion by circulating air inside the inverter device 80. The fan device 540 is an electric fan or a fan rotated by the motor shaft.

Figure 7:
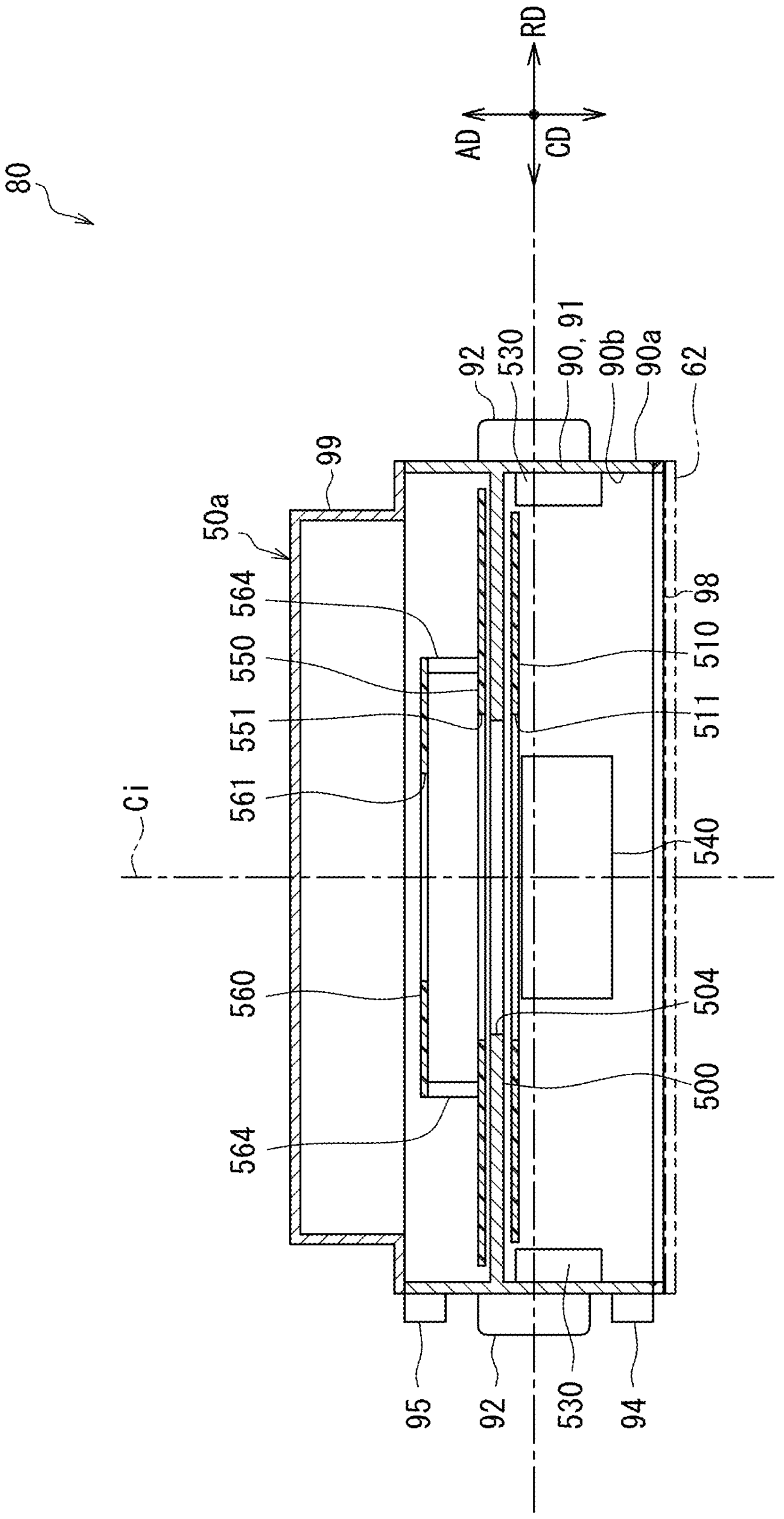
FIG. 7 is a cross-sectional view taken along a line VII-VII in FIG. 6.

As illustrated in FIG. 7, the fan device 540 is provided at a position aligned with board openings 513, 553, and 563 in the axial direction AD. In order to promote air circulation between the boards, the board openings 513, 553, and 563 may be shaped to block a part of the air from the fan device 540. The air that has passed through the board openings 513, 553, and 563 passes between the boards 510, 550, and 560 and the inverter lid portion 99 and between an exterior and a case inner surface, and returns to the fan from between the components mounted on the high voltage board 510. The circulation path may be reversed.

Figure 8:
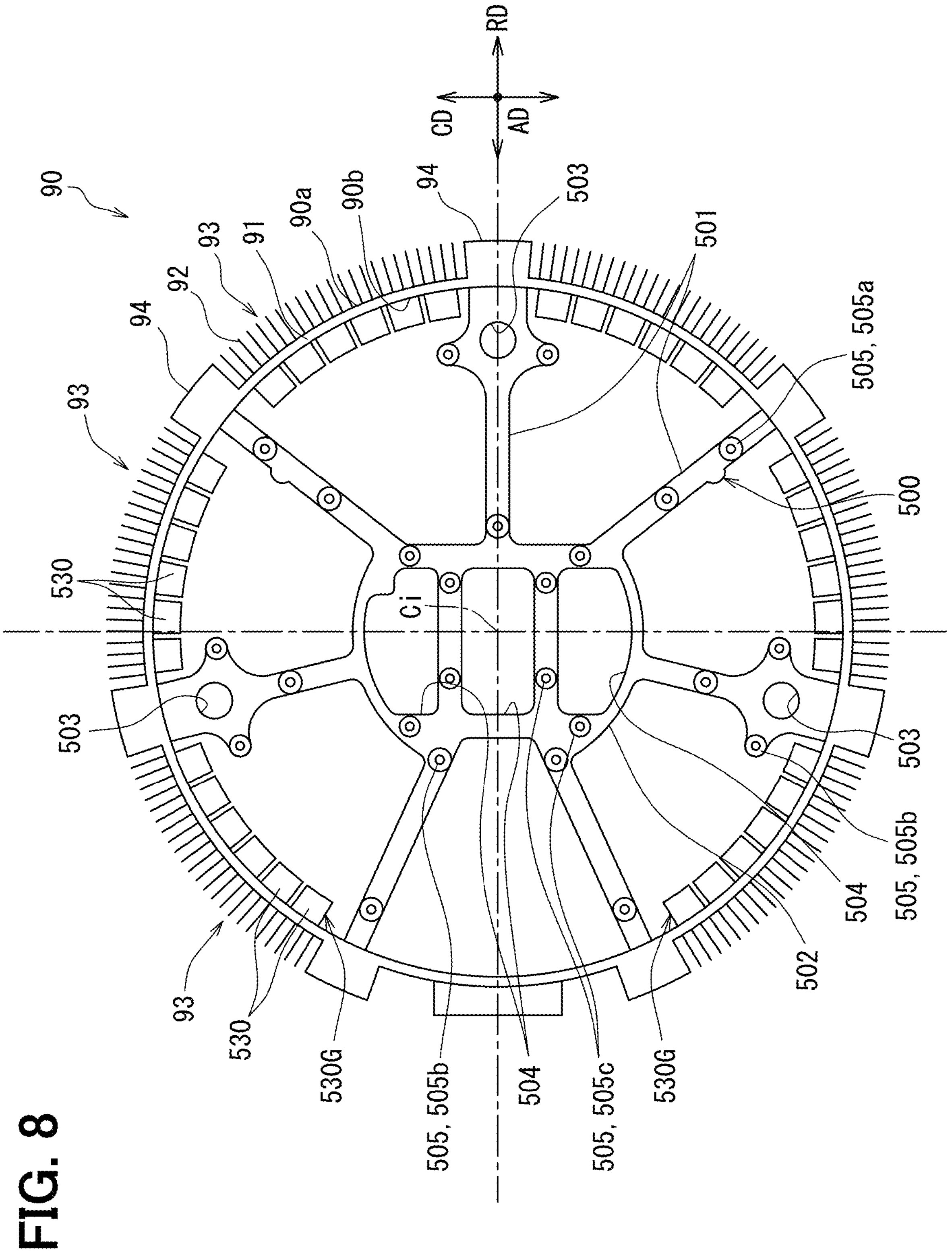
FIG. 8 is a top view of an inverter housing and an arm switch unit as viewed from the high voltage side.
Figure 9:
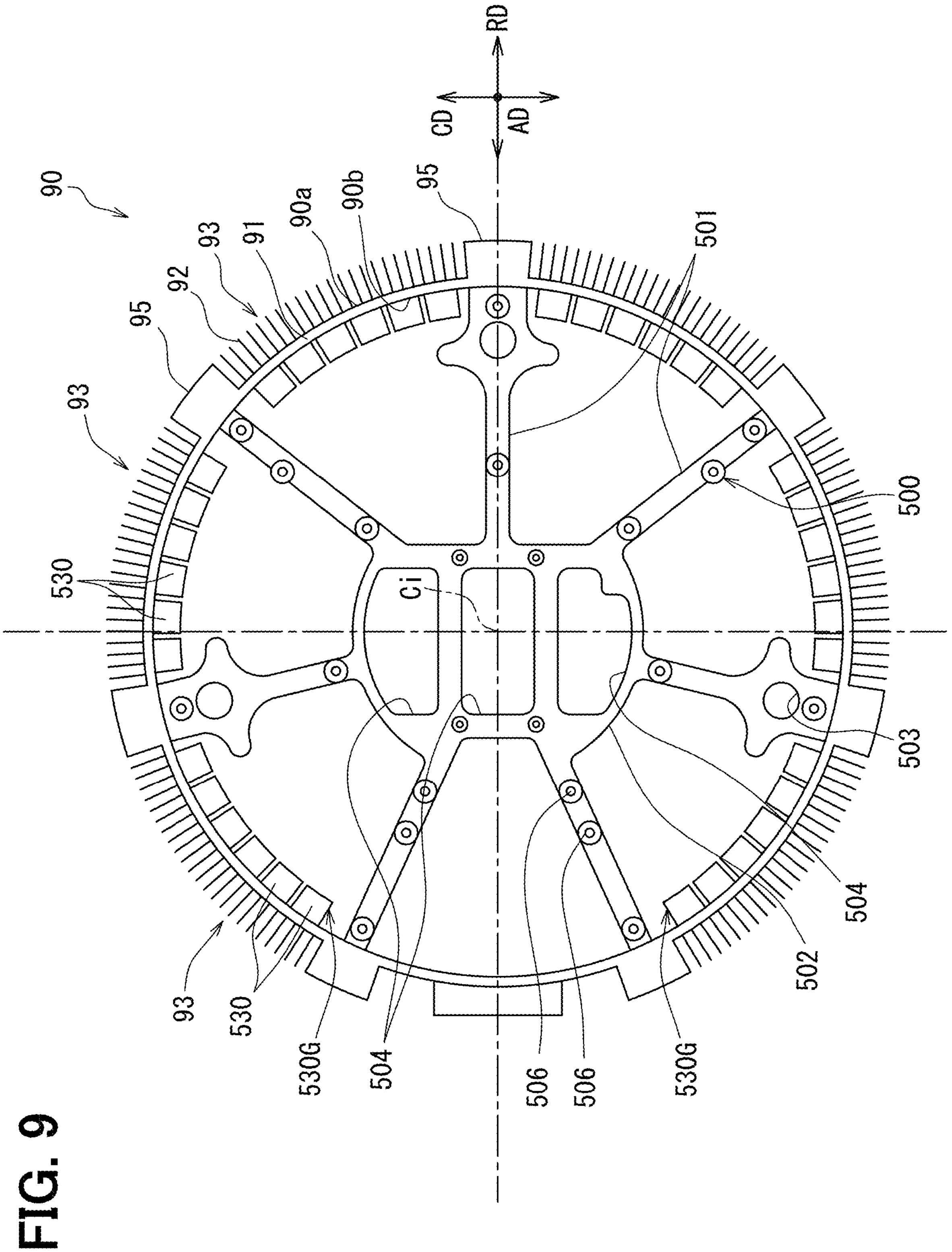
FIG. 9 is a top view of the inverter housing and the arm switch unit as viewed from the low voltage side.

As illustrated in FIGS. 7 to 9, the inverter housing 90 includes a component support portion 500 on an inner diameter side of the inverter outer peripheral wall 91. The component support portion 500 includes multiple beam portions 501 in the circumferential direction CD along the inner peripheral surface 90*b*. The beam portion 501 is provided between the high-voltage side flange 94 and the low-voltage side flange 95 in the axial direction AD, at a portion of the inverter outer peripheral wall 91 that does not interfere with the arm switch unit 530. The inverter fin group 93 is located between two beam portions 501 adjacent to each other in the circumferential direction CD. The multiple beam portions 501 are disposed so as to extend in the radial direction RD from the inner peripheral surface 90*b* toward the center or extend toward the radially outer side around the inverter axis Ci. The inverter housing 90 includes a beam coupling portion 502 so as to couple the multiple beam portions 501 at a center side. The beam coupling portion 502 is provided with multiple coupling openings 504. The beam portion 501 extends in a frame shape in the radial direction RD, and may be referred to as a support frame. The inverter outer peripheral wall 91 corresponds to an outer peripheral wall, and the inverter housing 90 corresponds to a case.

At the component support portion 500, the boards 510, 550, and 560 are arranged in the axial direction AD. The component support portion 500 is provided between the high voltage board 510 and the drive board 550 in the axial direction AD. Since the component support portion 500, the high voltage board 510, and the drive board 550 form a sandwich structure via the multiple beam portions 501, a lightweight and strong structure is implemented.

The inverter housing 90 is made of a material having thermal conductivity and electrical conductivity. Thus, the inverter housing 90 has a heat dissipation path and an electrical conduction path.

The heat dissipation path includes, for example, the inverter outer peripheral wall 91, the inverter fin 92, and the component support portion 500. In the heat dissipation path, for example, heat of the component support portion 500 is dissipated to the outside from the inverter fin 92 via the inverter outer peripheral wall 91.

The conduction path is a grounding path, and is the ground or earth. The inverter housing 90 is formed including the inverter outer peripheral wall 91, the high-voltage side flange 94, the low-voltage side flange 95, and the component support portion 500, and connects the ground of the Y capacitor portion 527, the boards 510, 550 and 560, and the like at a low impedance. The motor housing 70 and the inverter lid portion 99 form a grounding path via the flanges 94 and 95.

At the component support portion 500, the fan device 540 can be mounted to the beam coupling portion 502 to promote internal cooling of the inverter. The beam portion 501 may be provided with a beam opening 503. The beam opening 503 is an opening provided for bolt-fixing a component, which is mounted on the high voltage board 510, from the beam portion 501 side. For example, the beam opening 503 is an opening for bolt-fixing a busbar and a stud for passing a current to the multiple motor current sensors 146 from the high voltage board 510.

As illustrated in FIG. 8, the beam portion 501 and the beam coupling portion 502 of the component support portion 500 have a screw hole 505 for fixing the high voltage board 510. Further, as illustrated in FIG. 9, the beam portion 501 and the beam coupling portion 502 have multiple screw holes 506 for fixing the drive board 550 and the control board 560. Multiple screw holes 505 include a screw hole 505*a* for fixing only the board, a screw hole 505*b* for fixing, for example, the current sensor and the board together, and a screw hole 505*c* for fixing, for example, only the fan device 540.

The high voltage board 510 and the drive board 550 correspond to a plate member. The high voltage board 510 corresponds to a first plate member, and the drive board 550 corresponds to a second plate member.

As illustrated in FIGS. 5 and 6, the inverter device 80 includes a switch group 530G including multiple arm switch units 530. In the switch group 530G, multiple arm switch units 530 are arranged in a row in the circumferential direction CD in a concentrated manner. Multiple switch groups 530G are arranged in the circumferential direction CD along the inner peripheral surface 90*b*. The inner peripheral surface 90*b* may have a polygonal shape, and multiple switch groups 530G may be disposed on the same surface. The multiple switch groups 530G are arranged along the outer peripheral ends 512 and 552 with respect to the high voltage board 510 and the drive board 550.

In the switch group 530G, the multiple arm switch units 530 connected in parallel correspond to multiple upper arms 84 and multiple lower arms 85 provided in the inverter main circuit 81 in the circuit diagram. For example, if one upper arm 84 has six arm switches 86 in the circuit diagram, the switch group 530G in the embodiment corresponding to the upper arm 84 has six arm switch units 530. Similarly, one lower arm 85 in the circuit diagram forms the switch group 530G having six arm switch units 530.

For example, two switch groups 530G adjacent to each other in the circumferential direction CD are arranged so that the upper arm 84 and the lower arm 85 constituting one phase are paired. The high voltage board 510 close to an intermediate position of the switch groups 530G is provided with a point at which the motor current is extracted. Of the arms 84 and 85 provided in one upper and lower arm circuit 83, the switch group 530G corresponding to the upper arm 84 and the switch group 530G corresponding to the lower arm 85 are two switch groups 530G adjacent to each other in the circumferential direction CD.

As illustrated in FIGS. 8 and 9, the switch group 530G is provided between two adjacent beam portions 501 along the circumferential direction CD of the inner peripheral surface 90*b* of the inverter outer peripheral wall 91. The switch group 530G is located between two flanges 94 or 95 adjacent to each other in the circumferential direction CD. The switch group 530G is located at a position overlapping the inverter fin group 93 in the axial direction AD. The switch group 530G and the inverter fin group 93 are arranged side by side in the axial direction AD with the inverter outer peripheral wall 91 interposed therebetween.

Figure 10:
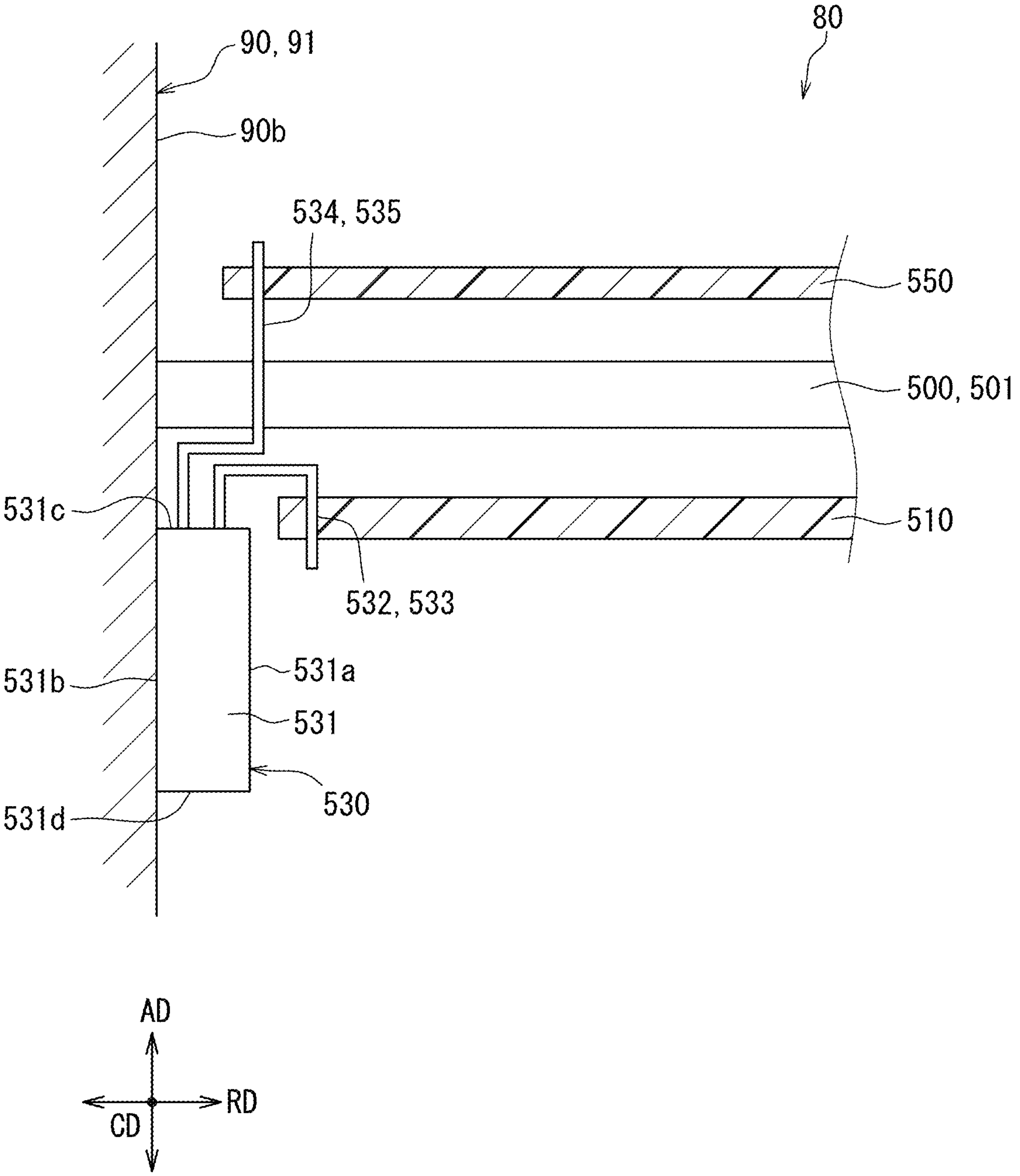
FIG. 10 is a schematic longitudinal sectional view of a periphery of the arm switch unit in the inverter device.

As illustrated in FIG. 10, the arm switch unit 530 includes a switch main body 531. The switch main body 531 is provided on the inner peripheral surface 90*b* that is a cooling surface, and is fixed to, for example, the inner peripheral surface 90*b*. The switch main body 531 includes an element such as a MOSFET and a protective portion. The switch main body 531 includes a first plate surface 531*a* and a second plate surface 531*b*. The first plate surface 531*a* and the second plate surface 531*b* extend in a direction orthogonal to the radial direction RD.

The arm switch unit 530 has four terminals, that is, terminals 532 to 535, and is a four-terminal type switch module. The terminals 532 to 535 are a drain terminal 532, a source terminal 533, a gate terminal 534, and a driver source terminal 535. The driver source terminal 535 may be referred to as a Kelvin source terminal. The terminals 532 to 535 correspond to switch terminals.

The drain terminal 532 and the source terminal 533 are power terminals and are connected to the high voltage board 510. The gate terminal 534 and the driver source terminal 535 are control terminals and are connected to the control board 560. The terminals 532 to 535 extend from the switch main body 531. The terminals 532 to 535 are arranged in a width direction of the switch main body 531.

The switch main body 531 is located at a position apart from outer peripheral end surfaces of the boards 510, 550, and 560. The switch main body 531 is located at a position apart from the beam portion 501 in the axial direction AD. The drain terminal 532 and the source terminal 533 extend from the switch main body 531 to the high voltage board 510 at a high voltage side with respect to the beam portion 501. The gate terminal 534 and the driver source terminal 535 extend from the switch main body 531 to the drive board 550 so as to extend in the axial direction AD through the beam portion 501.

As illustrated in FIG. 5, the inverter device 80 includes an inverter connector 96 and power supply lines 570 and 571. The inverter connector 96 connects the inverter device 80 with the external battery 31 or the like. The inverter connector 96 is connectable to a power cable. The inverter connector 96 protrudes toward the radially outer side from the inverter housing 90. The power supply lines 570 and 571 may extend to the outside without the inverter connector 96.

The power supply lines 570 and 571 are electrically connected to the high voltage board 510. The power supply lines 570 and 571 are connected to the arm switch unit 530 and the smoothing capacitor portion 580 through the filter component 524 from the high voltage board 510. The power supply line 570 is an electrical wiring that forms the P line 141. The power supply line 571 is an electrical wiring that forms the N line 142. The battery current sensor 147 is provided for either or both of the power supply line 570 and the power supply line 571. The motor current sensor 146 is provided on the busbar pulled out from the high voltage board 510. The busbar is connected to the motor.

<Configuration Group B>

In FIGS. 4 to 6, the boards 510, 550, and 560 have an insulating board and a wiring pattern. The insulating board has an electrical insulation property and is formed in a plate shape by a resin material or the like. The wiring pattern has conductivity and is made of a conductive material such as copper or aluminum.

Each of the high voltage board 510, the drive board 550, and the control board 560 is formed in a plate shape and extends in the direction orthogonal to the axial direction AD. The boards 510, 550, and 560 extend in a ring shape around the inverter axis Ci. The boards 510, 550, and 560 are each formed in a disk shape as a whole. The boards 510, 550, and 560 are arranged in the axial direction AD with their respective plate surfaces facing one another. In the axial direction AD, the drive board 550 is provided between the high voltage board 510 and the control board 560. In the inverter device 80, in the axial direction AD, the high voltage board 510 side is referred to as a high voltage side and the drive board 550 side is referred to as a low voltage side. The motor device 60 is provided, for example, on the high voltage side of the inverter device 80.

As illustrated in FIG. 11, the high voltage board 510 includes a P busbar 601, an N busbar 602, an output busbar 603, and an earth busbar 604. The busbars 601 to 604 are provided in the wiring pattern of the high voltage board 510. The busbars 601 to 604 are formed in a plate shape and extend in the direction orthogonal to the axial direction AD. The busbars 601 to 604 are conductors having conductivity and correspond to plate-shaped conductors. The busbars 601 to 604 each extend in the circumferential direction CD as a whole. The circumferential direction CD corresponds to an extending direction. The busbars 601 to 604 are provided inside the high voltage board 510. In the high voltage board 510, for example, the busbars 601 to 604 and multiple insulating boards are alternately stacked. The busbars 601 to 604 may be referred to as board conductors. The high voltage board 510 corresponds to a power board.

Figure 12:
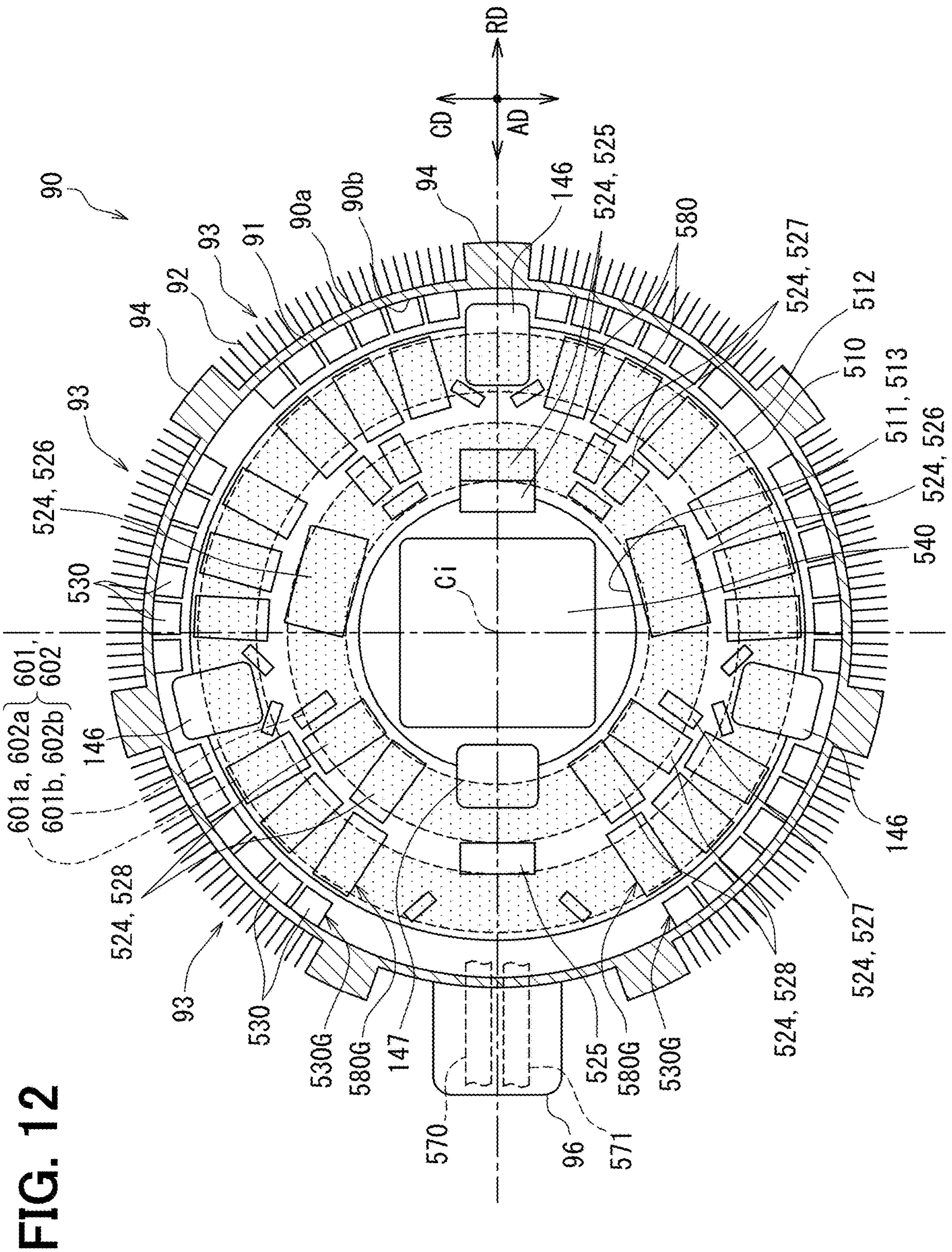
FIG. 12 is a top view illustrating a configuration of a P busbar and an N busbar in the inverter device.

In FIG. 12, the P busbar 601 forms at least a part of the P line 141. The P busbar 601 corresponds to a high potential conductor and a power conductor, and may be referred to as a high potential busbar and a power busbar. The P busbar 601 includes an outer peripheral P busbar 601*a* and an inner peripheral P busbar 601*b*. The P busbars 601*a* and 601*b* are conductive members such as busbar members made of a conductive material. The P busbars 601*a* and 601*b* extend in a ring shape around the inverter axis Ci, similarly to the high voltage board 510. The P busbars 601*a* and 601*b* are each formed in a disk shape as a whole. The outer peripheral P busbar 601*a* and the inner peripheral P busbar 601*b* are arranged side by side in the radial direction RD. The outer peripheral P busbar 601*a* is provided on the radially outer side of the inner peripheral P busbar 601*b*.

The outer peripheral P busbar 601*a* extends along the outer peripheral end 512 in the high voltage board 510. The outer peripheral P busbar 601*a* is provided at a position aligned with the smoothing capacitor portion 580 in the axial direction AD. The outer peripheral P busbar 601*a* extends in the circumferential direction CD along a capacitor row 580R. The smoothing capacitor portion 580 may be provided at a position protruding from the outer peripheral P busbar 601*a* to at least one of the radially outer side and the radially inner side, or may be provided at a position not protruding.

The inner peripheral P busbar 601*b* extends along the inner peripheral end 511 in the high voltage board 510. The inner peripheral P busbar 601*b* is provided at a position aligned with the filter component 524 in the axial direction AD. The inner peripheral P busbar 601*b* extends in the circumferential direction CD along a filter row 524R. The filter component 524 may be provided at a position protruding from the inner peripheral P busbar 601*b* to at least one of the radially outer side and the radially inner side, or may be provided at a position not protruding.

The outer peripheral P busbar 601*a* and the inner peripheral P busbar 601*b* are electrically connected to the power supply line 570 via an electrical wiring or the like. The P busbar 601 may have three or more busbar members such as the P busbars 601*a* and 601*b*, and may have only one busbar member.

The N busbar 602 forms at least a part of the N line 142. The N busbar 602 corresponds to a low potential conductor and a power conductor, and may be referred to as a low potential busbar and a power busbar. The N busbar 602 includes an outer peripheral N busbar 602*a* and an inner peripheral N busbar 602*b*. The N busbars 602*a* and 602*b* are conductive members such as busbar members made of a conductive material. Similarly to the high voltage board 510, the N busbars 602*a* and 602*b* extend in a ring shape around the inverter axis Ci. The N busbars 602*a* and 602*b* are each formed in a disk shape as a whole. The outer peripheral N busbar 602*a* and the inner peripheral N busbar 602*b* are arranged side by side in the radial direction RD. The outer peripheral N busbar 602*a* is provided on the radially outer side of the inner peripheral N busbar 602*b*.

The outer peripheral N busbar 602*a* extends along the outer peripheral end 512 in the high voltage board 510. The outer peripheral N busbar 602*a* is provided at a position aligned with the smoothing capacitor portion 580 in the axial direction AD. The outer peripheral N busbar 602*a* extends in the circumferential direction CD along the capacitor row 580R. The smoothing capacitor portion 580 may be provided at a position protruding from the outer peripheral N busbar 602*a* to at least one of the radially outer side and the radially inner side, or may be provided at a position not protruding.

The inner peripheral N busbar 602*b* extends along the inner peripheral end 511 in the high voltage board 510. The inner peripheral N busbar 602*b* is provided at a position aligned with the filter component 524 in the axial direction AD. The inner peripheral N busbar 602*b* extends in the circumferential direction CD along the filter row 524R. The filter component 524 may be provided at a position protruding from the inner peripheral N busbar 602*b* to at least one of the radially outer side and the radially inner side, or may be provided at a position not protruding.

The outer peripheral N busbar 602*a* and the inner peripheral N busbar 602*b* are electrically connected to the power supply line 571 via an electric wiring or the like. The N busbar 602 may have three or more busbar members such as the N busbars 602*a* and 602*b*, and may have only one busbar member.

Figure 13:
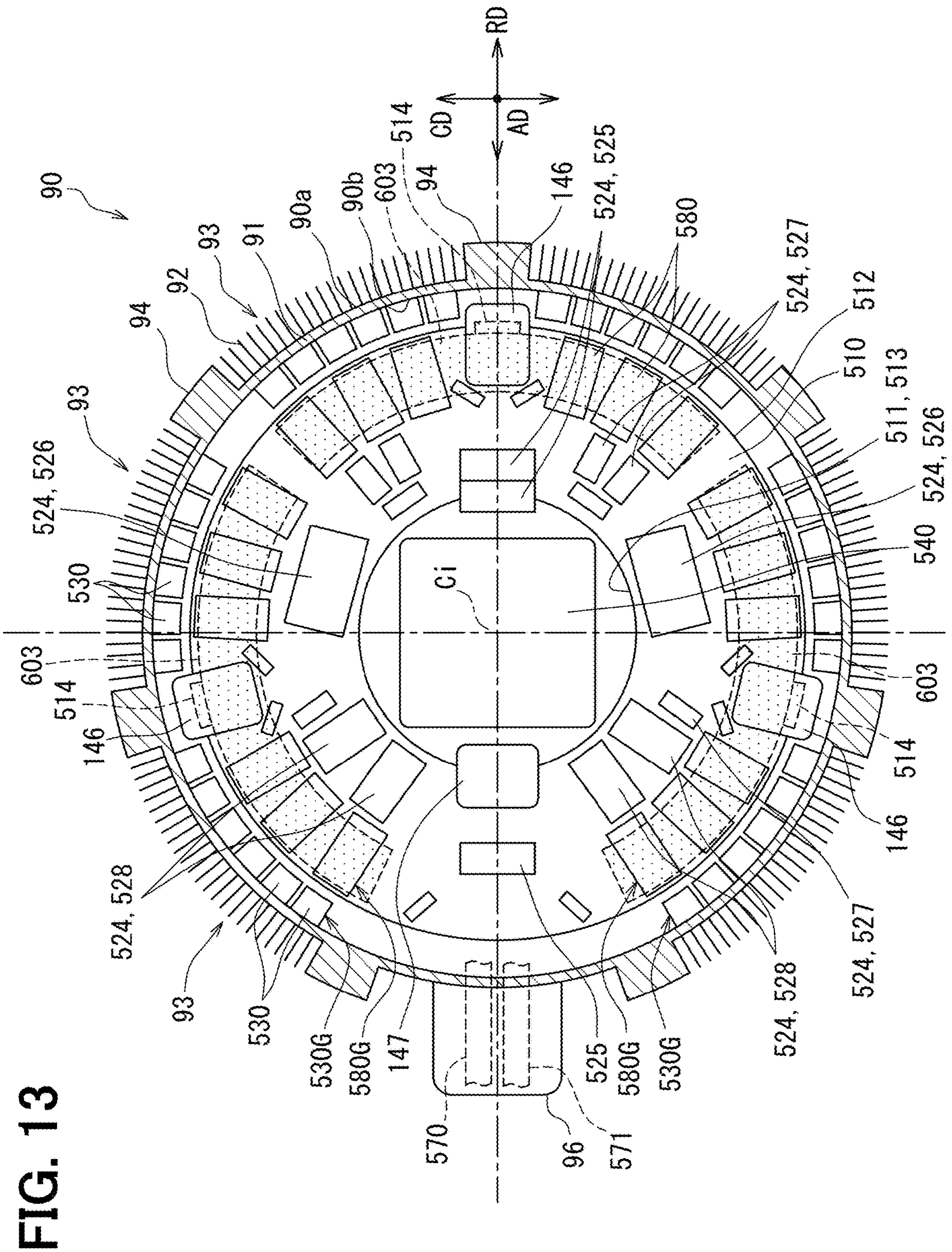
FIG. 13 is a top view illustrating a configuration of an output busbar in the inverter device.

In FIG. 13, the output busbar 603 forms at least a part of the output line 143. The output busbar 603 corresponds to an output conductor. The output busbar 603 is a conductive member such as a busbar member made of a conductive material. The output busbar 603 is formed in a plate shape so as to be curved in the circumferential direction CD. Multiple output busbars 603 are arranged in the circumferential direction CD along the outer peripheral end 512. Two output busbars 603 adjacent to each other in the circumferential direction CD are located at positions spaced apart from each other in the circumferential direction CD.

The output busbar 603 extends along the outer peripheral end 512 in the high voltage board 510. The output busbar 603 is provided at a position aligned with the smoothing capacitor portion 580 in the axial direction AD. The output busbar 603 extends in the circumferential direction CD along the capacitor row 580R. The smoothing capacitor portion 580 may be provided at a position protruding from the output busbar 603 to at least one of the radially outer side and the radially inner side, or may be provided at a position not protruding. The output busbar 603 is provided on the radially outer side of the filter component 524. The output busbar 603 may be provided at a position aligned with the filter component 524 in the axial direction AD. Further, the output busbar 603 may be located to extend from the outer peripheral P busbar 601*a* to the inner peripheral P busbar 601*b* in the radial direction RD.

The output busbar 603 is provided for each of multiple phases. Multiple output busbars 603 include output busbars 603 respectively corresponding to a U phase, a V phase, and a W phase. For example, the U-phase output busbar 603 is electrically connected to a U-phase coil of the motor electric magnetic circuit 61.

The high voltage board 510 includes an output connection portion 514. The output connection portion 514 is electrically connected to the output busbar 603. The output connection portion 514 is individually provided for each of the multiple output busbars 603. An output cable such as an electrical wiring is connected to the output connection portion 514. The output cable and the output connection portion 514 form the output line 143 together with the output busbar 603. The current sensor 147 is provided for at least one of the output cable and the output connection portion 514. The output connection portion 514 is provided, for example, between two switch groups 530G adjacent to each other in the circumferential direction CD.

Figure 14:
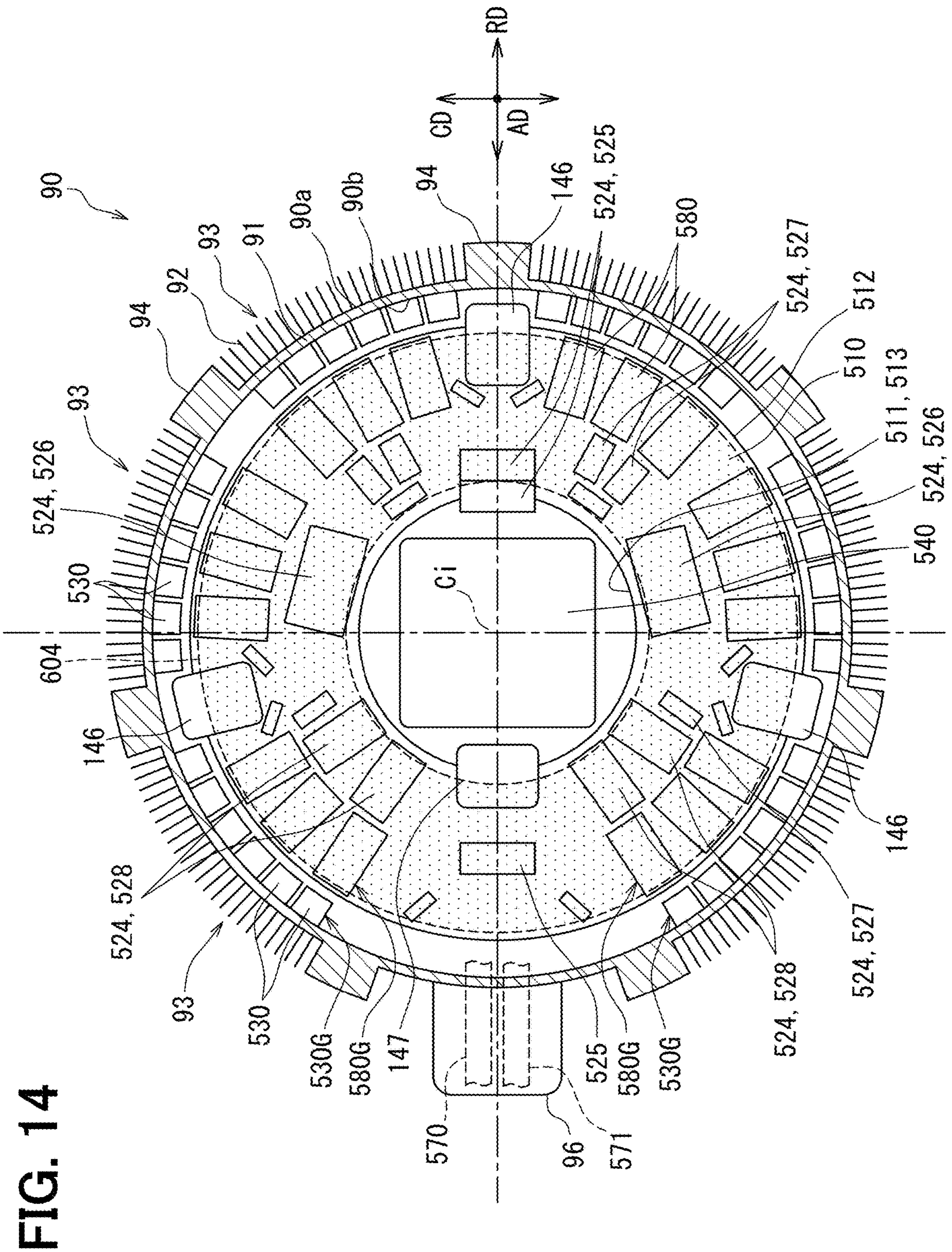
FIG. 14 is a top view illustrating a configuration of an earth busbar in the inverter device.

In FIG. 14, the earth busbar 604 forms at least a part of a grounding path. The earth busbar 604 corresponds to a ground conductor and may be referred to as an earth conductor. The earth busbar 604 is a busbar member made of a conductive material. The earth busbar 604 is connected to frame ground. The earth busbar 604 is connected to the inverter housing 90 so as to be electrically connected to the ground GND. For example, a fixing tool that fixes the high voltage board 510 to the component support portion 500 penetrates the earth busbar 604 and is screwed into the screw hole 505. The earth busbar 604 is electrically connected to the component support portion 500 via the fixing tool. Since multiple fixing tools are provided, the earth busbar 604 and the component support portion 500 are electrically connected to each other at multiple positions.

Similarly to the P busbar 601 and the N busbar 602, the earth busbar 604 extends in a ring shape around the inverter axis Ci. The earth busbar 604 is formed in a disk shape as a whole. The earth busbar 604 extends in the radial direction RD to stretch between the inner peripheral end 511 and the outer peripheral end 512. For example, the earth busbar 604 extends from the outer peripheral P busbar 601*a* to the inner peripheral P busbar 601*b* in the radial direction RD.

The earth busbar 604 is provided at a position aligned with both the smoothing capacitor portion 580 and the filter component 524 in the axial direction AD. The earth busbar 604 extends in the circumferential direction CD along both the capacitor row 580R and the filter row 524R. The smoothing capacitor portion 580 may be provided at a position protruding toward the radially outer side from the earth busbar 604, or may be provided at a position not protruding. The filter component 524 may be provided at a position protruding toward the radially inner side from the earth busbar 604, or may be provided at a position not protruding.

As illustrated in FIG. 11, the high voltage board 510 includes multiple plate-shaped conductors such as the busbars 601 to 604. In the high voltage board 510, the busbars 601 to 604 are included in the multiple plate-shaped conductors. The multiple plate-shaped conductors include each of the busbars 601 to 604 in plurality. For example, the multiple plate-shaped conductors include each of the busbars 601 to 604 by two. The multiple plate-shaped conductors are stacked in the axial direction AD. In the multiple plate-shaped conductors, the earth busbar 604 is provided at each of a pair of outermost positions. One of the pair of outermost positions is a position on a highest voltage side in the axial direction AD. The other outermost position is a position on a lowest voltage side in the axial direction AD.

In the axial direction AD, each of the busbars 601 to 603 is provided in plurality between the pair of earth busbars 604. For example, each of the busbars 601 to 603 is provided by two between the pair of earth busbars 604. The output busbar 603 is provided between the P busbar 601 and the N busbar 602 in the axial direction AD. The output busbar 603 is located at a position adjacent to each of the P busbar 601 and the N busbar 602 in the axial direction AD. Of the P busbar 601 and the N busbar 602 that are adjacent to the output busbar 603 in the axial direction AD, the P busbar 601 corresponds to a first plate portion and the N busbar 602 corresponds to a second plate portion.

The high voltage board 510 includes a first busbar set 611 and a second busbar set 612. The busbar sets 611 and 612 each have one set of the busbars 601 to 603. The busbar sets 611 and 612 are provided between the pair of earth busbars 604 in the axial direction AD. The first busbar set 611 and the second busbar set 612 are stacked in the axial direction AD. The first busbar set 611 is provided on the high voltage side of the second busbar set 612 in the axial direction AD. In both of the first busbar set 611 and the second busbar set 612, the output busbar 603 is provided between the P busbar 601 and the N busbar 602. The arrangement order of the busbars 601 to 603 is the same between the first busbar set 611 and the second busbar set 612. For example, the P busbar 601, the output busbar 603, and the N busbar 602 are arranged in this order from the high voltage side to the low voltage side.

The smoothing capacitor portion 580 includes a capacitor main body 581 and capacitor terminals 582 and 583. The capacitor main body 581 is provided on the high voltage board 510 and is fixed to the high voltage board 510. The capacitor main body 581 includes an element and a protective portion that form the smoothing capacitor 145. The capacitor main body 581 is formed in a rectangular parallelepiped shape as a whole. The capacitor main body 581 is provided on a first high-voltage surface 510*a* of the high voltage board 510.

The capacitor terminals 582 and 583 are a P capacitor terminal 582 and an N capacitor terminal 583. The P capacitor terminal 582 is a terminal connected to the P busbar 601. The N capacitor terminal 583 is a terminal connected to the N busbar 602. The capacitor terminals 582 and 583 extend in the same direction from the capacitor main body 581. The capacitor terminals 582 and 583 extend from one surface of the capacitor main body 581, which is superimposed on the first high-voltage surface 510*a*, toward the low voltage side in the axial direction AD. The P capacitor terminal 582 corresponds to a high capacitor terminal, and the N capacitor terminal 583 corresponds to a low capacitor terminal.

Figure 15:
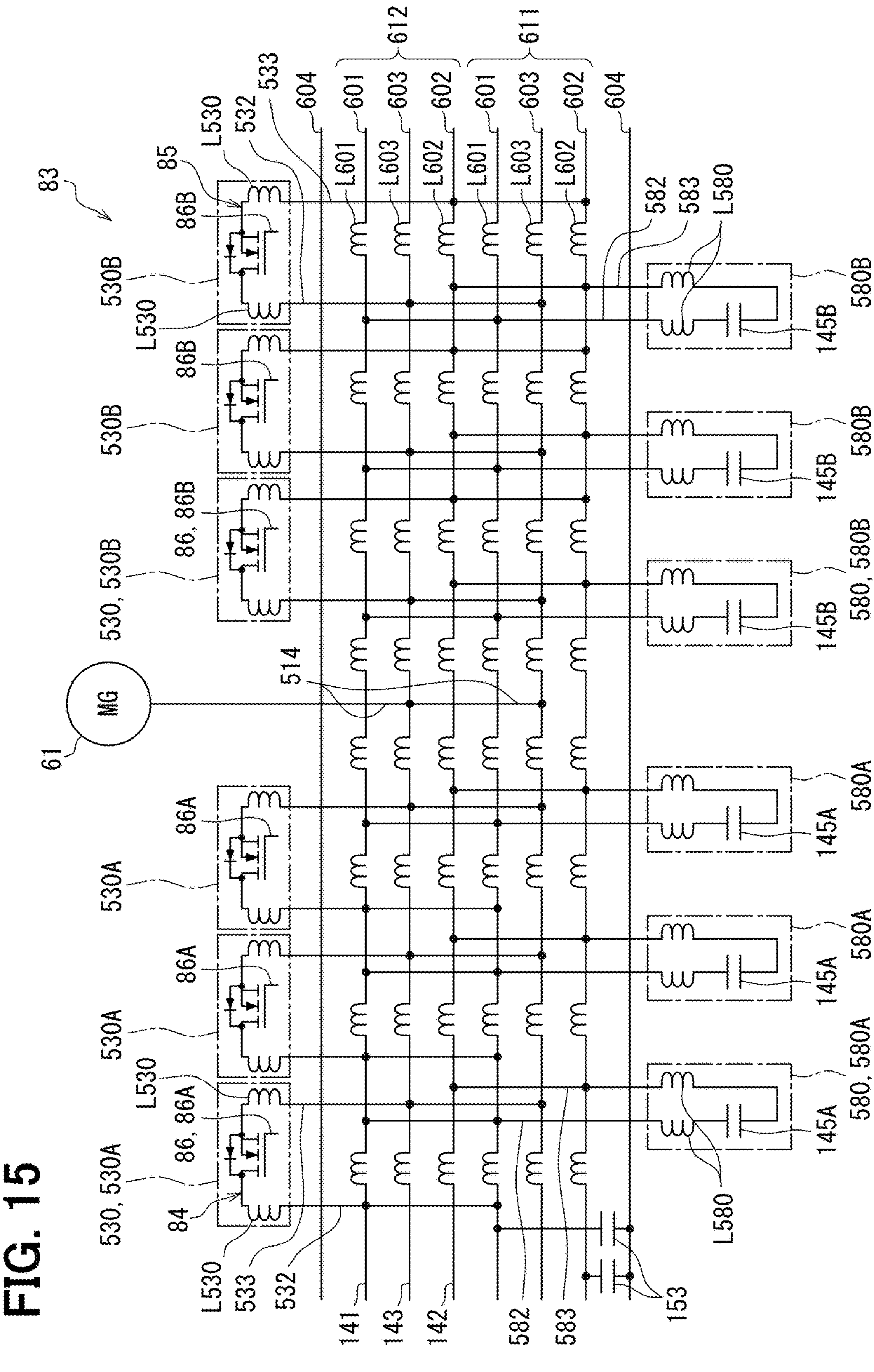
FIG. 15 is a circuit diagram for illustrating an inductance parasitic on a busbar.

As illustrated in FIG. 15, the upper and lower arm circuit 83 includes an upper arm switch 86A and a lower arm switch 86B. The upper arm switch 86A is the arm switch 86 provided in the upper arm 84. The lower arm switch 86B is the arm switch 86 provided in the lower arm 85.

Figure 16:
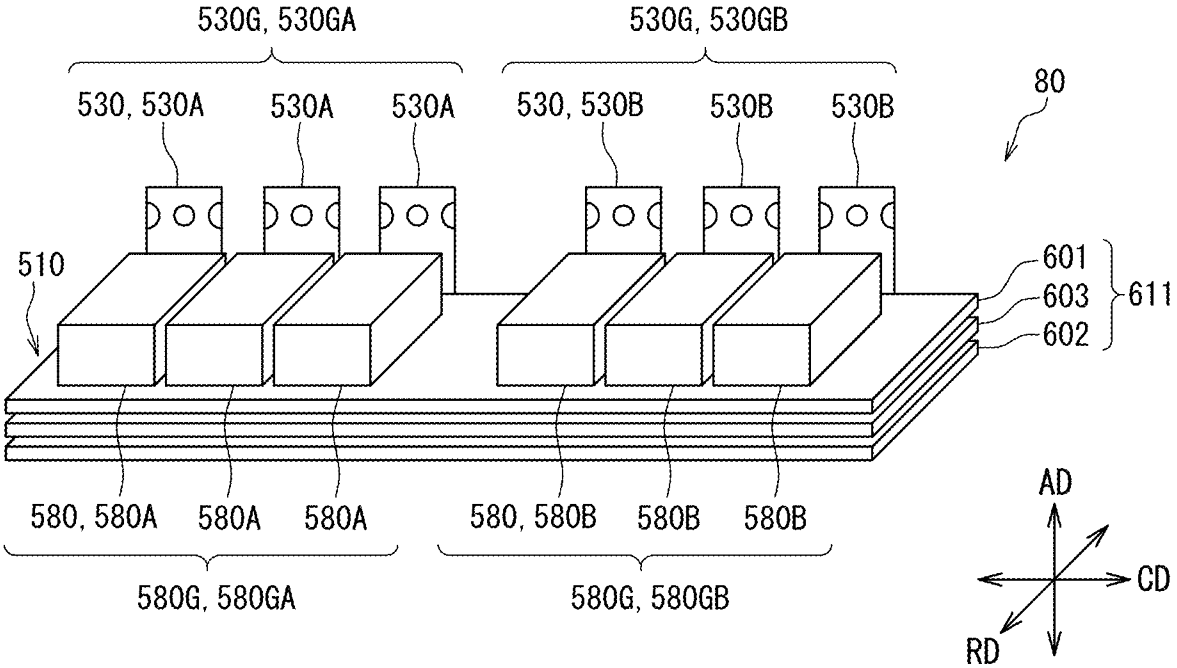
FIG. 16 is a schematic perspective view of the periphery of the arm switch unit in the high voltage board.

As illustrated in FIGS. 15 and 16, multiple arm switch units 530 include an upper arm switch unit 530A and a lower arm switch unit 530B. The upper arm switch unit 530A includes the upper arm switch 86A and corresponds to an upper switch component on the high potential side. The upper arm switch unit 530A is electrically connected to the P busbar 601 and the output busbar 603. The lower arm switch unit 530B includes the lower arm switch 86B and corresponds to a lower switch component on the low potential side. The lower arm switch unit 530B is electrically connected to the output busbar 603 and the N busbar 602.

The multiple switch groups 530G includes an upper switch group 530GA and a lower switch group 530GB. The upper switch group 530GA includes multiple upper arm switch units 530A and does not include the lower arm switch unit 530B. In the upper switch group 530GA, multiple upper arm switch units 530A are arranged side by side in the circumferential direction CD. The lower switch group 530GB includes multiple lower arm switch units 530B and does not include the upper arm switch unit 530A. In the lower switch group 530GB, multiple lower arm switches 530B are arranged side by side in the circumferential direction CD.

The upper arm switch units 530A and the lower arm switch units 530B that constitute one upper and lower arm circuit 83 are provided in the upper switch group 530GA and the lower switch group 530GB adjacent to each other in the circumferential direction CD. The upper switch group 530GA and the lower switch group 530GB are included in one phase. For example, the U-phase upper switch group 530GA and the U-phase lower switch group 530GB are located adjacent to each other in the circumferential direction CD.

The output connection portion 514 is provided for the upper switch group 530GA and the lower switch group 530GB that are included in one phase. The output connection portion 514 is provided between the upper switch group 530GA and the lower switch group 530GB, which are included in one phase, in the circumferential direction CD. The output connection portion 514 is connected to the output busbar 603 between multiple upper source terminals 533A and multiple lower drain terminals 532B in the circumferential direction CD.

The smoothing capacitor portion 580 is electrically connected in parallel to the upper arm switch unit 530A and the lower arm switch unit 530B. The smoothing capacitor portion 580 is electrically connected to the P busbar 601 and the N busbar 602. The smoothing capacitor portion 580 corresponds to a capacitor component and a parallel component.

As illustrated in FIGS. 12 to 14, the inverter device 80 includes a capacitor group 580G. The capacitor group 580G includes multiple smoothing capacitor portions 580. In the capacitor group 580G, the multiple smoothing capacitor portions 580 are arranged in a row in the circumferential direction CD along the outer peripheral end 512 in a concentrated manner. Multiple capacitor groups 580G are arranged in the circumferential direction CD along the outer peripheral end 512. The capacitor group 580G is arranged side by side with the switch group 530G in the radial direction RD. For example, one capacitor group 580G and one switch group 530G are arranged side by side in the radial direction RD.

As illustrated in FIG. 16, multiple smoothing capacitor portions 580 include an upper capacitor portion 580A and a lower capacitor portion 580B. The upper capacitor portion 580A is provided at a position aligned with the upper arm switch unit 530A in the radial direction RD. The upper capacitor portion 580A is located at a position spaced to the radially inner side from the upper arm switch unit 530A. The upper capacitor portion 580A is located at a position that is aligned with the upper switch group 530GA in the radial direction RD and that is spaced to the radially inner side from the upper switch group 530GA. The upper capacitor portion 580A corresponds to an upper capacitor component and a first capacitor component. The radial direction RD corresponds to an orthogonal direction orthogonal to an alignment direction.

The lower capacitor portion 580B is provided at a position aligned with the lower arm switch unit 530B in the radial direction RD. The lower capacitor portion 580B is located at a position spaced to the radially inner side from the lower arm switch unit 530B. The lower capacitor portion 580B is located at a position that is aligned with the lower switch group 530GB in the radial direction RD and that is spaced to the radially inner side from the lower switch group 530GB. The lower capacitor portion 580B corresponds to a lower capacitor component and a second capacitor component.

The upper capacitor portion 580A and the lower capacitor portion 580B have opposite installation orientations in the radial direction RD. In one of the upper capacitor portion 580A and the lower capacitor portion 580B, the P capacitor terminal 582 is located at a position spaced to the radially outer side from the N capacitor terminal 583. In the other one, the N capacitor terminal 583 is located at a position spaced to the radially outer side from the P capacitor terminal 582. For example, in the upper capacitor portion 580A, the P capacitor terminal 582 is located at a position spaced to the radially outer side from the N capacitor terminal 583. In the lower capacitor portion 580B, the N capacitor terminal 583 is located at a position spaced to the radially outer side from the P capacitor terminal 582.

In the high voltage board 510, the P capacitor terminal 582 of the upper capacitor portion 580A and the N capacitor terminal 583 of the lower capacitor portion 580B are arranged in the circumferential direction CD. Similarly, the N capacitor terminal 583 of the upper capacitor portion 580A and the P capacitor terminal 582 of the lower capacitor portion 580B are arranged in the circumferential direction CD.

The multiple capacitor groups 580G include an upper capacitor group 580GA and a lower capacitor group 580GB. The upper capacitor group 580GA includes multiple upper capacitor portions 580A and does not include the lower capacitor portion 580B. The upper capacitor group 580GA is located at a position that is aligned with the upper switch group 530GA in the radial direction RD and that is spaced to the radially inner side from the upper switch group 530GA. The lower capacitor group 580GB includes multiple lower capacitor portions 580B and does not include the upper capacitor portion 580A. The lower capacitor group 580GB is located at a position that is aligned with the lower switch group 530GB in the radial direction RD and that is spaced to the radially inner side from the lower switch group 530GB. The upper capacitor group 580GA corresponds to a first capacitor group, and the lower capacitor group 580GB corresponds to a second capacitor group.

As illustrated in FIG. 15, in the inverter device 80, inductances L601 to L603 as parasitic inductances parasitic on the busbars 601 to 603 are likely to be generated. It can be said that the inductances L601 to L603 are parasitic on the lines 141 to 143. The inductances L601 to L603 are a P inductance L601, an N inductance L602, and an output inductance L603. The P inductance L601 is a parasitic inductance generated in the P busbar 601. The N inductance L602 is a parasitic inductance generated in the N busbar 602. The output inductance L603 is a parasitic inductance generated in the output busbar 603.

When the inductances L601 to L603 are parasitic on the busbars 601 to 603, a voltage drop occurs due to the inductances L601 to L603. In this case, a potential difference occurs in the arm switch unit 530 correspondingly to a voltage generated at the inductances L601 to L603. For example, when the inductance L601 is generated between two drain terminals 532 connected to the P busbar 601, a difference between potentials of the two drain terminals 532 occurs correspondingly to a voltage generated at the inductance L601. Therefore, a potential difference occurs between two arm switch units 530 having the two drain terminals 532.

In FIG. 15, for convenience of illustration, multiple inductances L601, multiple inductances L602, and multiple inductances L603 are shown side by side along the busbars 601 to 603, respectively. The Y capacitor 153 is connected to the earth busbar 604. The Y capacitor 153 includes the Y capacitor 153 connected to the earth busbar 604 and the P busbar 601, and the Y capacitor 153 connected to the earth busbar 604 and the N busbar 602. The Y capacitor portion 527 is electrically connected to the P busbar 601 or the N busbar 602, and is connected to the earth busbar 604 so as to be electrically connected to the ground GND.

In the inverter device 80, an inductance L580 as a parasitic inductance parasitic on the smoothing capacitor portion 580 is likely to be generated. The inductance L580 is generated in the smoothing capacitor portion 580. For example, the inductance L580 is generated in an energization path connected to the smoothing capacitor 145 in the smoothing capacitor portion 580. The inductance L580 is generated in an energization path between the smoothing capacitor 145 and the P busbar 601 and between the smoothing capacitor 145 and the N busbar 602.

In the arm switch unit 530, an inductance L530 as a parasitic inductance parasitic on the arm switch 86 is likely to be generated. The inductance L530 is generated in the arm switch unit 530. For example, the inductance L530 is generated in an energization path connected to the arm switch 86 in the arm switch unit 530. The inductance L530 is generated in an energization path between the arm switch 86 and the P busbar 601 or between the arm switch 86 and the N busbar 602, and between the arm switch 86 and the output busbar 603.

Figure 17:
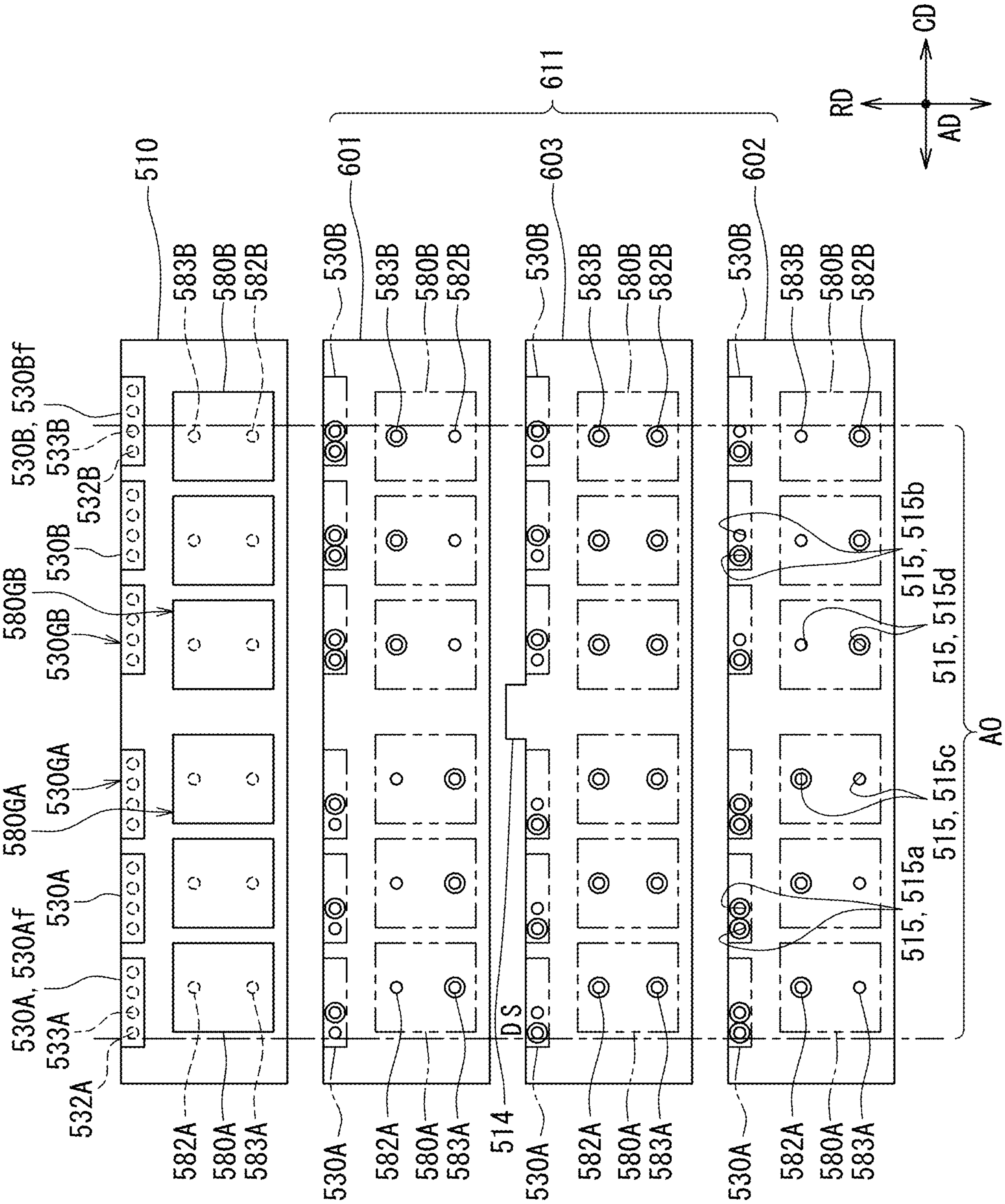
FIG. 17 is an exploded top view of the high voltage board.

As illustrated in FIGS. 11 and 17, multiple through holes 515 are provided in the high voltage board 510. The arm switch unit 530 and the smoothing capacitor portion 580 are electrically connected to the busbars 601 to 603 through the through holes 515. In the arm switch unit 530, the drain terminal 532 and the source terminal 533 are inserted through respective through holes 515. The drain terminal 532 and the source terminal 533 are connected to one of the busbars 601 to 603. In the smoothing capacitor portion 580, the P capacitor terminal 582 and the N capacitor terminal 583 are inserted through respective through holes 515. The P capacitor terminal 582 and the N capacitor terminal 583 are connected to the P busbar 601 or the N busbar 602.

The multiple through holes 515 include an upper switch hole 515*a*, a lower switch hole 515*b*, an upper capacitor hole 515*c*, and a lower capacitor hole 515*d*. Multiple switch holes 515*a* are provided along the outer peripheral end 512 in the high voltage board 510, and multiple switch holes 515*b* are provided along the outer peripheral end 512 in the high voltage board 510. The terminals 532 and 533 of the upper arm switch unit 530A are inserted through the upper switch hole 515*a*. The upper switch hole 515*a* is provided at a position overlapping the upper arm switch unit 530A in the axial direction AD. The terminals 532 and 533 of the lower arm switch unit 530B are inserted through the lower switch hole 515*b*. The lower switch hole 515*b* is provided at a position overlapping the lower arm switch unit 530B in the axial direction AD.

Multiple capacitor holes 515*c* are provided in the radial direction RD and in the circumferential direction CD, and multiple capacitor holes 515*d* are provided in the radial direction RD and in the circumferential direction CD. The capacitor terminals 582 and 583 of the smoothing capacitor portion 580 are inserted through the upper capacitor hole 515*c*. The upper capacitor hole 515*c* is provided at a position overlapping the upper capacitor portion 580A in the axial direction AD. The capacitor terminals 582 and 583 of the smoothing capacitor portion 580 are inserted through the lower capacitor hole 515*d*. The lower capacitor hole 515*d* is provided at a position overlapping the lower capacitor portion 580B in the axial direction AD.

As illustrated in FIG. 17, in the upper arm switch unit 530A, each of an upper drain terminal 532A and the upper source terminal 533A is individually inserted through the upper switch hole 515*a*. The upper drain terminal 532A and the upper source terminal 533A are the drain terminal 532 and the source terminal 533 of the upper arm switch unit 530A. The upper drain terminal 532A is electrically connected to the P busbar 601 through the upper switch hole 515*a*. The upper source terminal 533A is electrically connected to the output busbar 603 through the upper switch hole 515*a*. The upper drain terminal 532A corresponds to an upper input terminal, and the upper source terminal 533A corresponds to an upper output terminal.

In the lower arm switch unit 530B, each of the lower drain terminal 532B and a lower source terminal 533B is individually inserted through the lower switch hole 515*b*. The lower drain terminal 532B and the lower source terminal 533B are the drain terminal 532 and the source terminal 533 of the lower arm switch unit 530B. The lower drain terminal 532B is electrically connected to the output busbar 603 through the lower switch hole 515*b*. The lower source terminal 533B is electrically connected to the N busbar 602 through the lower switch hole 515*b*. The lower drain terminal 532B corresponds to a lower input terminal, and the lower source terminal 533B corresponds to a lower output terminal.

In the upper capacitor portion 580A, each of an upper P capacitor terminal 582A and an upper N capacitor terminal 583A is individually inserted through the upper capacitor hole 515*c*. The upper P capacitor terminal 582A and the upper N capacitor terminal 583A are the P capacitor terminal 582 and the N capacitor terminal 583 of the upper capacitor portion 580A. The upper P capacitor terminal 582A is electrically connected to the P busbar 601 through the upper capacitor hole 515*c*. The upper N capacitor terminal 583A is electrically connected to the N busbar 602 through the upper capacitor hole 515*c*.

In the lower capacitor portion 580B, each of a lower P capacitor terminal 582B and a lower N capacitor terminal 583B is individually inserted through the lower capacitor hole 515*d*. The lower P capacitor terminal 582B and the lower N capacitor terminal 583B are the P capacitor terminal 582 and the N capacitor terminal 583 of the lower capacitor portion 580B. The lower P capacitor terminal 582B is electrically connected to the P busbar 601 through the lower capacitor hole 515*d*. The lower N capacitor terminal 583B is electrically connected to the N busbar 602 through the lower capacitor hole 515*d*.

In the high voltage board 510, the terminals 532A and 533A of the upper arm switch unit 530A and the terminals 582A and 583A of the upper capacitor portion 580A are arranged in the radial direction RD as a whole. The terminals 582A and 583A of the upper capacitor portion 580A are located at positions spaced to the radially inner side from the terminals 532A and 533A of the upper arm switch unit 530A. Similarly, the terminals 532B and 533B of the lower arm switch unit 530B and the terminals 582B and 583B of the lower capacitor portion 580B are arranged in the radial direction RD. The terminals 582B and 583B of the lower capacitor portion 580B are located at positions spaced to the radially inner side from the terminals 532B and 533B of the lower arm switch unit 530B.

The arm switch unit 530 and the smoothing capacitor portion 580 are connected to the busbars 601 to 603 in each of the first busbar set 611 and the second busbar set 612. The connection configuration of the arm switch unit 530 and the smoothing capacitor portion 580 and the busbars 601 to 603 is the same between the first busbar set 611 and the second busbar set 612. In FIGS. 16 to 19, illustration of the second busbar set 612 is omitted. In FIG. 17, a top view of the high voltage board 510, a top view of the P busbar 601, a top view of the output busbar 603, and a top view of the N busbar 602 are illustrated in order from above.

Figure 18:
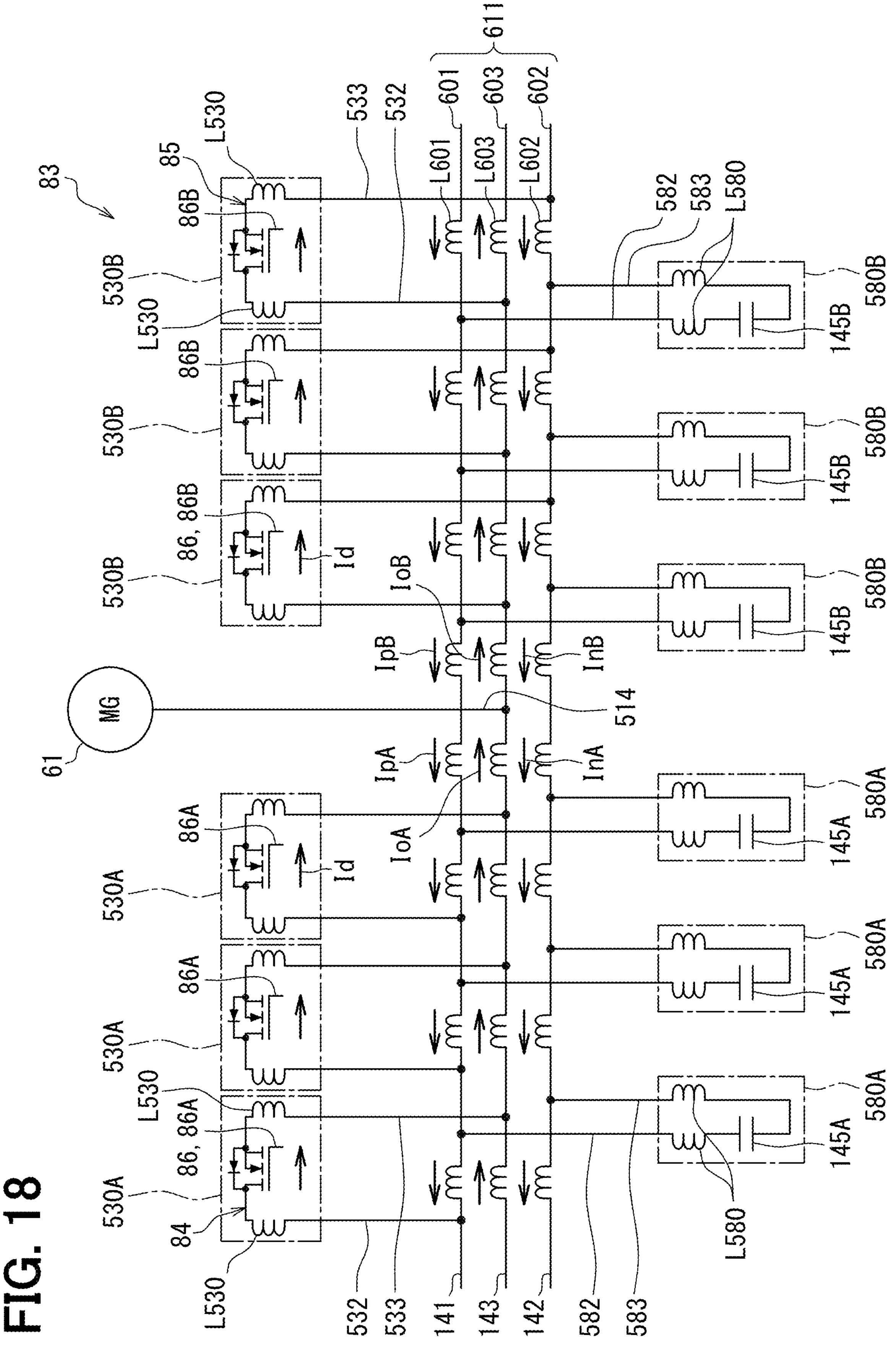
FIG. 18 is a circuit diagram for illustrating an output current, a P current, and an N current.
Figure 19:
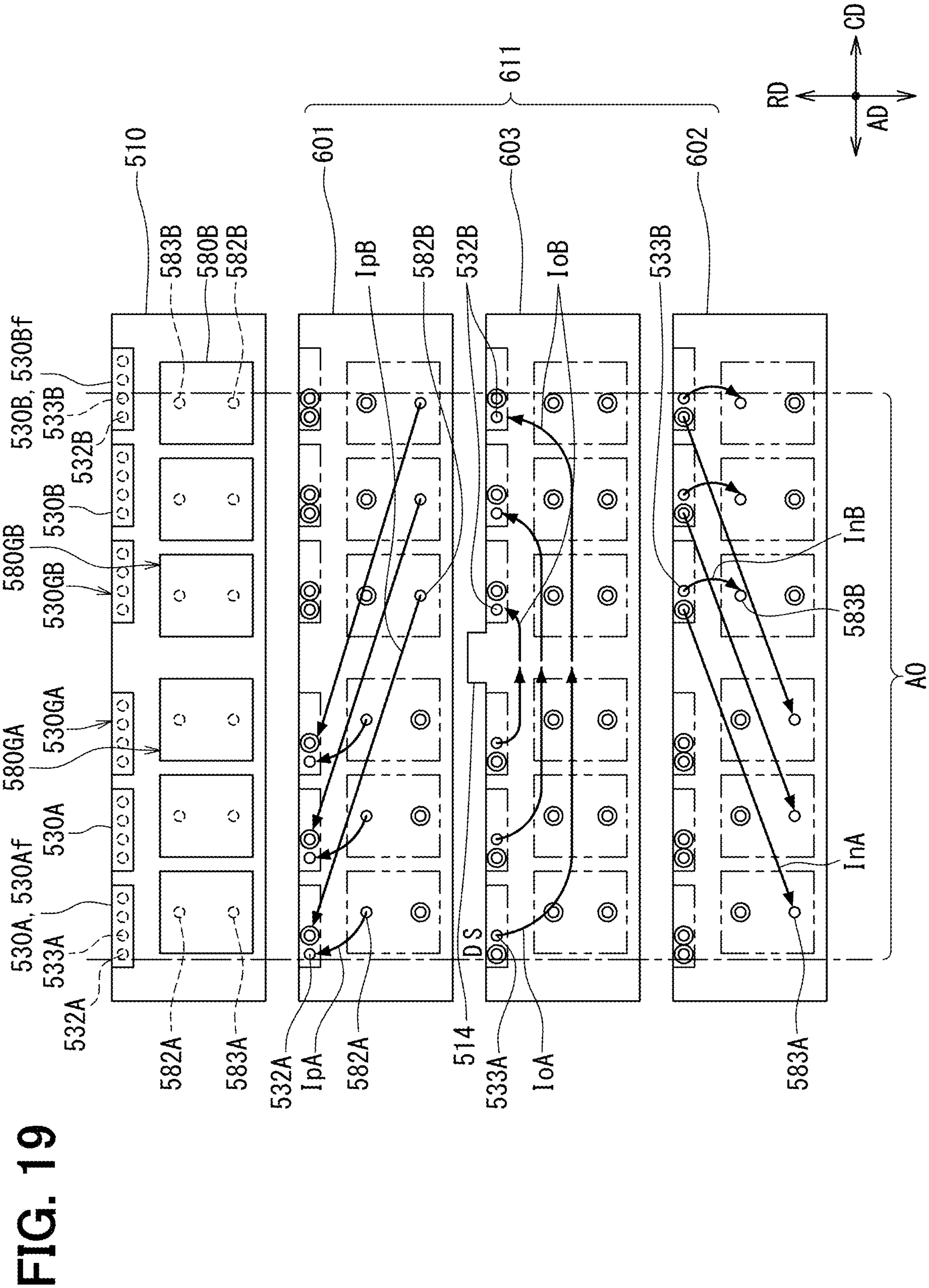
FIG. 19 is an exploded top view of the high voltage board for illustrating the output current, the P current, and the N current.

As illustrated in FIGS. 18 and 19, currents IpA, IpB, InA, InB, IoA, and IoB flow in the high voltage board 510. The currents IpA, IpB, InA, InB, IoA, and IoB flow in the same manner in the first busbar set 611 and the second busbar set 612. In the present embodiment, the currents IpA, IpB, InA, InB, IoA, and IoB flowing through the first busbar set 611 will be described. The description of the currents IpA, IpB, InA, InB, IoA, and IoB flowing through the second busbar set 612 is omitted.

In the output busbar 603, the upper output current IoA and the lower output current IoB flow. The output currents IoA and IoB flow in the circumferential direction CD as a whole. As a whole, the output currents IoA and IoB flow from the upper switch group 530GA toward the lower switch group 530GB in one phase. Specifically, the upper output current IoA flows from the upper source terminal 533A toward the output connection portion 514 in the circumferential direction CD. The lower output current IoB flows from the output connection portion 514 toward the lower drain terminal 532B in the circumferential direction CD. The upper output current IoA and the lower output current IoB correspond to an output current.

There is an overlap region AO in the high voltage board 510. The overlap region AO is a region overlapping the output currents IoA and IoB flowing through the output busbar 603. The overlap region AO is present individually for each of the multiple phases. The overlap region AO is present individually for each of the multiple output busbars 603, for example. The overlap region AO is a region overlapping the upper switch group 530GA and the lower switch group 530GB included in one phase in the busbars 601 to 603. The overlap region AO includes the entire busbars 601 to 603 in the radial direction RD. The overlap region AO includes a region in which the arm switch unit 530 and the smoothing capacitor portion 580 are provided in the circumferential direction CD.

The overlap region AO extends in the circumferential direction CD so as to extend from a farthest upper component 530Af to a farthest lower component 530Bf. The farthest upper component 530Af is the upper arm switch unit 530A located farthest from the lower switch group 530GB among the multiple upper arm switch units 530A of the upper switch group 530GA. The farthest upper component 530Af is located at an end position opposite to the lower switch group 530GB in the upper switch group 530GA. The farthest lower component 530Bf is the lower arm switch unit 530B located farthest from the upper switch group 530GA among the multiple lower arm switch units 530B of the lower switch group 530GB. The farthest lower component 530Bf is located at an end position opposite to the upper switch group 530GA in the lower switch group 530GB.

The overlap region AO extends from the terminals 532A and 533A of the farthest upper component 530Af to the terminals 532B and 533B of the farthest lower component 530Bf. The overlap region AO includes the terminals 532A, 533A, 532B, and 533B. The overlap region AO at least includes the upper source terminal 533A of the farthest upper component 530Af and the lower drain terminal 532B of the farthest lower component 530Bf.

In the P busbar 601, the upper P current IpA and the lower P current IpB flow. The P currents IpA and IpB flow in the circumferential direction CD as a whole. As a whole, the P currents IpA and IpB flow from the upper capacitor group 580GA and the lower capacitor group 580GB toward the upper switch group 530GA in one phase. The P currents IpA and IpB flow in a reverse direction to the output currents IoA and IoB in the circumferential direction CD. Specifically, the upper P current IpA flows in the circumferential direction CD from the upper P capacitor terminal 582A toward the upper drain terminal 532A. The lower P current IpB flows in the circumferential direction CD from the lower P capacitor terminal 582B toward the upper drain terminal 532A. The lower P current IpB flows in the reverse direction to the output currents IoA and IoB in the circumferential direction CD. The P currents IpA and IpB correspond to a high potential current and a parallel current.

In the N busbar 602, the upper N current InA and the lower N current InB flow. The N currents InA and InB flow in the circumferential direction CD as a whole. The N currents InA and InB flow from the lower switch group 530GB toward the upper capacitor group 580GA and the lower capacitor group 580GB in one phase. The N currents InA and InB flow in a reverse direction to the output currents IoA and IoB in the circumferential direction CD. Specifically, the upper N current InA flows from the lower source terminal 533B toward the upper N capacitor terminal 583A in the circumferential direction CD. The lower N current InB flows from the lower source terminal 533B toward the lower N capacitor terminal 583B in the circumferential direction CD. The lower N current InB flows in the reverse direction to the output currents IoA and IoB in the circumferential direction CD. The N currents InA and InB correspond to a low potential current and a parallel current.

The P currents IpA and IpB and the N currents InA and InB flow in the same direction in the circumferential direction CD as a whole while flowing in reverse directions in the radial direction RD. This is because the P capacitor terminals 582A and 582B and the N capacitor terminals 583A and 583B are arranged in the radial direction RD in both the upper capacitor portion 580A and the lower capacitor portion 580B. For example, from the lower P capacitor terminal 582B to the upper drain terminal 532A, the lower P current IpB flows toward the radially outer side while flowing in the circumferential direction CD. From the lower source terminal 533B to the upper N capacitor terminal 583A, the lower N current InB flows toward the radially inner side while flowing in the circumferential direction CD.

In the P busbar 601, the upper P current IpA flows from the upper P capacitor terminal 582A located on the radially outer side of the upper N capacitor terminal 583A into the upper drain terminal 532A. The lower P current IpB flows from the lower P capacitor terminal 582B located on the radially inner side of the lower N capacitor terminal 583B into the upper drain terminal 532A. As described above, a distance over which the upper P current IpA flows in the radial direction RD is different from a distance over which the lower P current IpB flows in the radial direction RD. In the present embodiment, the distance over which the upper P current IpA flows toward the radially outer side is shorter than the distance over which the lower P current IpB flows toward the radially outer side.

In the N busbar 602, the lower N current InB flowing out from the lower source terminal 533B flows into the lower N capacitor terminal 583B located on the radially outer side of the lower P capacitor terminal 582B. The upper N current InA flowing out from the lower source terminal 533B flows into the upper N capacitor terminal 583A located on the radially inner side of the upper P capacitor terminal 582A. As described above, a distance over which the lower N current InB flows in the radial direction RD is different from a distance over which the upper N current InA flows in the radial direction RD. In the present embodiment, the distance over which the lower N current InB flows toward radially inner side is shorter than the distance over which the upper N current InA flows toward the radially inner side.

In FIG. 19, for convenience of illustration, each of the currents IpA, IpB, InA, InB, IoA, and IoB is indicated by multiple arrows. In practice, each of the currents IpA, IpB, InA, InB, IoA, and IoB indicated by multiple arrows collectively flows through the busbars 601 to 603 correspondingly.

For example, the lower P current IpB flows from the multiple lower P capacitor terminals 582B toward the multiple upper drain terminals 532A through the P busbar 601. Therefore, the lower P current IpB increases as a distance from the output connection portion 514 in the circumferential direction CD decreases. After passing through the output connection portion 514, the lower P current IpB decreases as the distance from the output connection portion 514 increases. Similarly to the lower P current IpB, the upper N current InA increases as a distance from the output connection portion 514 in the circumferential direction CD decreases. After passing through the output connection portion 514, the upper N current InA decreases as the distance from the output connection portion 514 increases.

The upper output current IoA increases as a distance from the output connection portion 514 in the circumferential direction CD decreases, and reaches the output connection portion 514. The lower output current IoB decreases as a distance from the output connection portion 514 in the circumferential direction CD increases. In the high voltage board 510, a region in which the upper output current IoA increases as the distance from the output connection portion 514 decreases and a region in which the lower P current IpB and the upper N current InA increase as the distance from the output connection 514 decreases overlap in the axial direction AD. Therefore, it is likely that a magnetic field produced by the upper output current IoA and a magnetic field produced by the lower P current IpB and a magnetic field produced by the upper N current InA cancel each other out.

A region in which the lower output current IoB decreases as the distance from the output connection portion 514 increases and a region in which the lower P current IpB and the upper N current InA decrease as the distance from the output connection portion 514 increases overlap in the axial direction AD. Therefore, it is likely that a magnetic field produced by the lower output current IoB and the magnetic field produced by the lower P current IpB and the magnetic field produced by the upper N current InA cancel each other out. Accordingly, the inductances L601 to L603 generated in the busbars 601 to 603 are easily reduced.

As described above, in the high voltage board 510, the flows of the currents IpA, IpB, InA, InB, IoA, and IoB are set such that the inductances L601 to L603 are reduced. By reducing the inductances L601 to L603 generated in the busbars 601 to 603, occurrence of inconvenience such as a decrease in the switching accuracy of the arm switch unit 530 caused by the inductances L601 to L603 is restricted.

The inconvenience caused by the inductances L601 to L603 includes a current imbalance in addition to a decrease in the switching accuracy. The current imbalance means that, in a configuration in which multiple arm switch units 530 are connected in parallel, a difference in a switch current Id occurs in the multiple arm switch units 530. As illustrated in FIG. 18, the switch current Id is a current flowing through the arm switch unit 530. The switch current Id is a current flowing through a drain of the arm switch 86 in the arm switch unit 530, and may be referred to as a drain current.

Figure 20:
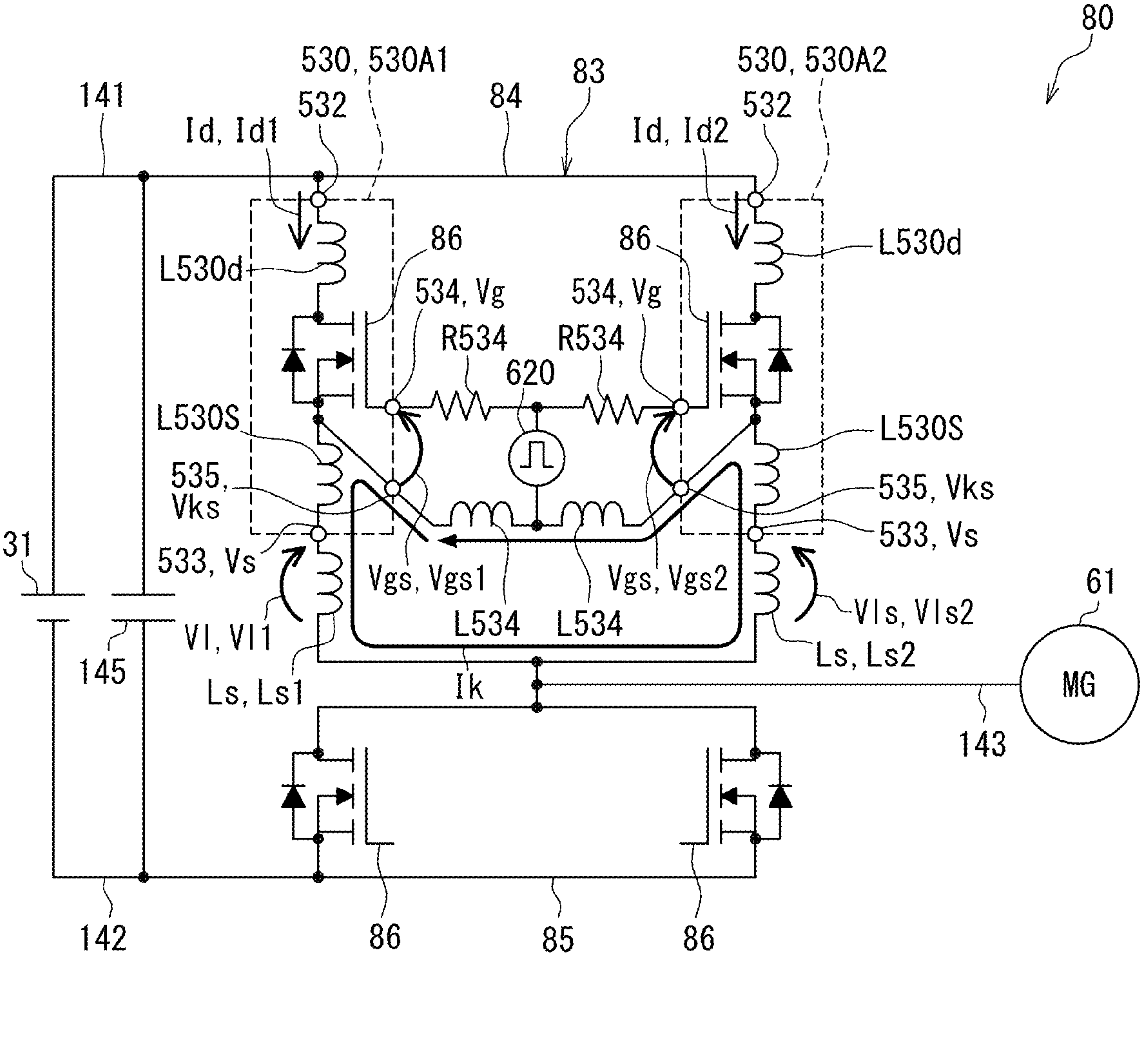
FIG. 20 is a circuit diagram for illustrating a current imbalance.

Regarding the current imbalance, a portion where two upper arm switch units 530A are connected in parallel in the inverter device 80 will be described as an example. As illustrated in FIG. 20, a first switch unit 530A1 and a second switch unit 530A2 are connected in parallel as two upper arm switch units 530A. In FIG. 20, only one of the multiple upper and lower arm circuits 83 provided in the inverter device 80 is illustrated. Further, among multiple upper arms 84 and multiple lower arms 85 provided in one upper and lower arm circuit 83, only two upper arms 84 and two lower arms 85 are illustrated.

The inverter device 80 includes a driving power supply 620. The driving power supply 620 applies a control voltage for controlling switching of the arm switch unit 530 to the arm switch unit 530. The driving power supply 620 is provided, for example, in the drive circuit 160. The driving power supply 620 is electrically connected to the gate terminal 534 and the driver source terminal 535. The driving power supply 620 is connected to the gate terminal 534 via, for example, a gate resistor R534. A parasitic inductance generated in a driver source path is referred to as an inductance L534. The driver source path is an energization path connecting the driving power supply 620 and the driver source terminal 535.

In the arm switch unit 530, the control voltage from the driving power supply 620 is input to the gate terminal 534. The gate terminal 534 corresponds to an input control terminal. A gate voltage Vg of the gate terminal 534 has a value corresponding to the control voltage. The gate voltage Vg is a potential of the gate terminal 534. In the arm switch unit 530, a current is output from the driver source terminal 535 as a control voltage is input to the gate terminal 534. The driver source terminal 535 corresponds to an output control terminal.

A driver source voltage Vks of the driver source terminal 535 increases or decreases according to a source voltage Vs of the source terminal 533. The driver source voltage Vks is a potential of the driver source terminal 535. The source voltage Vs is a potential of the source terminal 533. In the arm switch unit 530, a parasitic inductance generated in an energization path between the drain terminal 532 and the arm switch 86 is referred to as an inductance L530*d*. A parasitic inductance generated in an energization path between the arm switch 86 and the source terminal 533 is referred to as an inductance L530S. The driver source voltage Vks is a potential higher than the source voltage Vs by an amount corresponding to the inductance L530S.

The source voltage Vs is higher than a potential of the output line 143 by at least the inductance voltage Vl. The inductance voltage Vl is a voltage generated at an inductance Ls. The inductance Ls is a parasitic inductance generated in a source path. The source path is an energization path connecting the source terminal 533 and the output line 143. At least a part of the source path is formed by the output busbar 603. The inductance Ls includes the inductance L603 generated in the output busbar 603. Therefore, as the inductance L603 generated in the output busbar 603 increases, the inductance Ls generated in the source path increases, and the inductance voltage Vl increases.

For example, differently from the present embodiment, a first comparative example is assumed in which the flows of the currents IpA, IpB, InA, InB, IoA, and IoB are not such flows with which the inductances L601 to L603 are reduced. In the first comparative example, since the inductance L603 generated in the output busbar 603 is large, the inductance Ls generated in the source path is increased. Thus, the inductance voltage Vl is increased and the source voltage Vs is increased. In the arm switch unit 530, when the source voltage Vs is increased, the driver source voltage Vks is also increased.

In the first comparative example, the source voltage Vs in the first switch unit 530A1 and the source voltage Vs in the second switch unit 530A2 are likely to be different from each other. For example, when a separation distance between the second switch unit 530A2 and the output connection portion 514 is larger than a separation distance between the first switch unit 530A1 and the output connection portion 514, a source path of the first switch unit 530A1 is longer than a source path of the second switch unit 530A2. Thus, an inductance Ls2 for the second switch unit 530A2 is larger than an inductance Ls1 for the first switch unit 530A1. Accordingly, an inductance voltage Vls2 for the second switch unit 530A2 is larger than an inductance voltage Vl1 for the first switch unit 530A1. The source voltage Vs in the second switch unit 530A2 is higher than the source voltage Vs in the first switch unit 530A1, and the driver source voltage Vks in the second switch unit 530A2 is higher than the driver source voltage Vks in the first switch unit 530A1.

When a potential difference occurs in the driver source voltage Vks between the first switch unit 530A1 and the second switch unit 530A2, a circulating current Ik flows between the first switch unit 530A1 and the second switch unit 530A2. This potential difference may be referred to as a source potential difference.

In the arm switch unit 530, the switch current Id flows according to a gate-source voltage Vgs. The gate-source voltage Vgs is a potential difference between the gate voltage Vg and the driver source voltage Vks. For example, as the gate-source voltage Vgs increases, the switch current Id is likely to increase.

As described above, when the circulating current Ik flows in the first comparative example, a gate-source voltage Vgs2 in the second switch unit 530A2 is smaller than a gate-source voltage Vgs1 in the first switch unit 530A1. This is because, while the gate voltage Vg is the same between the first switch unit 530A1 and the second switch unit 530A2, the driver source voltage Vks in the second switch unit 530A2 is higher than the driver source voltage Vks in the first switch unit 530A1.

Figure 21:
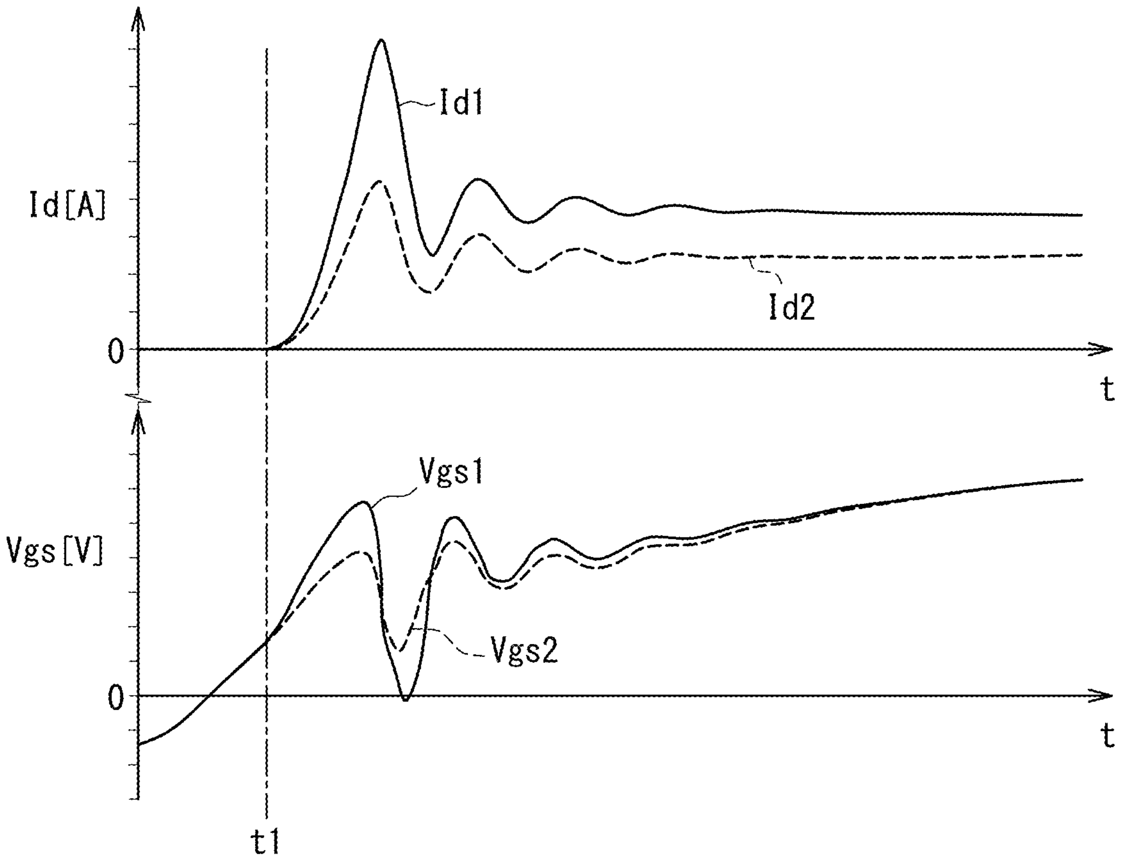
FIG. 21 is a graph showing a switch current for illustrating the current imbalance.

As illustrated in FIG. 21, in the first switch unit 530A1 and the second switch unit 530A2, switch currents Id1 and Id2 are likely to be different due to the difference between the gate-source voltages Vgs1 and Vgs2. As described above, when the inductance Ls2 is larger than the inductance Ls1, the gate-source voltage Vgs2 in the second switch unit 530A2 is likely to be smaller than the gate-source voltage Vgs1 in the first switch unit 530A1. Therefore, the switch current Id2 in the second switch unit 530A2 is likely to be smaller than the switch current Id1 in the first switch unit 530A1. Thus, a current imbalance occurs between the first switch unit 530A1 and the second switch unit 530A2.

In multiple arm switch units 530, if a current imbalance occurs, an occurrence of a difference in the degree of deterioration such as aging deterioration is conceivable. That is, the degree of deterioration of the multiple arm switch units 530 varies. For example, as in the first comparative example, when the switch current Id1 is larger than the switch current Id2, the first switch unit 530A1 is more likely to be deteriorated than the second switch unit 530A2 due to a larger current always flowing through the first switch unit 530A1.

On the other hand, in the present embodiment, the flows of the currents IpA, IpB, InA, InB, IoA, and IoB are set such that the inductances L601 to L603 are reduced.

In the present embodiment, the arm switch unit 530 includes the driver source terminal 535. Further, in the present embodiment, the inductances Ls1 and Ls2 are included in the inductance L603 in the first switch unit 530A1 and the second switch unit 530A2 illustrated in FIG. 20. Therefore, by reducing the inductance L603, the inductances Ls1 and Ls2 can be reduced. As the inductances Ls1 and Ls2 decrease, the difference between the inductances Ls1 and Ls2 decreases and the circulating current Ik decreases. As the circulating current Ik decreases, the difference between the switch currents Id1 and Id2 decreases and the current imbalance is less likely to occur. As the circulating current Ik decreases, the difference between the switch currents Id1 and Id2 decreases. For example, if the difference between the inductances Ls1 and Ls2 can be set to zero, the circulating current Ik can be reduced as much as possible, and the current imbalance hardly occurs. Accordingly, a variation in the degree of deterioration between the first switch unit 530A1 and the second switch unit 530A2 is less likely to occur.

Figure 22:
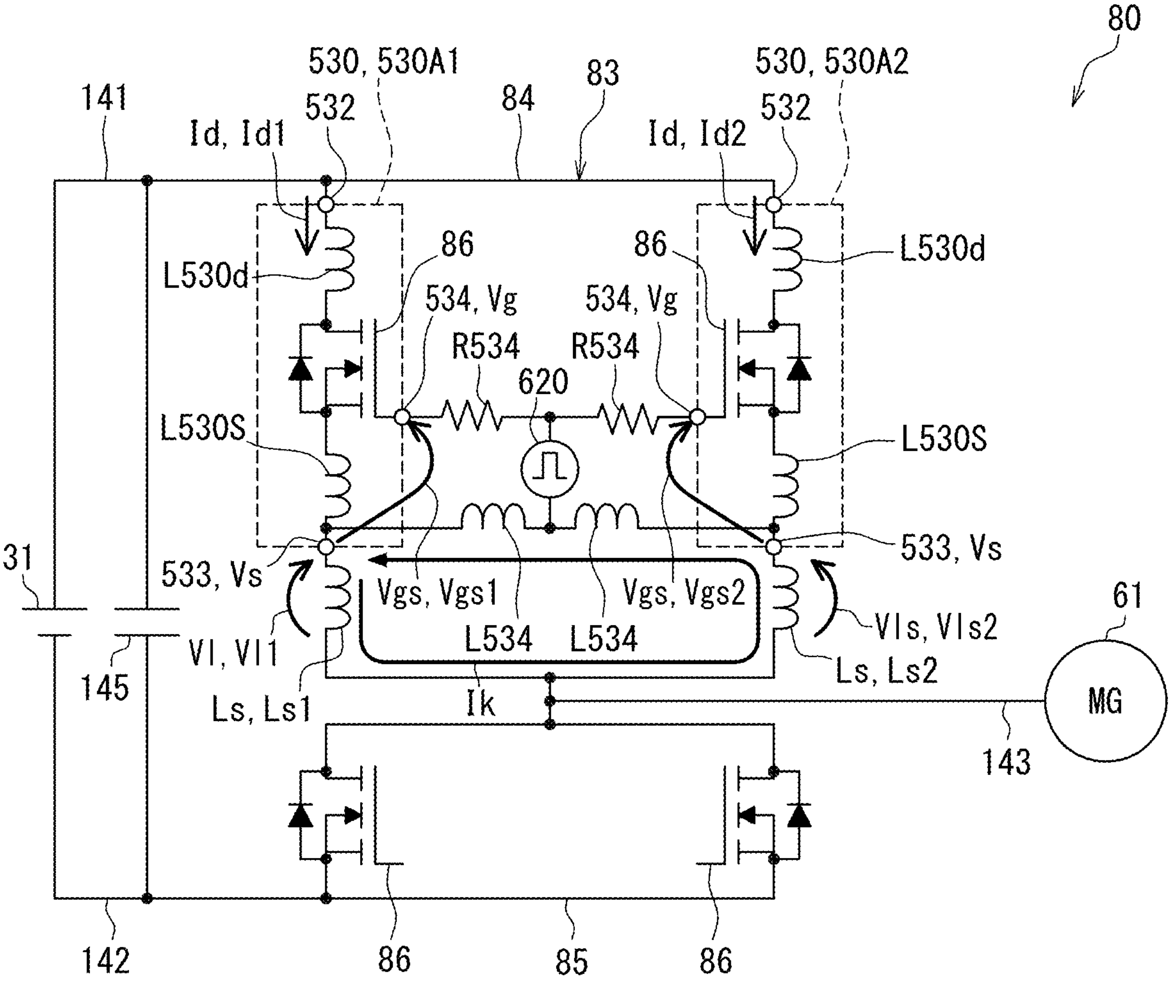
FIG. 22 is a circuit diagram for illustrating a second comparative example.

For example, differently from the present embodiment, a second comparative example is assumed in which the arm switch unit 530 does not include the driver source terminal 535. In the second comparative example, as illustrated in FIG. 22, the driving power supply 620 is electrically connected to the gate terminal 534 and the source terminal 533. Therefore, in the second comparative example, the circulating current Ik does not flow to the inductance L530S. The circulating current Ik is a current corresponding to the inductance Ls of the inductance Ls and the inductance L530S.

<Configuration Group C>

Figure 23:
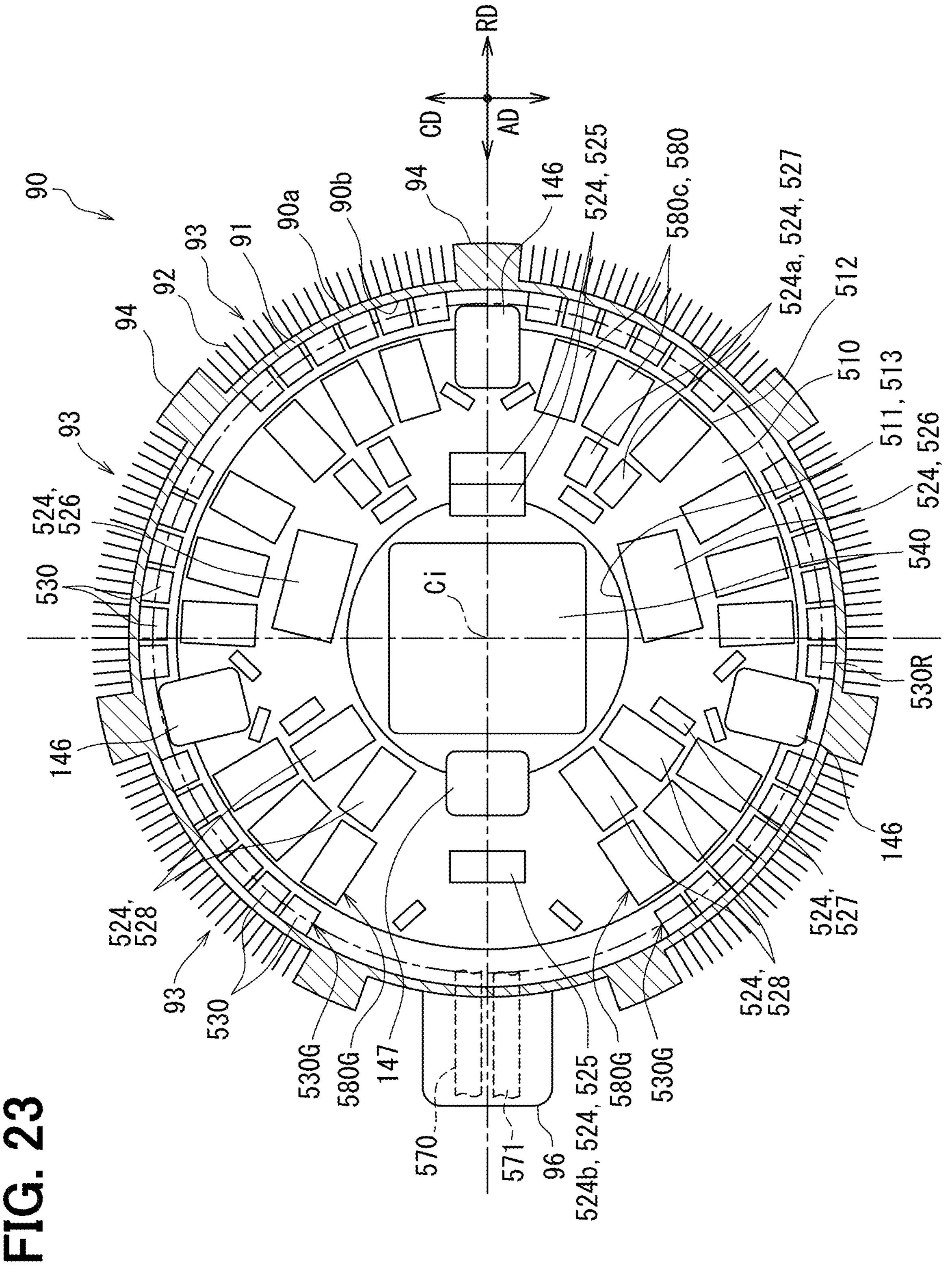
FIG. 23 is a top view of the inner portion of the inverter device in a configuration group C as viewed from the high voltage side.

As illustrated in FIG. 23, multiple arm switch units 530 are arranged in the circumferential direction CD along the outer peripheral end 512 with respect to the high voltage board 510. The arm switch units 530 are also arranged in the circumferential direction CD along the outer peripheral end 552 with respect to the drive board 550. The multiple arm switch units 530 are provided on the inner peripheral surface 90*b* with respect to the inverter outer peripheral wall 91. The arm switch row 530R extends in the circumferential direction CD along the outer peripheral ends 512 and 552, and has a ring shape. In the high voltage board 510 and the drive board 550, the outer peripheral ends 512 and 552 continuously extend in the circumferential direction CD.

Figure 24:
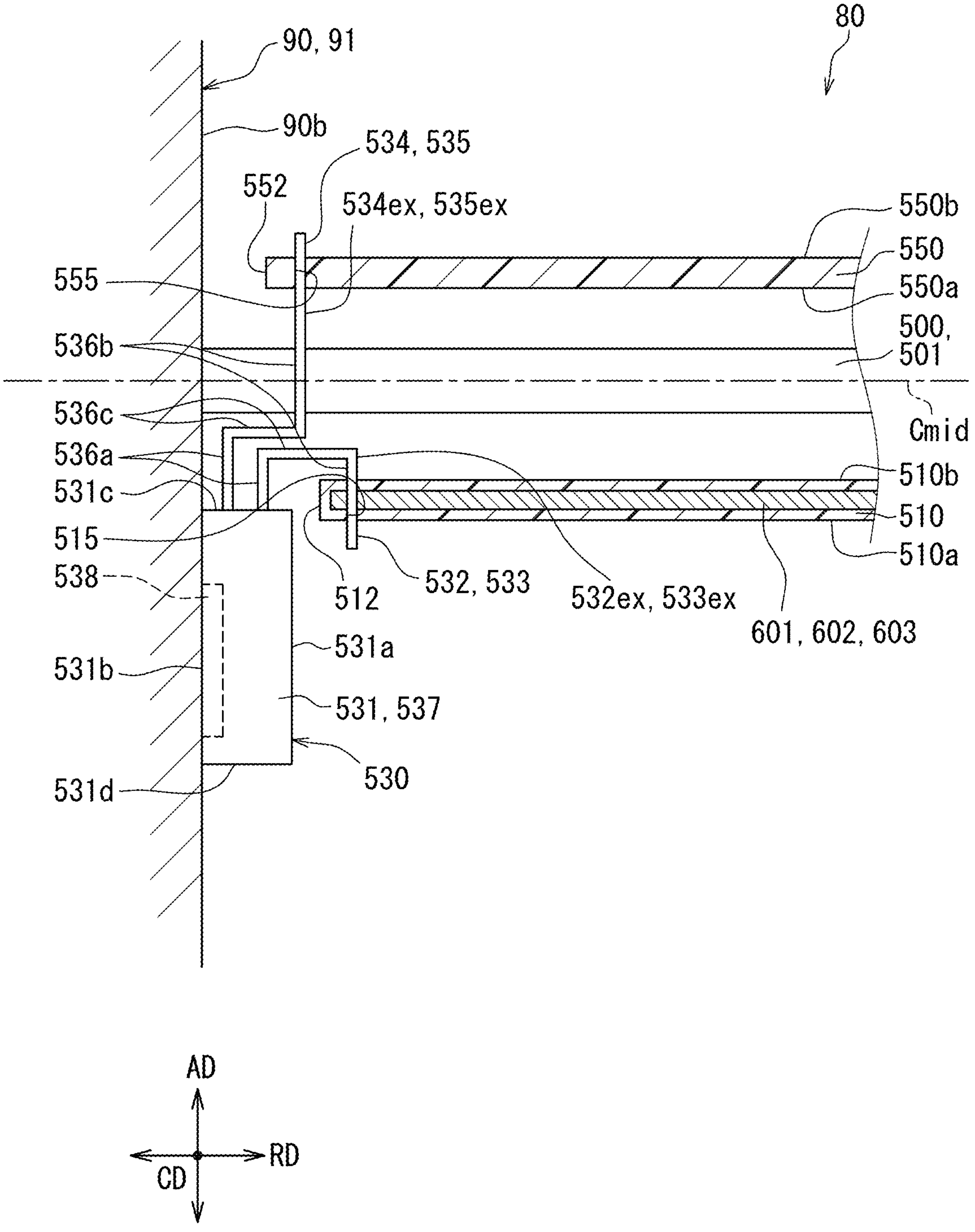
FIG. 24 is a schematic longitudinal sectional view of the periphery of the arm switch unit.
Figure 25:
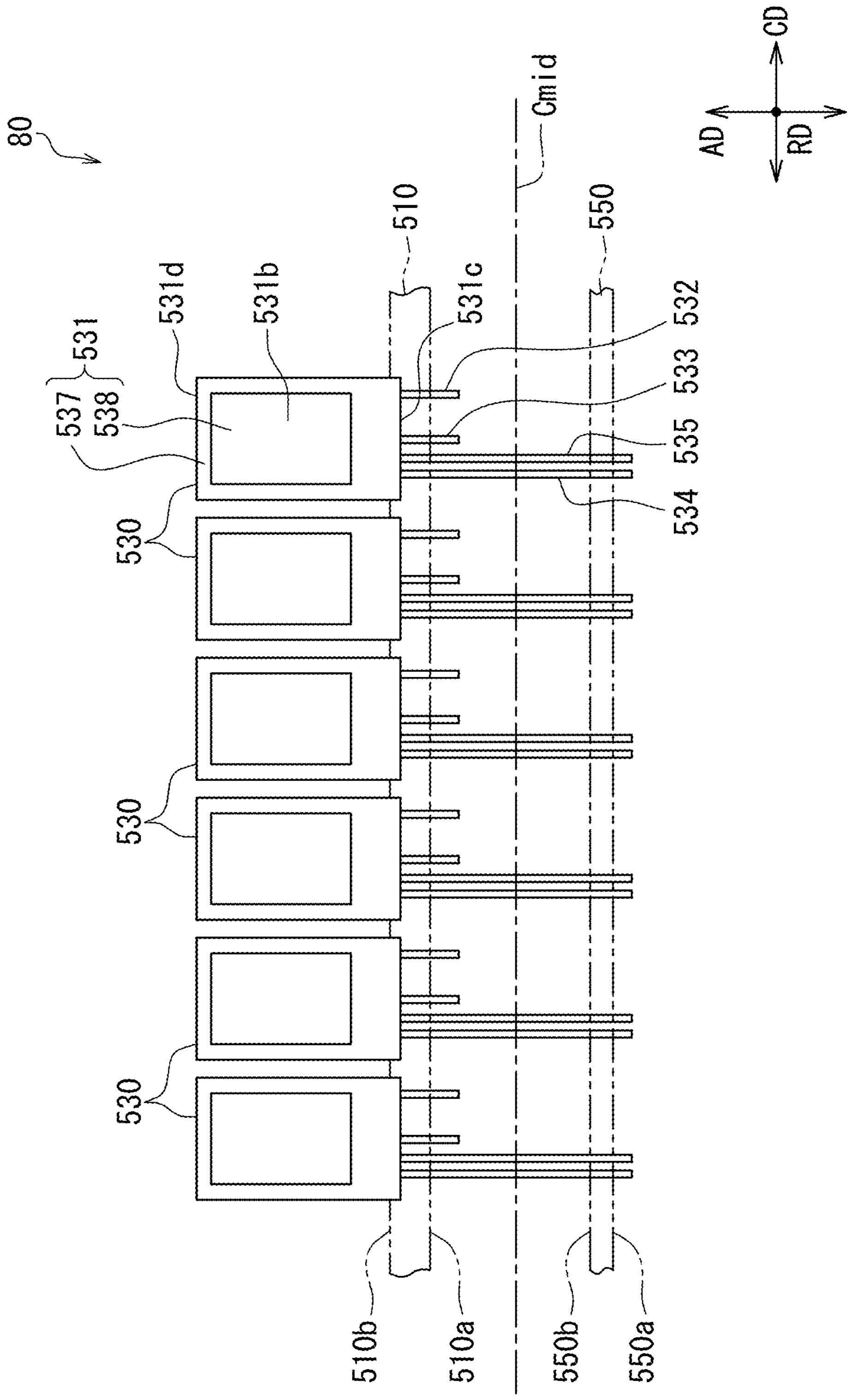
FIG. 25 is a view of the periphery of the arm switch unit as viewed from an outer side in a circumferential direction.

As illustrated in FIGS. 24 and 25, the switch main body 531 includes a main body base 537 and a main body heat dissipation portion 538. The main body base 537 is made of a resin material or the like and has an electrical insulation property. The main body base 537 is, for example, a mold resin. The main body base 537 forms an outer shell of the switch main body 531. The main body base 537 forms at least a part of each of the first plate surface 531*a*, the second plate surface 531*b*, a main body base end portion 531*c*, and a main body tip end portion 531*d*.

The main body heat dissipation portion 538 is made of a metal material or the like and has thermal conductivity. The main body heat dissipation portion 538 has higher thermal conductivity than the main body base 537, for example. The main body heat dissipation portion 538 is, for example, a metal plate formed in a plate shape. The main body heat dissipation portion 538 is embedded in the main body base 537. In the switch main body 531, the terminals 532 to 535 and the like are electrically insulated from the main body heat dissipation portion 538 by the main body base 537.

In the switch main body 531, heat dissipation performance of the second plate surface 531*b* is improved by the main body heat dissipation portion 538. The heat dissipation performance of the second plate surface 531*b* is higher than heat dissipation performance of the first plate surface 531*a*. When heat is generated in the switch main body 531, heat dissipated from the second plate surface 531*b* is more than heat dissipated from the first plate surface 531*a*. The main body heat dissipation portion 538 is exposed from the second plate surface 531*b* and is not exposed from the first plate surface 531*a*. At least a part of the main body heat dissipation portion 538 forms the second plate surface 531*b*.

For example, the second plate surface 531*b* includes a portion formed by the main body base 537 and a portion formed by the main body heat dissipation portion 538. The main body heat dissipation portion 538 is in contact with the inner peripheral surface 90*b* at the second plate surface 531*b*. The first plate surface 531*a* corresponds to an inner plate surface, and the second plate surface 531*b* corresponds to an outer plate surface.

In the arm switch unit 530, electric power from the battery 31 is supplied to the drain terminal 532 and the source terminal 533. The drain terminal 532 and the source terminal 533 are electric power terminals to which electric power is supplied, and correspond to a power terminal. The drain terminal 532 and the source terminal 533 are electrically connected to the high voltage board 510. The high voltage board 510 corresponds to a power connection object and a power board, and the outer peripheral end 512 corresponds to a power outer peripheral end. The drain terminal 532 is electrically connected to the P busbar 601 or the output busbar 603. The source terminal 533 is connected to the output busbar 603 or the N busbar 602. In FIG. 24, the P busbar 601, the N busbar 602, and the output busbar 603 are collectively illustrated, and illustration of the earth busbar 604 is omitted.

As illustrated in FIG. 24, the drain terminal 532 and the source terminal 533 are connected to the through hole 515 in the high voltage board 510. The drain terminal 532 and the source terminal 533 are electrically connected to the P busbar 601, the N busbar 602, or the output busbar 603, while being inserted through the through hole 515. Multiple through holes 515 are provided in the circumferential direction CD along at least the outer peripheral end 512 in the high voltage board 510. The through hole 515 is provided in each of a connection portion between the drain terminal 532 and the high voltage board 510 and a connection portion between the source terminal 533 and the high voltage board 510. The P busbar 601, the N busbar 602, and the output busbar 603 correspond to a power busbar.

The gate terminal 534 and the driver source terminal 535 are terminals for controlling power conversion performed by switching of the arm switch 86, and correspond to a control terminal. The gate terminal 534 and the driver source terminal 535 are electrically connected to the drive board 550. The drive board 550 corresponds to a control connection object and an object board, and the outer peripheral end 552 corresponds to a control outer peripheral end. The gate terminal 534 and the driver source terminal 535 are electrically connected to, for example, the wiring pattern of the drive board 550.

The gate terminal 534 and the driver source terminal 535 are connected to a through hole 555 in the drive board 550. The gate terminal 534 and the driver source terminal 535 are electrically connected to the wiring pattern of the drive board 550 while being inserted through the through hole 555. Multiple through holes 555 are provided in the circumferential direction CD along the outer peripheral end 552 in the drive board 550. The through hole 555 is provided in each of a connection portion between the gate terminal 534 and the drive board 550 and a connection portion between the driver source terminal 535 and the drive board 550.

The high voltage board 510 and the drive board 550 face each other. In the high voltage board 510 and the drive board 550, a second high-voltage surface 510*b* and a first control surface 550*a* face each other. The high voltage board 510 has the first high-voltage surface 510*a* and the second high-voltage surface 510*b*. In the high voltage board 510, the first high-voltage surface 510*a* faces the high voltage side, and the second high-voltage surface 510*b* faces the drive board 550. The drive board 550 has the first control surface 550*a* and a second control surface 550*b* as a pair of plate surfaces. In the drive board 550, the first control surface 550*a* faces the high voltage board 510, and the second control surface 550*b* faces the low voltage side.

The switch main body 531 is provided at a position closer to the high voltage board 510 than to the drive board 550. A separation distance between the switch main body 531 and the high voltage board 510 is smaller than a separation distance between the switch main body 531 and the drive board 550. A shortest distance between the switch main body 531 and the high voltage board 510 is the separation distance, and a shortest distance between the switch main body 531 and the drive board 550 is the separation distance.

At least a part of the switch main body 531 is provided between the first high-voltage surface 510*a* and the second control surface 550*b* in the axial direction AD. In the switch main body 531, at least the main body base end portion 531*c* is provided between the first high-voltage surface 510*a* and the second control surface 550*b* in the axial direction AD. A region between the first high-voltage surface 510*a* and the second control surface 550*b* in the axial direction AD is a board region where the high voltage board 510 and the drive board 550 are provided. At least the main body base end portion 531*c* of the switch main body 531 falls within a projection region obtained by projecting the board region to the radially outer side.

The switch main body 531 is located on the high voltage side with respect to a board intermediate line Cmid. In the switch main body 531, the main body base end portion 531*c* is located between the board intermediate line Cmid and the first high-voltage surface 510*a* in the axial direction AD. The main body base end portion 531*c* is located at a position closer to the first high-voltage surface 510*a* than to the board intermediate line Cmid in the axial direction AD. The switch main body 531 extends toward the high voltage side with respect to the high voltage board 510 in the axial direction AD.

The board intermediate line Cmid is a virtual line passing through the middle between the high voltage board 510 and the drive board 550. The middle between the high voltage board 510 and the drive board 550 is, for example, the middle between the plate surfaces facing each other of the high voltage board 510 and the drive board 550. The board intermediate line Cmid extends parallel to, for example, the plate surfaces of the high voltage board 510 and the drive board 550. In the axial direction AD, a position through which the board intermediate line Cmid passes is an intermediate position between the high voltage board 510 and the drive board 550.

The drain terminal 532 has a drain exposed portion 532*ex*. The drain exposed portion 532*ex* is a portion of the drain terminal 532, which extends from the switch main body 531 to the high voltage board 510 and is exposed. The drain exposed portion 532*ex* connects the switch main body 531 and the high voltage board 510, and corresponds to a power connecting portion. If the drain exposed portion 532*ex* has a bent shape, a length dimension of the drain exposed portion 532*ex* is larger than the separation distance between the switch main body 531 and the high voltage board 510.

The source terminal 533 has a source exposed portion 533*ex*. The source exposed portion 533*ex* is a portion of the source terminal 533, which extends from the switch main body 531 to the high voltage board 510 and is exposed. The source exposed portion 533*ex* connects the switch main body 531 and the high voltage board 510, and corresponds to a power connecting portion. If the source exposed portion 533*ex* has a bent shape, a length dimension of the source exposed portion 533*ex* is larger than the separation distance between the switch main body 531 and the high voltage board 510.

The gate terminal 534 has a gate exposed portion 534*ex*. The gate exposed portion 534*ex* is a portion of the gate terminal 534, which extends from the switch main body 531 to the drive board 550 and is exposed. The gate exposed portion 534*ex* connects the switch main body 531 and the drive board 550, and corresponds to a control connecting portion. If the gate exposed portion 534*ex* has a bent shape, a length dimension of the gate exposed portion 534*ex* is larger than the separation distance between the switch main body 531 and the drive board 550.

The driver source terminal 535 has a driver source exposed portion 535*ex*. The driver source exposed portion 535*ex* is a portion of the driver source terminal 535, which extends from the switch main body 531 to the drive board 550 and is exposed. The driver source exposed portion 535*ex* connects the switch main body 531 and the drive board 550, and corresponds to a control connecting portion. If the driver source exposed portion 535*ex* has a bent shape, a length dimension of the driver source exposed portion 535*ex* is larger than the separation distance between the switch main body 531 and the drive board 550.

Each of the terminals 532 to 535 has a base end extension portion 536*a*, a tip end extension portion 536*b*, and an extension connection portion 536*c*. The base end extension portion 536*a* is a portion extending from the base end portion in each of the terminals 532 to 535. The base end extension portion 536*a* extends in the axial direction AD from the main body base end portion 531*c*. The tip end extension portion 536*b* is a portion extending from a tip end portion in each of the terminals 532 to 535. The tip end extension portion 536*b* extends in the axial direction AD along the base end extension portion 536*a* from the high voltage board 510 or the drive board 550. The tip end extension portion 536*b* is inserted through the through hole 515 or 555, and is fixed to the high voltage board 510 or the drive board 550. The extension connection portion 536*c* is a portion where the base end extension portion 536*a* and the tip end extension portion 536*b* are connected to each other in each of the terminals 532 to 535.

The drain terminal 532 and the source terminal 533 are each bent in a U shape as a whole. The drain terminal 532 and the source terminal 533 are each in a turn-back shape of extending from the switch main body 531 in a direction away from the high voltage board 510 in the axial direction AD and then extending in a direction approaching the high voltage board 510. In the drain terminal 532 and the source terminal 533, the base end extension portion 536*a* and the tip end extension portion 536*b* extend in the same direction from the extension connection portion 536*c*. The drain terminal 532 and the source terminal 533 have a U-turn shape of extending from the switch main body 531 and returning in a U turn.

The gate terminal 534 and the driver source terminal 535 are each bent in a Z shape as a whole. The gate terminal 534 and the driver source terminal 535 each extend in the axial direction AD from the switch main body 531 toward the drive board 550 as a whole including a portion extending in the radial direction RD. In the gate terminal 534 and the driver source terminal 535, the base end extension portion 536*a* and the tip end extension portion 536*b* extend in reverse directions from the extension connection portion 536*c*.

<Configuration Group D>

The arm switch unit 530 generates heat by energization and corresponds to a heat generation component. The smoothing capacitor portion 580 and the filter component 524 generates heat by energization similarly to the arm switch unit 530, and the heat generated by energization is less than that of the arm switch unit 530. That is, the heat generated by energization to the smoothing capacitor portion 580 and the heat generated by energization to the filter component 524 are less than the heat generated by energization to the arm switch unit 530. The smoothing capacitor portion 580 and the filter component 524 correspond to a minor heat component.

In the present embodiment, regarding an energization component such as the arm switch unit 530 that generates heat by energization, a fact that at least one of a heat generation amount and a controlled temperature is large is referred to as having a large amount of heat generated. For example, in an energization component, a temperature rise rate tends to increase as the heat generation amount increases. In addition, in the energization component, the higher the controlled temperature is, the higher high-temperature resistance is.

Since at least one of the heat generation amount and the controlled temperature of the arm switch unit 530 is larger than that of the smoothing capacitor portion 580 and the filter component 524, the heat generated by energization is more than that of the smoothing capacitor portion 580 and the filter component 524. For example, the heat generation amount of the arm switch unit 530 is larger than both the heat generation amount of the smoothing capacitor portion 580 and the heat generation amount of the filter component 524. The controlled temperature of the arm switch unit 530 is higher than the controlled temperature of the smoothing capacitor portion 580 and the controlled temperature of the filter component 524. The arm switch unit 530 is a component that generates most heat by energization among all components constituting the inverter device 80.

In the filter component 524, the heat generated by energization is less than that in the smoothing capacitor portion 580. That is, the heat generated by energization to the filter component 524 is less than the heat generated by energization to the smoothing capacitor portion 580. The smoothing capacitor portion 580 corresponds to a first minor heat component, and the filter component 524 corresponds to a second minor heat component.

Figure 26:
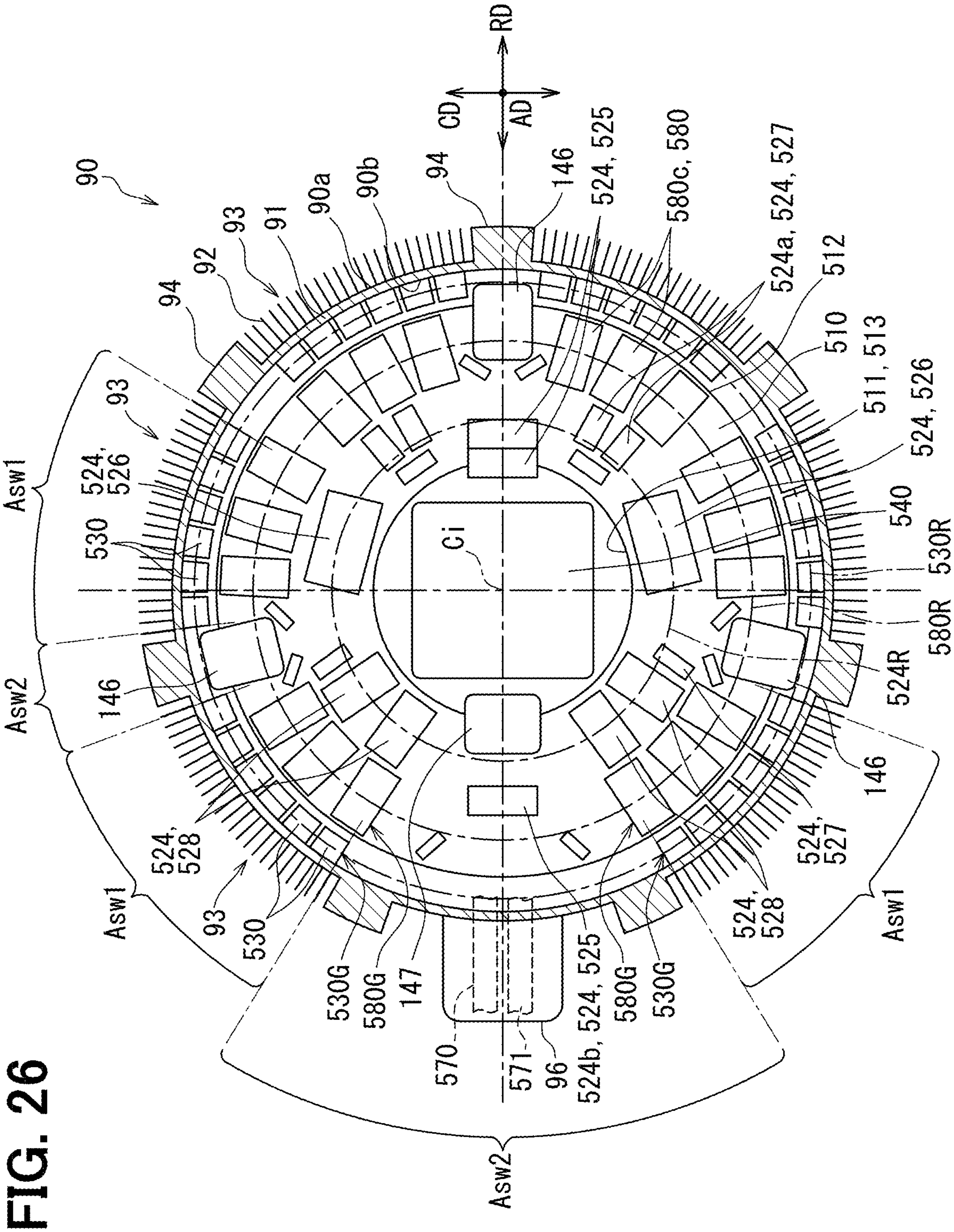
FIG. 26 is a top view of the inner portion of the inverter device in a configuration group D as viewed from the high voltage side.

As illustrated in FIG. 26, the inverter device 80 includes the capacitor row 580R, the filter row 524R, and the arm switch row 530R. Each of the rows 580R, 524R, and 530R extends in a ring shape in the circumferential direction CD. The arm switch row 530R is located at a position spaced to the radially outer side from the capacitor row 580R. The filter row 524R is located at a position spaced to the radially inner side from the capacitor row 580R. The capacitor row 580R is provided between the arm switch row 530R and the filter row 524R in the radial direction RD. In FIG. 26, the rows 580R, 524R, and 530R are represented by one-dot chain lines.

The arm switch row 530R includes multiple arm switch units 530. In the arm switch row 530R, the multiple arm switch units 530 are arranged in the circumferential direction CD. For example, the arm switch row 530R as one row extends in the circumferential direction CD. In the arm switch row 530R as one row, the arm switch units 530 are arranged one by one in the circumferential direction CD all over the circumferential direction CD. The arm switch row 530R extends along the inner peripheral surface 90*b* with respect to the inverter outer peripheral wall 91. The arm switch row 530R includes multiple switch groups 530G. The arm switch row 530R corresponds to a heat generation component row.

The arm switch row 530R has an annular shape as a whole. In the arm switch row 530R, a portion where the arm switch units 530 are arranged at equal intervals and a portion where the arm switch units 530 are not arranged at equal intervals coexist. In the arm switch row 530R, a separation distance between two arm switch units 530 adjacent to each other in the circumferential direction CD is not uniform in the circumferential direction CD. For example, a separation distance between two switch groups 530G adjacent to each other in the circumferential direction CD is larger than a separation distance between two arm switch units 530 adjacent to each other in the circumferential direction CD in one switch group 530G. In the arm switch row 530R, components such as the motor current sensor 146 which is not the arm switch unit 530 may enter between two arm switch units 530 adjacent to each other in the circumferential direction CD.

The capacitor row 580R includes multiple smoothing capacitor portions 580. In the capacitor row 580R, the multiple smoothing capacitor portions 580 are arranged in the circumferential direction CD. For example, the capacitor row 580R as one row extends in the circumferential direction CD. In the capacitor row 580R as one row, the smoothing capacitor portions 580 are arranged one by one in the circumferential direction CD all over the circumferential direction CD. The capacitor row 580R extends along the outer peripheral end 512 with respect to the high voltage board 510. The capacitor row 580R includes multiple capacitor groups 580G. The capacitor row 580R corresponds to a minor heat component row and a first component row.

The capacitor row 580R has an annular shape as a whole. In the capacitor row 580R, a portion where the smoothing capacitor portions 580 are arranged at equal intervals and a portion where the smoothing capacitor portions 580 are not arranged at equal intervals coexist. In the capacitor row 580R, a separation distance between two smoothing capacitor portions 580 adjacent to each other in the circumferential direction CD is not uniform in the circumferential direction CD. For example, a separation distance between two capacitor groups 580G adjacent to each other in the circumferential direction CD is larger than a separation distance between two smoothing capacitor portions 580 adjacent to each other in the circumferential direction CD in one capacitor group 580G. In the capacitor row 580R, components such as the motor current sensor 146 which is not the smoothing capacitor portion 580 may enter between two smoothing capacitor portions 580 adjacent to each other in the circumferential direction CD.

The filter row 524R includes multiple filter components 524. In the filter row 524R, the multiple filter components 524 are arranged in the circumferential direction CD. For example, the filter row 524R as one row extends in the circumferential direction CD. In the filter row 524R as one row, the filter components 524 are arranged one by one in the circumferential direction CD in at least a part of the row in the circumferential direction CD. The filter row 524R extends along the inner peripheral end 511 with respect to the high voltage board 510. The filter row 524R corresponds to a minor heat component row and a second component row.

The filter row 524R has an annular shape as a whole. In the filter row 524R, the filter components 524 are not arranged at equal intervals in the circumferential direction CD. In the filter row 524R, the common mode coil portion 525, the normal mode coil portion 526, the Y capacitor portion 527, and the X capacitor portion 528 are arranged in a mixed manner. In the filter row 524R, components such as the current sensor 147 which is not the filter component 524 may enter between two filter components 524 adjacent to each other in the circumferential direction CD.

The multiple smoothing capacitor portions 580 include a group alignment component 580*c*. The multiple filter components 524 include a group alignment component 524*a*. The group alignment components 580*c* and 524*a* are provided at positions aligned with the switch group 530G in the radial direction RD. In the group alignment components 580*c* and 524*a*, at least a part thereof are located at positions aligned with the switch group 530G in the radial direction RD. For example, among the multiple filter components 524, the filter component 524 located between two switch groups 530G adjacent to each other in the circumferential direction CD is not the group alignment component 580*c*. The switch group 530G corresponds to a heat generation group.

The group alignment components 580*c* and 524*a* are provided at projection positions so as to be projected on the arm switch unit 530 in the radial direction RD. The projection position is a position where at least a part of a projection surface obtained by projecting the group alignment components 580*c* and 524*a* toward the radially outer side overlaps the arm switch unit 530. The group alignment components 580*c* and 524*a* at the projection position and the arm switch unit 530, which projection surfaces of the group alignment components 580*c* and 524*a* overlap, are aligned in the radial direction RD.

The inverter device 80 includes a switch region Asw1 and an intermediate region Asw2. The switch region Asw1 is a region in which the switch group 530G is provided, and extends in the circumferential direction CD along the inner peripheral surface 90*b*. Multiple switch regions Asw1 are arranged in the circumferential direction CD along the circumferential direction CD. One switch region Asw1 is a region in which one switch group 530G is provided. In the switch region Asw1, multiple arm switches 86 in the switch group 530G are provided in a concentrated manner. The switch region Asw1 corresponds to a concentration region.

The intermediate region Asw2 is a region provided between two switch regions Asw1 adjacent to each other in the circumferential direction CD. The intermediate region Asw2 extends between two switch regions Asw1 adjacent to each other in the circumferential direction CD, and extends in the circumferential direction CD along the inner peripheral surface 90*b*. The intermediate region Asw2 is a region in which the switch group 530G is not provided, and is a region in which the arm switch unit 530 is not provided. Multiple intermediate regions Asw2 are arranged in the circumferential direction CD along the inner peripheral surface 90*b*. The switch region Asw1 and the intermediate region Asw2 are alternately arranged in the circumferential direction CD.

The inverter device 80 includes components and portions located at positions aligned with the switch region Asw1 in the radial direction RD. For example, the inverter fin group 93 and the group alignment components 580*c* and 524*a* are located at positions aligned with the switch region Asw1 in the radial direction RD. Further, the inverter device 80 includes components and portions located at positions aligned with the intermediate region Asw2 in the radial direction RD. For example, the flanges 94 and 95, the inverter connector 96, and a connector alignment component 524*b* are located at positions aligned with the intermediate region Asw2 in the radial direction RD.

The connector alignment component 524*b* is included in the multiple filter components 524. The connector alignment component 524*b* is provided at a position aligned with the inverter connector 96 in the radial direction RD. In the connector alignment component 524*b*, at least a part thereof is located at a position aligned with the inverter connector 96 in the radial direction RD. For example, among the multiple filter components 524, the group alignment component 524*a* is not the connector alignment component 524*b*.

The inverter connector 96 is a connector for electrically connecting the arm switch 86 to the battery 31. The battery 31 corresponds to an external device, and the inverter connector 96 corresponds to an external connector.

Figure 27:
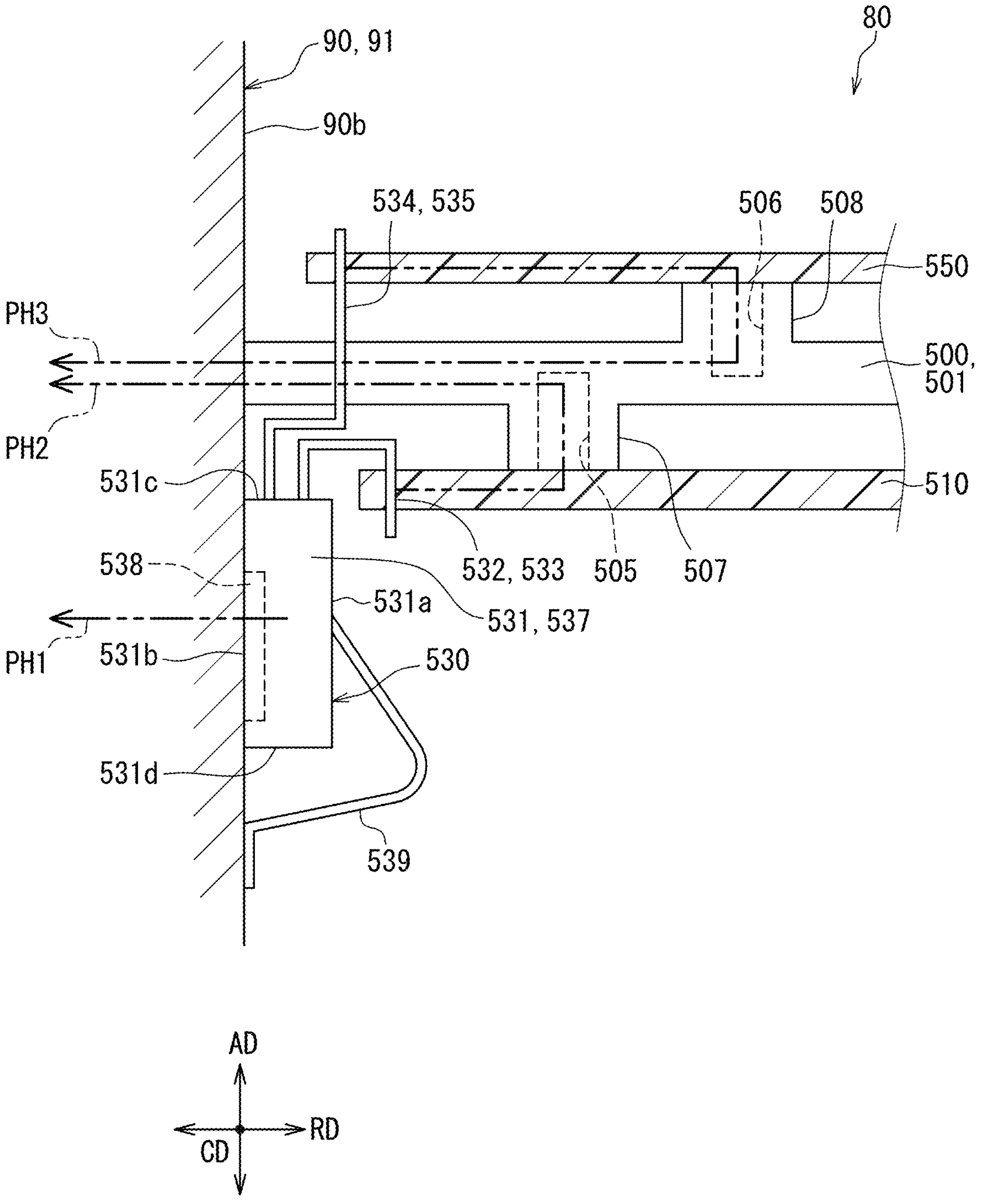
FIG. 27 is a schematic longitudinal sectional view for illustrating a heat dissipation path of the arm switch unit.

As illustrated in FIG. 27, the inverter device 80 includes a switch pressing portion 539. The switch pressing portion 539 presses the arm switch unit 530 toward the inverter outer peripheral wall 91. The switch pressing portion 539 is an elastically deformable member and is formed of an urging member such as a plate spring. The switch pressing portion 539 is fixed to the inverter outer peripheral wall 91 in an elastically deformed state, and is pressing the switch main body 531 on the inner peripheral surface 30*b* toward the radially outer side by a restoring force. In the switch pressing portion 539, for example, one end portion thereof is fixed to the inverter outer peripheral wall 91 by a fixing tool such as a bolt, and the other end portion thereof is caught on the first plate surface 531*a*.

The switch main body 531 is in contact with the inner peripheral surface 90*b* and is fixed to the inverter outer peripheral wall 91 by an adhesive or the like. The switch main body 531 may be in direct contact with the inner peripheral surface 90*b* or in indirect contact with the inner peripheral surface 90*b*. Regardless of the contact between the switch main body 531 and the inner peripheral surface 90*b* being direct or indirect, it is sufficient that heat is transferred between the switch main body 531 and the inner peripheral surface 90*b*. For example, as a configuration in which the switch main body 531 is in indirect contact with the inner peripheral surface 90*b*, there is a configuration in which the switch main body 531 is superimposed on the inner peripheral surface 90*b* via a heat conduction member. The heat conduction member is a member having thermal conductivity, and is, for example, gel, grease, or an adhesive. In the configuration, heat transfer between the switch main body 531 and the inverter outer peripheral wall 91 is performed via the heat conduction member.

While in contact with the inner peripheral surface 90*b*, the switch main body 531 is further pressed against the inner peripheral surface 90*b* by the switch pressing portion 539. In the switch main body 531, the second plate surface 531*b* easily comes into close contact with the inner peripheral surface 90*b* by a pressing force of the switch pressing portion 539. Therefore, heat of the switch main body 531 is easily transferred to a switch outer peripheral wall. The second plate surface 531*b* may be directly superimposed on the inner peripheral surface 90*b* or may be indirectly superimposed on the inner peripheral surface 90*b*. The switch main body 531 corresponds to a component main body, and the terminals 532 to 535 correspond to a component terminal.

The high voltage board 510 and the drive board 550 have thermal conductivity and are capable of transferring heat to the arm switch unit 530 and the component support portion 500. Since the terminals 532 to 535 are connected to the boards 510 and 550, the boards 510 and 550 and the arm switch unit 530 are capable of heat transfer. The heat transfer between the boards 510 and 550 and the component support portion 500 is performed via a contact portion where the boards 510 and 550 are in contact with the component support portion 500. The contact portion between the boards 510 and 550 and the component support portion 500 includes a high-voltage fixing portion 507 and a drive fixing portion 508. The high voltage board 510 and the drive board 550 correspond to a connection board, and the component support portion 500 corresponds to a board support portion.

The high-voltage fixing portion 507 is provided in the component support portion 500. The high-voltage fixing portion 507 is provided on at least one of the beam portion 501 and the beam coupling portion 502. The high voltage board 510 is fixed to the component support portion 500 while in contact with the high-voltage fixing portion 507. The high-voltage fixing portion 507 is, for example, a projection portion protruding from the beam portion 501 toward the high voltage side. The high-voltage fixing portion 507 is provided with the screw hole 505. The drain terminal 532 and the source terminal 533 are capable of transferring heat to the inverter outer peripheral wall 91 via the high voltage board 510 and the component support portion 500.

The drive fixing portion 508 is provided in the component support portion 500. The drive fixing portion 508 is provided on at least one of the beam portion 501 and the beam coupling portion 502. The drive board 550 is fixed to the component support portion 500 while in contact with the drive fixing portion 508. The drive fixing portion 508 is, for example, a projection portion protruding from the beam portion 501 toward the low voltage side. The drive fixing portion 508 is provided with the screw hole 506. The gate terminal 534 and the driver source terminal 535 are capable of transferring heat to the inverter outer peripheral wall 91 via the drive board 550 and the component support portion 500.

Figure 28:
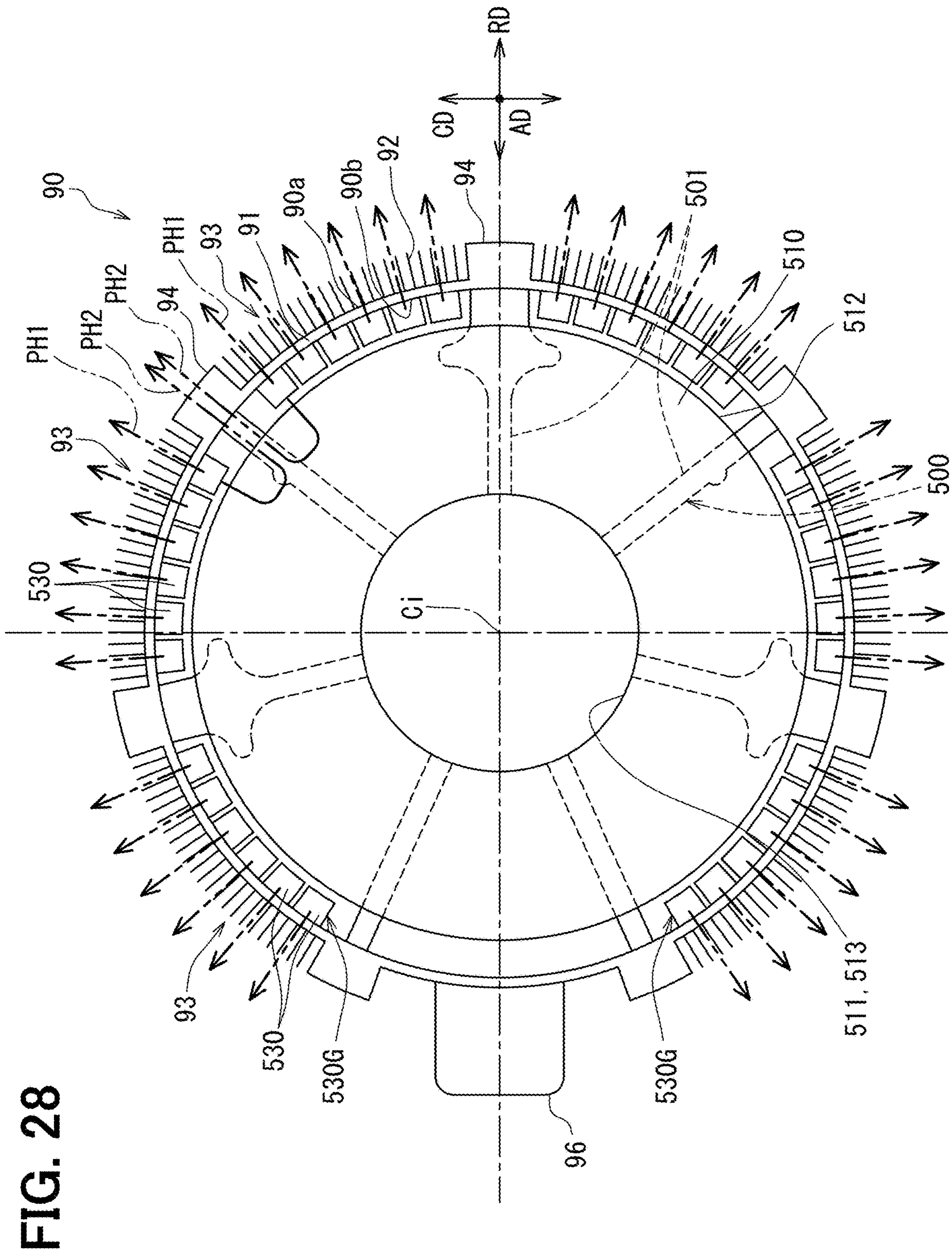
FIG. 28 is a schematic top view for illustrating the heat dissipation path of the arm switch unit.

As illustrated in FIGS. 27 and 28, a heat dissipation path for dissipating heat of the arm switch unit 530 to the outside of the inverter device 80 includes heat dissipation paths PH1 to PH3. The first heat dissipation path PH1 is a path for dissipating heat of the switch main body 531 from the inverter outer peripheral wall 91 to the outside. In the first heat dissipation path PH1, heat of the switch main body 531 is directly transferred to the inner peripheral surface 90*b*, and the heat is dissipated from the outer peripheral surface 90*a* to the outside via, for example, the inverter fin 92. The outer peripheral surface 90*a* corresponds to a heat dissipation surface that dissipates heat transferred to the inner peripheral surface 90*b* to the outside. The heat transferred through the first heat dissipation path PH1 is easily dissipated from a portion of the outer peripheral surface 90*a*, which is aligned with the switch region Asw1 in the radial direction RD. The outer peripheral surface 90*a* may be referred to as a heat dissipation end. In particular, the portion of the outer peripheral surface 90*a*, which is aligned with the switch region Asw1 in the radial direction RD, may be referred to as a first heat dissipation end.

In the arm switch row 530R, heat is dissipated from each of the multiple arm switch units 530 through the first heat dissipation path PH1. In this case, in the inverter device 80, as indicated by multiple first heat dissipation paths PH1 illustrated in FIG. 28, the heat of the multiple arm switch units 530 is dissipated radially toward the radially outer side from the outer peripheral surface 90*a*. Thus, the first heat dissipation paths PH1 corresponding to the multiple arm switch units 530 are less likely to overlap one another. That is, the heat of the multiple arm switch units 530 is easily dissipated to the outside through different paths.

The second heat dissipation path PH2 is a path for dissipating heat of the drain terminal 532 and the source terminal 533 from the inverter outer peripheral wall 91 to the outside via the high voltage board 510 and the component support portion 500. In the second heat dissipation path PH2, heat of the drain terminal 532 and the source terminal 533 is transferred to the high voltage board 510, and the heat is transferred to the inverter outer peripheral wall 91 via the component support portion 500 and dissipated to the outside from the outer peripheral surface 90*a*. The heat transferred through the second heat dissipation path PH2 is easily dissipated from a portion of the outer peripheral surface 90*a*, which is aligned with the intermediate region Asw2 in the radial direction RD. The portion of the outer peripheral surface 90*a*, which is aligned with the intermediate region Asw2 in the radial direction RD, may be referred to as a second heat dissipation end.

The third heat dissipation path PH3 is a path for dissipating heat of the gate terminal 534 and the driver source terminal 535 from the inverter outer peripheral wall 91 to the outside via the drive board 550 and the component support portion 500. In the third heat dissipation path PH3, heat of the gate terminal 534 and the driver source terminal 535 is transferred to the drive board 550, and the heat is transferred to the inverter outer peripheral wall 91 via the component support portion 500 and dissipated to the outside from the outer peripheral surface 90*a*. The heat transferred through the third heat dissipation path PH3 is easily dissipated from a portion of the outer peripheral surface 90*a*, which is aligned with the intermediate region Asw2 in the radial direction RD.

<Configuration Group A>

According to the present embodiment described above, mounted components of the inverter device 80 are fixed to the beam portion 501 via plate members, that is, the high voltage board 510 and the drive board 550. In the configuration, the multiple beam portions 501, the high voltage board 510, and the drive board 550 mutually regulate stress applied in XYZ directions. That is, a structure in which the plate members, on which the mounted components are placed, sandwiches and are fixed to the multiple lightweight beam portions is shaped having a lightweight and high strength resistant to vibrations. As described above, even if vibrations are transmitted from the inverter outer peripheral wall 91 to the beam portion 501, a violent vibration of the mounted components is restricted and vibration resistance of the inverter device 80 can be enhanced.

In the EPU 50, the inverter outer peripheral wall 91 and the motor outer peripheral wall 71, which has relatively less vibrations in the motor device 60, are mutually fixed to each other by the high-voltage side flange 94 or the like. That is, in order to support the rotor 300 of the motor device 60, the inverter device 80 is coupled not to the rear end plate 62 having violent vibrations but to the motor outer peripheral wall 71 holding the stator 200 and having less vibrations. Therefore, the influence of the vibrations on the inverter device 80 can be reduced. Further, since the mounted components of the inverter device 80 are fixed to the beam portion 501 via the plate members, that is, the high voltage board 510 and the drive board 550, the vibration resistance of the inverter device 80 can be enhanced as described above. Further, when the cooling of the rear end plate 62 of the motor device 60 is not sufficient, the rear end plate 62 has a high temperature. But since an air layer is present between the rear end plate 62 and the mounted components of the inverter device 80, thermal damage to the mounted components can be prevented.

According to the present embodiment, the high voltage board 510 is provided on one side of the beam portion 501 in the axial direction AD, and the drive board 550 is provided on a side opposite to the high voltage board 510 with the beam portion 501 interposed therebetween. In the configuration, two plate members that are the high voltage board 510 and the drive board 550 regulate, from one side and the other side in the axial direction AD, the individual vibrations of the multiple beam portions 501. Therefore, a configuration in which the beam portion 501 is less likely to vibrate can be implemented with the high voltage board 510 and the drive board 550.

In the inverter device 80, a sandwich structure is formed by the multiple beam portions 501, the high voltage board 510, and the drive board 550. In this way, since a support structure supporting the mounted components has a sandwich structure, the strength of the support structure can be increased. Therefore, the effect of restricting the vibrations of the mounted components can be further enhanced by the sandwich structure. Moreover, weight reduction of the support structure can be achieved by the sandwich structure.

According to the present embodiment, the plate members that regulate the vibrations of the beam portion 501 are the high voltage board 510 and the drive board 550. In the configuration, it is not necessary to use a dedicated plate member for regulating the vibrations of the beam portion 501. For example, differently from the present embodiment, in a configuration in which a dedicated plate member extends over and is fixed to the multiple beam portions 501, there is a concern that the electrical wiring and wiring work for energizing the mounted components become complicated. On the other hand, in the present embodiment, both simplification of the electrical wiring and regulation of the vibrations of the beam portion 501 can be achieved by the high voltage board 510 and the drive board 550. In addition, by using multilayer wiring on the high voltage board 510 and the drive board 550, electrical characteristics of the inverter device 80 can be improved.

In the present embodiment, the beam portion 501 located between the high voltage board 510 and the drive board 550 is grounded to the ground earth. In the configuration, the beam portion 501 restricts an electromagnetic field, which is generated accompanying energization of a high-voltage component such as the high voltage board 510, from applying to a low-voltage component such as the drive board 550. In this way, since the influence of the electromagnetic field generated due to the high-voltage component is reduced by the beam portion 501, the inverter device 80 resistant to noise can be implemented. The grounding path grounded to the ground earth is formed including the beam portion 501. Therefore, it is not necessary to use a dedicated grounding wire for grounding the high-voltage component, the low-voltage component and the like to the ground earth. Accordingly, the ground earth is set on a surface layer or an inner layer of the high voltage board 510 and the drive board 550, and the ground earth is electrically connected to the multiple beam portions 501. Thus, noise from the high-voltage component, the low-voltage component and the like can be easily grounded to the ground earth at a low impedance.

According to the present embodiment, the multiple arm switch units 530 are fixed to the inner peripheral surface 90*b* of the inverter outer peripheral wall 91, and are arranged in the circumferential direction CD along the inner peripheral surface 90*b*. In the configuration, when the arm switch unit 530 generates heat as the inverter device 80 is driven, the heat is easily dissipated to the outside via the inverter outer peripheral wall 91. Therefore, it is possible to restrict the temperature of the arm switch unit 530 from becoming excessively high and the heat of the arm switch unit 530 from accumulating inside the inverter housing 90. Accordingly, it is possible to give priority to reducing the vibrations of the mounted components among energization components, and to give priority to the heat dissipation of the arm switch units 530 among the energization components. Accordingly, both the enhancement in the vibration resistance of the inverter device 80 and the improvement in the heat dissipation performance of the inverter device 80 can be achieved.

Further, the multiple arm switch units 530 are arranged along the outer peripheral end 512 with respect to the high voltage board 510 and the control board 560. In the configuration, separation distances between the arm switch unit 530 and the high voltage board 510 and the drive board 550 in the radial direction RD can be made uniform by the multiple arm switch units 530. Therefore, it is possible to restrict lengths of the terminals 532 to 535 extending from the arm switch unit 530 toward the boards 510 and 550 from varying excessively at the multiple arm switch units 530. Further, by connecting the multiple arm switch units 530 in parallel, it is possible to reduce the inductance and reduce thermal resistance due to heat source dispersion. In addition, by connecting the arm switch units 530 in parallel, the effect of a heat spreader in the inverter outer peripheral wall 91 located between the arm switch unit 530 and the inverter fin 92 can be reduced. Thus, the cooling effect can be improved and the inverter outer peripheral wall 91 can be made thin and lightweight.

According to the present embodiment, the beam portion 501 extends toward the radially inner side from the inverter outer peripheral wall 91 between two switch groups 530G adjacent to each other in the circumferential direction CD. In the configuration, the beam portion 501 can be disposed at a position that does not interfere with the arm switch unit 530.

According to the present embodiment, the switch main body 531 of the arm switch unit 530 is provided at a position spaced apart from the beam portion 501, the high voltage board 510, and the drive board 550. In the configuration, heat generated in the switch main body 531 is easily transferred directly to the inverter outer peripheral wall 91 without transmitting through the beam portion 501, the high voltage board 510, or the drive board 550. Therefore, a temperature rise of the beam portion 501, the high voltage board 510, and the drive board 550 due to the heat of the switch main body 531 can be restricted.

According to the present embodiment, the arm switch unit 530 is provided at a position aligned with the inverter fin 92 in the radial direction RD. In the configuration, on the outer peripheral surface 90*a* formed by the inverter outer peripheral wall 91, the inverter fin 92 is located at a position closest to the arm switch unit 530. Therefore, the inverter fin 92 can be provided at a position where the heat dissipation effect of the arm switch unit 530 is best.

According to the present embodiment, the multiple beam portions 501 are coupled to one another by the beam coupling portion 502. In the configuration, the individual vibrations of the multiple beam portions 501 can be restricted by the beam coupling portion 502. Therefore, the strength of the structure including the high voltage board

510, the drive board 550, and the multiple beam portions 501 is increased, and the vibrations transmitted to the mounted components can be reduced.

According to the present embodiment, the high voltage board 510 and the drive board 550 are open at the inner side of the beam coupling portion 502, presenting a donut shape. A weight around the center is light. Therefore, it is possible to implement a configuration in which the beam portion 501 and the beam coupling portion 502 are less likely to resonate with the vibrations from the motor device 60 or the like due to a high resonance frequency of the beam portion 501 and the beam coupling portion 502. Accordingly, the strength of the inverter housing 90 against vibrations can be increased.

According to the present embodiment, the beam portion 501 and the inverter outer peripheral wall 91 can transfer heat. Therefore, even if heat is generated in the energization components such as the smoothing capacitor portion 580 and the high voltage board 510, the heat is easily dissipated to the outside from the beam portion 501 via the inverter outer peripheral wall 91. A connection portion between the beam portion 501 and the inverter outer peripheral wall 91 is not mounted with the arm switch unit 530 and thus is lower in temperature than the arm switch unit 530, and the heat dissipation performance can be improved.

According to the present embodiment, the beam portion 501 and the inverter outer peripheral wall 91 are electrically connected. Therefore, the filter component 524, the high voltage board 510, and the like can be grounded to the ground earth via the conduction path including the beam portion 501 and the inverter outer peripheral wall 91. Accordingly, the EMC performance of the inverter device 80 can be improved by the beam portion 501. In addition, it is possible to simplify a configuration in which the filter component 524, the high voltage board 510, and the like are grounded to the ground earth, and it is also easy to dispose a component involving electrical safety, such as the varistor 155.

According to the present embodiment, the heat insulating portion 545 is provided between the high voltage board 510 and the rear end plate 62 and extends along the rear end plate 62. In the configuration, the heat insulating portion 545 is provided between the mounted components of the inverter device 80 having a low heat resistant temperature and the rear end plate 62. Therefore, even if the rear end plate 62 has a high temperature due to heat of the stator 200 or the like in the motor device 60, it is possible to prevent thermal damage to the inverter device 80.

<Configuration Group B>

According to the present embodiment, the upper arm switch unit 530A and the lower arm switch unit 530B are connected to the output busbar 603 at positions spaced apart in the circumferential direction CD. In the configuration, a separation distance between the upper arm switch unit 530A and the lower arm switch unit 530B can be changed. Therefore, for example, as compared with a configuration in which the upper arm switch unit 530A and the lower arm switch unit 530B are integrated, the degree of freedom in arranging the arm switch units 530A and 530B can be increased.

Moreover, in the overlap region AO, the P currents IpA and IpB flowing through the P busbar 601 and the N currents InA and InB flowing through the N busbar 602 flow in a reverse direction in the circumferential direction CD with respect to the output currents IoA and IoB flowing through the output busbar 603. In the configuration, a magnetic field produced by the P currents IpA and IpB, a magnetic field produced by the N currents InA and InB, and a magnetic field produced by the output currents IoA and IoB easily cancel each other out. Therefore, the inductances L601 to L603 parasitic on the busbars 601 to 603 are easily reduced. Accordingly, it is possible to restrict the operation accuracy of the upper arm switch unit 530A and the lower arm switch unit 530B from deteriorating.

As described above, both the increase in the degree of freedom in arranging the arm switch units 530A and 530B and the increase in the operation accuracy of the inverter device 80 can be achieved.

According to the present embodiment, multiple upper arm switch units 530A included in one phase are connected in parallel to the P busbar 601 and the output busbar 603. Multiple lower arm switch units 530B included in one phase are connected in parallel to the N busbar 602 and the output busbar 603. In the configuration, it is easy to arrange the multiple upper arm switch units 530A and the multiple lower arm switch units 530B in the circumferential direction CD along the busbars 601 to 603.

The upper arm switch unit 530A and the lower arm switch unit 530B have the driver source terminal 535 different from the source terminal 533. When the multiple arm switch units 530A and 530B having the driver source terminal 535 are connected in parallel, there is a concern that a current imbalance occurs due to the inductances L601 to L603 parasitic on the busbars 601 to 603. On the other hand, according to the present embodiment, the flows of the currents IpA, IpB, InA, InB, IoA, and IoB are set in the busbars 601 to 603 such that the inductances L601 to L603 are reduced. Therefore, the current imbalance can be restricted by reducing the inductances L601 to L603. Accordingly, a variation in the degree of deterioration between the multiple arm switch units 530A and 530B connected in parallel to each other can be restricted.

In the present embodiment, the multiple upper arm switch units 530A included in one phase and the multiple lower arm switch units 530B included in one phase are arranged in the circumferential direction CD along the busbars 601 to 603. In the configuration, the busbars 601 to 603 extend easily in an elongated shape in the circumferential direction CD in accordance with ranges in which the multiple arm switch units 530A and 530B are arranged. When the busbars 601 to 603 are long as described above, there is a concern that the inductances L601 to L603 parasitic on the busbars 601 to 603 increase.

On the other hand, in the present embodiment, the flows of the currents IpA, IpB, InA, InB, IoA, and IoB are set such that the inductances L601 to L603 are reduced. Therefore, even when the busbars 601 to 603 extend in an elongated shape in the circumferential direction CD, the inductances L601 to L603 parasitic on the busbars 601 to 603 can be reduced.

According to the present embodiment, the multiple arm switch units 530A and 530B included in one phase are arranged in the circumferential direction CD along the inner peripheral surface 90*b*. In the configuration, heat of each of the multiple arm switch units 530A and 530B is easily transferred to the inverter outer peripheral wall 91. Therefore, it is possible to restrict the temperature of the arm switch units 530A and 530B from becoming excessively high and the heat of one arm switch unit 530A or 530B from being applied to the other arm switch units 530A or 530B. Accordingly, with the arrangement of the arm switch units 530A and 530B, the heat dissipation effect of the inverter device 80 can be enhanced. As described above, both the reduction in the parasitic inductance and the improvement in the heat dissipation effect can be achieved in the inverter device 80.

Moreover, since the busbars 601 to 603 extend in the circumferential direction CD along the inner peripheral surface 90*b*, the multiple arm switch units 530A and 530B are arranged in the circumferential direction CD along the busbars 601 to 603. In the configuration, the energization path connecting the upper arm switch unit 530A to the P busbar 601 and the output busbar 603 can be made as short as possible in the radial direction RD. In this way, by shortening the energization path leading to the upper arm switch unit 530A, the parasitic inductance generated in the energization path can be reduced as much as possible. Similarly, the energization path connecting the lower arm switch unit 530B to the N busbar 602 and the output busbar 603 can be made as short as possible in the radial direction RD. In this way, by shortening the energization path leading to the lower arm switch unit 530B, the parasitic inductance generated in the energization path can be reduced as much as possible.

According to the present embodiment, the arm switch units 530A and 530B are provided on the inner peripheral surface 90*b* at positions spaced to the radially outer side from the busbars 601 to 603. In the configuration, the heat of the arm switch units 530A and 530B is directly transferred to the inner peripheral surface 90*b*. Therefore, the heat dissipation effect of the arm switch units 530A and 530B can be enhanced by inverter outer peripheral wall 91. Accordingly, in the inverter device 80, it is possible to achieve both the improvement in the electrical characteristics, which refers to the reduction in the parasitic inductance, and the improvement in the heat dissipation performance.

According to the present embodiment, in one of the upper capacitor portion 580A and the lower capacitor portion 580B, the P capacitor terminal 582 is located at the radially outer side of the N capacitor terminal 583, and in the other, the N capacitor terminal 583 is located at the radially outer side of the P capacitor terminal 582. In the configuration, the distance over which one of the upper P current IpA and the lower P current IpB flows in the radial direction RD in the P busbar 601 is shorter than the distance over which the other flows in the radial direction RD. Similarly, the distance over which one of the upper N current InA and the lower N current InB flows in the radial direction RD in the N busbar 602 is shorter than the distance over which the other flows in the radial direction RD. Therefore, it is possible to restrict an excessive increase in a difference between a total distance of the distances over which the P currents IpA and IpB flow in the radial direction RD in the P busbar 601 and a total distance of the distances over which the N currents InA and InB flow in the radial direction RD in the N busbar 602.

As described above, when the total distance in the P busbar 601 and the total distance in the N busbar 602 are equalized, the inductance L601 parasitic on the P busbar 601 and the inductance L602 parasitic on the N busbar 602 are easily equalized. Accordingly, it is possible to restrict the P currents IpA and IpB from flowing out from the P busbar 601 and the N currents InA and InB flowing out from the N busbar 602. For example, it can be restricted that the P currents IpA and IpB and the N currents InA and InB flowing through the P busbar 601 and the N busbar 602 as a normal mode current flow out to the earth busbar 604 and become a common mode current. That is, it is possible to restrict an occurrence of current mode conversion in the busbars 601 to 604.

For example, differently from the present embodiment, a configuration is assumed in which a positional relationship between the P capacitor terminal 582 and the N capacitor terminal 583 is the same between the upper capacitor portion 580A and the lower capacitor portion 580B. In the configuration, a distance over which the upper P current IpA flows in the circumferential direction CD and a distance over which the lower P current IpB flows in the circumferential direction CD are longer or shorter than a distance over which the upper N current InA flows in the circumferential direction CD and a distance over which the lower N current InB flows in the circumferential direction CD. Therefore, a difference between a total distance in the P busbar 601 and a total distance in the N busbar 602 tends to increase. In this case, since a difference between the inductance L601 parasitic on the P busbar 601 and the inductance L602 parasitic on the N busbar 602 increases, the current mode conversion may occur.

According to the present embodiment, the overlap region AO extends in the circumferential direction CD so as to extend from the farthest upper component 530Af provided in the upper switch group 530GA to the farthest lower component 530Bf provided in the lower switch group 530GB. In the configuration, the overlap region AO can be extended as long as possible in the circumferential direction CD. Therefore, a range in which the P currents IpA and IpB and the N currents InA and InB and the output currents IoA and IoB flow to overlap each other easily spreads in the circumferential direction CD. That is, a range in which magnetic flux occurring due to the P currents IpA and IpB and magnetic flux occurring due to the N currents InA and InB and magnetic flux occurring due to the output currents IoA and IoB cancel each other out spread easily in the circumferential direction CD. Accordingly, a range in which the parasitic inductance is reduced by the cancellation of the magnetic flux can be spread in the circumferential direction CD. As a result, the parasitic inductance can be reduced in the entire busbars 601 to 603.

According to the present embodiment, the multiple upper capacitor portions 580A and the multiple lower capacitor portions 580B are arranged in the circumferential direction CD. In the configuration, heat generated from the multiple upper capacitor portions 580A is easily dispersed. Therefore, the heat dissipation effect of the inverter device 80 can be enhanced with the arrangement of the capacitor portions 580A and 580B.

Moreover, the overlap region AO extends in the circumferential direction CD so as to extend from the upper capacitor group 580GA to the lower capacitor group 580GB. Therefore, a range in which the P currents IpA and IpB flowing from the capacitor groups 580GA and 580GB toward the upper switch group 530GA in the P busbar 601 and the output currents IoA and IoB flowing through the output busbar 603 overlap can be expanded as much as possible in the circumferential direction CD. Similarly, a range in which the N currents InA and InB flowing from the lower switch group 530GB toward the capacitor groups 580GA and 580GB in the N busbar 602 and the output currents IoA and IoB flowing through the output busbar 603 overlap can be expanded as much as possible in the circumferential direction CD. Accordingly, a range in which the parasitic inductance can be reduced by the flows of the currents IpA, IpB, InA, InB, IoA, and IoB in the busbars 601 to 603 can be made as wide as possible.

According to the present embodiment, the busbars 601 to 603 are stacked such that their respective plate surfaces face one another. In the configuration, the busbars 601 to 603 can be arranged at positions as close as possible to one another. Therefore, it is possible to implement a configuration in which the magnetic field produced by the P currents IpA and IpB and the N currents InA and InB and the magnetic field produced by the output currents IoA and IoB easily cancel each other out.

According to the present embodiment, the output busbar 603 is provided between the P busbar 601 and the N busbar 602. In the configuration, with the P busbar 601 and the N busbar 602, it is possible to restrict emission of radiation noise due to, for example, electrostatic induction occurring due to a potential variation accompanying power conversion in the output busbar 603. Moreover, in the P busbar 601 and the N busbar 602, since the potential variation is relatively small, the radiation noise caused by electrostatic induction or the like is less likely to be emitted. Accordingly, it is effective to shield radiation noise of the output busbar 603 by the P busbars 601 and N602 that are less likely to emit radiation noise. As described above, the EMC performance of the inverter device 80 can be improved by the arrangement of the busbars 601 to 603.

According to the present embodiment, the earth busbar 604 is provided at the outermost position in the busbars 601 to 604. Therefore, it is possible to restrict, by the earth busbar 604, the emission of radiation noise caused by electrostatic induction or the like from the P busbar 601, the N busbar 602, and the output busbar 603.

The earth busbar 604 is stacked on the P busbar 601, the N busbar 602, and the output busbar 603. In the configuration, a component connected to the P busbar 601, the N busbar 602, and the output busbar 603 can be disposed at a position close to the earth busbar 604. Therefore, a connection path between the component and the earth busbar 604 can be shortened. For example, the Y capacitor portion 527 can be connected to the earth busbar 604 so that an ESL is reduced. The ESL stands for equivalent series inductance.

Further, since the earth busbar 604 extends along the plate surface of the high voltage board 510, the Y capacitor portion 527 at any position on the high voltage board 510 can be connected to the earth busbar 604. Therefore, the degree of freedom relating to an installation position of the Y capacitor part 527 can be increased. In addition, the earth busbar 604 is electrically connected to the component support portion 500 via multiple fixing tools for fixing the high voltage board 510 to the component support portion 500. Therefore, a parasitic impedance of a grounding path including the earth busbar 604 can be reduced. Accordingly, both the improvement in the EMC performance by the earth busbar 604 and the improvement in a protection effect of protecting the inverter device 80 from a surge by the earth busbar 604 can be achieved.

According to the present embodiment, multiple P busbars 601, multiple N busbars 602, and multiple output busbars 603 are provided. Therefore, since the magnetic fields based on the currents IpA, IpB, InA, InB, IoA, and IoB are produced in each of the busbars 601 to 603, a configuration in which the magnetic fields easily cancel each other out can be implemented.

The P busbar 601 and the N busbar 602 extend in a ring shape in the circumferential direction CD. In the configuration, since the P busbar 601 and the N busbar 602 extend along the outer peripheral end 512 in the high voltage board 510, a closed circuit can be formed by the P line 141 and the N line 142. Thus, when the P line 141 and the N line 142 form closed circuits, a parasitic inductance generated between the upper arm 84 and the lower arm 85 can be reduced easily. Therefore, a loss caused in the P line 141 and the N line 142 can be reduced.

According to the present embodiment, the output currents IoA and IoB flowing in the overlap region AO are currents flowing between the upper arm switch unit 530A and the lower arm switch unit 530B that form one upper and lower arm circuit 83. Therefore, the parasitic inductance generated in one upper and lower arm circuit 83 can be reduced by the flows of the currents IpA, IpB, InA, InB, IoA, and IoB.

According to the present embodiment, the upper source terminal 533A and the lower drain terminal 532B are connected to the output busbar 603 at positions spaced apart in the circumferential direction CD. In the configuration, a separation distance between the upper source terminal 533A and the lower drain terminal 532B can be changed. Therefore, the degree of freedom in arranging the upper arm switch unit 530A having the upper source terminal 533A and the lower arm switch unit 530B having the lower drain terminal 532B can be increased.

Moreover, between the upper source terminal 533A and the lower drain terminal 532B in the circumferential direction CD, at least one of the upper drain terminal 532A and the P capacitor terminal 582 and at least one of the lower source terminal 533B and the lower capacitor terminal 533B are provided. In the configuration, between the upper source terminal 533A and the lower drain terminal 532B in the circumferential direction CD, the P currents IpA and IpB flow in a reverse direction to the output currents IoA and IoB. In addition, between the upper source terminal 533A and the lower drain terminal 532B in the circumferential direction CD, the N currents InA and InB flow in a reverse direction to the output currents IoA and IoB. Accordingly, the magnetic fields produced by the output currents IoA and IoB and the magnetic fields produced by the P currents IpA and IpB and the N currents InA and InB cancel each other out, and thus the inductances L601 to L603 parasitic on the busbars 601 to 603 can be reduced.

<Configuration Group C>

According to the present embodiment, the multiple arm switch units 530 are arranged in the circumferential direction CD along the outer peripheral ends 512 and 552 with respect to the high voltage board 510 and the drive board 550. In the configuration, positions of the multiple arm switch units 530 are aligned in the axial direction AD and the radial direction RD. Therefore, it is unlikely that a positional relationship between the arm switch unit 530 and the high voltage board 510 and the drive board 550 varies among the multiple arm switch units 530. For example, the separation distance between the switch main body 531 and the high voltage board 510 in the radial direction RD is likely to be the same for each of the multiple arm switch units 530. Similarly, the separation distance between the switch main body 531 and the drive board 550 in the radial direction RD is likely to be the same for each of the multiple arm switch units 530.

Accordingly, it is unlikely that the switching accuracy varies among the multiple arm switch units 530, for example, due to a variation in the parasitic inductance generated in the energization path including the terminals 532 to 533 among the multiple arm switch units 530. For example, it is unlikely that a switching timing, at which the arm switch 86 is opened and closed, varies between the upper arm 84 and the lower arm 85 and varies among multiple upper and lower arm circuits 83. As described, the operation accuracy of the arm switch 86 is restricted from deteriorating, and thus it is possible to improve the operation accuracy of the inverter device 80.

As described above, the positions of the multiple arm switch units 530 are aligned in the axial direction AD and the radial direction RD. Therefore, the separation distances between the switch main body 531 and the boards 510 and 550 are easily equalized by the multiple arm switch units 530. Accordingly, it is possible to restrict the separation distances between the switch main body 531 and the boards 510 and 550 from being excessively large. In other words, a wiring length between the switch main body 531 and the boards 510 and 550 can be reduced. The wiring length is, for example, the length of the exposed portions 532*ex* to 535*ex*. When the wiring length is reduced, the parasitic inductance generated in the wiring is reduced. In the wiring, a surge voltage can be reduced by reducing the parasitic inductance. Since a switching speed of the arm switch 86 can be increased by the amount of decrease in the surge voltage, the loss can be reduced.

In the inverter device 80 in which the multiple arm switches 86 are connected in parallel, a phenomenon in which the gate voltage Vg oscillates may occur. When a balance of the current flowing through the arm switch 86 is broken by the multiple arm switches 86 connected in parallel, the gate voltage Vg is likely to be resonated. In addition, as the switching speed of the arm switch 86 increases, the resonation of the gate voltage Vg is more likely to increase. On the other hand, as the parasitic inductance of the wiring decreases, the gate voltage Vg is more unlikely to oscillate, and thus the switching speed of the arm switch 86 can be increased. Accordingly, by reducing the parasitic inductance generated in the wiring, the switching speed of the arm switch 86 can be increased and the loss can be reduced.

In the inverter device 80, as an applied voltage from the battery 31 increases, a loss due to the parasitic inductance is more likely to occur. Further, as the switching speed of the arm switch 86 increases, the loss due to the parasitic inductance is more likely to occur. Therefore, even if at least one of a high voltage and a high-speed switching of the inverter device 80 is adopted, since the multiple arm switch units 530 are arranged in the circumferential direction CD along the outer peripheral ends 512 and 552, the loss due to the parasitic inductance can be reduced.

According to the present embodiment, the switch main body 531 is provided at a position closer to the high voltage board 510 than to the drive board 550. Therefore, it is easy to implement a configuration in which the drain terminal 532 and the source terminal 533 are shorter than the gate terminal 534 and the driver source terminal 535. By shortening a power terminal such as the drain terminal 532 and the source terminal 533 as described above, it is possible to reduce the parasitic inductance caused by the power terminal. Therefore, the loss caused by the power terminal can be reduced.

According to the present embodiment, the drain exposed portion 532*ex* and source exposed portion 533*ex* are shorter than the gate exposed portion 534*ex* and the drain exposed portion 532*ex*. Therefore, it is possible to reduce the parasitic inductance caused by a power connecting portion such as the drain exposed portion 532*ex* and the source exposed portion 533*ex*. As described, by reducing the parasitic inductance of the wiring by shortening the length of the power connecting portion, the switching speed of the arm switch 86 can be increased and the loss can be reduced.

According to the present embodiment, the drain terminal 532 and the source terminal 533 are each in a turn-back shape. In the configuration, at two turned portions in each of the drain terminal 532 and the source terminal 533, magnetic fields generated by energization cancel each other out. Therefore, the parasitic inductances generated in the drain terminal 532 and the source terminal 533 can be reduced. For example, in the drain terminal 532 and the source terminal 533, a direction of the current flowing through the base end extension portion 536*a* is opposite to a direction of the current flowing through the tip end extension portion 536*b*. Therefore, the magnetic flux occurring due to the current flowing through the base end extension portion 536*a* and the magnetic flux occurring due to the current flowing through the tip end extension portion 536*b* cancel each other out. Accordingly, the parasitic inductances generated in the base end extension portion 536*a* and the tip end extension portion 536*b* can be reduced.

According to the present embodiment, since connection objects of the terminals 532 to 535 are the boards 510 and 550, a connection structure between the terminals 532 to 535 and the boards 510 and 550 can be simplified. Further, since the boards 510 and 550 are plate-shaped, the multiple arm switch units 530 can be easily arranged in the circumferential direction CD along the outer peripheral ends 512 and 552.

According to the present embodiment, the drain terminal 532 and the source terminal 533 are provided at positions spaced from the board intermediate line Cmid toward the high voltage board 510. In the configuration, the drain terminal 532 and the source terminal 533 can be spaced apart from the drive board 550 as much as possible. Therefore, it is possible to restrict the generation of noise or the like on the drive board 550 due to the current flowing through the drain terminal 532 and the source terminal 533. Accordingly, the operation accuracy of the drive board 550 can be improved.

According to the present embodiment, the high voltage board 510 includes a power busbar such as the P busbar 601, the N busbar 602, and the output busbar 603. Therefore, a configuration in which the power terminal, such as the drain terminal 532 and the source terminal 533, is electrically connected to the power busbar can be implemented by simply connecting the power terminal to the high voltage board 510. Accordingly, it is possible to simplify the configuration of connecting the power terminal and the power busbar.

According to the present embodiment, each of the outer peripheral ends 512 and 552 and the arm switch row 530R extends in a ring shape in the circumferential direction CD. Therefore, at any position in the circumferential direction CD, the terminals 532 to 535 can be connected to the high voltage board 510 and the drive board 550 by extending the terminals 532 to 535 from the arm switch unit 530 in the radial direction RD. Accordingly, a variation in the length dimension of the terminals 532 to 535 can be restricted all over the entire circumferential direction CD.

Moreover, since the arm switch row 530R extends in a ring shape in the circumferential direction CD, the heat of the multiple arm switch units 530 in the arm switch row 530R can be dissipated to the radially outer side all over the circumferential direction CD. Therefore, it is possible to restrict the heat generated from the arm switch unit 530 from accumulating in a part of the inverter outer peripheral wall 91 and a part inside the inverter housing 90.

According to the present embodiment, the switch main body 531 is provided on the inner peripheral surface 90*b*. In the configuration, it is not necessary to mount the switch main body 531 on the high voltage board 510 or the drive board 550. Therefore, it is possible to downsize the high voltage board 510 and the drive board 550 by a volume of the switch main body 531 not mounted thereon. That is, a board area can be reduced in the high voltage board 510 and the drive board 550. By downsizing the high voltage board 510 and the drive board 550 in the radial direction RD in this way, an inner diameter of the inverter housing 90 can be reduced. That is, the inverter housing 90 and the inverter device 80 can be downsized.

Further, since the switch main body 531 is provided on the inner peripheral surface 90*b*, the heat of the switch main body 531 is easily transferred to the inner peripheral surface 90*b*. Therefore, the heat dissipation effect of the switch main body 531 can be enhanced by the inverter outer peripheral wall 91.

According to the present embodiment, in the switch main body 531, heat dissipated from the second plate surface 531*b* is more than heat dissipated from the first plate surface 531*a*. In the configuration, since heat dissipated toward the radially inner side from the first plate surface 531*a* is reduced, heat is less likely to accumulate inside the inverter housing 90. Moreover, heat dissipated toward the radially outer side from the second plate surface 531*b* is likely to increase. Therefore, heat dissipated from the switch main body 531 to the outside via the inverter outer peripheral wall 91 is likely to increase. Accordingly, the heat dissipation effect of the inverter device 80 can be enhanced by the second plate surface 531*b*.

<Configuration Group D>

According to the present embodiment, multiple arm switch units 530 are arranged in the circumferential direction CD on the inverter outer peripheral wall 91, and are in contact with the inner peripheral surface 90*b*. In the configuration, in each of the multiple arm switch units 530, heat generated is easily transferred directly from the switch main body 531 to the inner peripheral surface 90*b*. Moreover, since the outer peripheral surface 90*a* is provided in the inverter outer peripheral wall 91, the heat transferred from the arm switch unit 530 to the inverter outer peripheral wall 91 is easily dissipated to the outside from the outer peripheral surface 90*a*. Therefore, for example, it is possible to restrict the temperature of the arm switch unit 530 from becoming excessively high and the heat generated from one arm switch unit 530 from being applied to the other arm switch units 530. Accordingly, the heat dissipation effect of the inverter device 80 can be enhanced. Accordingly, for example, it is possible to restrict the temperature of the inverter device 80 from rising excessively to cause an abnormality.

According to the present embodiment, the smoothing capacitor portion 580 and the filter component 524, which generate less heat by energization than the arm switch unit 530, are provided on the radially inner side of the arm switch unit 530. In the configuration, it is possible to avoid heat, which transmits toward the radially outer side from the arm switch unit 530, from being applied to the smoothing capacitor portion 580 and the filter component 524. In this case, it is unlikely that temperatures of the smoothing capacitor portion 580 and the filter component 524 rise due to the heat of the arm switch unit 530. Further, in this case, it is unlikely that the heat of the arm switch unit 530 is hindered from reaching the inverter outer peripheral wall 91 by the smoothing capacitor portion 580 and the filter component 524. Accordingly, the heat dissipation effect can be enhanced for each of the arm switch unit 530, the smoothing capacitor portion 580, and the filter component 524.

According to the present embodiment, the arm switch row 530R extends in a ring shape in the circumferential direction CD. In the configuration, heat of the multiple arm switch units 530 in the arm switch row 530R can be dissipated to the outside from the entire inverter outer peripheral wall 91 in the circumferential direction CD. Therefore, it is unlikely that heat accumulates in a part of the inverter outer peripheral wall 91 and a part of an internal space of the inverter housing 90. Accordingly, for example, it is possible to restrict the temperature of a part of the inverter device 80 from rising excessively to cause an abnormality.

Moreover, the capacitor row 580R and the filter row 524R extend in a ring shape in the circumferential direction CD on the radially inner side of the arm switch row 530R. In the configuration, it is unlikely that the heat of the smoothing capacitor portion 580 and the heat of the filter component 524 accumulate in a part in the circumferential direction CD. Therefore, for example, it is possible to restrict an occurrence of an abnormality in the inverter device 80 due to an excessive rise in temperature of a part at a position on the radially inner side of the arm switch row 530R.

According to the present embodiment, the filter component 524, which generates less heat by energization than the smoothing capacitor portion 580, is provided on the radially inner side of the smoothing capacitor portion 580. In the configuration, a positional relationship between the smoothing capacitor portion 580 and the filter component 524 is set such that heat generated at a center side of the inverter device 80 is reduced as much as possible. Therefore, it is unlikely that heat accumulates at the center side of the inverter device 80. Accordingly, for example, it is possible to restrict the temperature of the inverter device 80 on the center side from rising excessively to cause an abnormality.

According to the present embodiment, the filter row 524R extends in a ring shape in the circumferential direction CD on the radially inner side of the capacitor row 580R. In the configuration, it is unlikely that the heat of the filter component 524 accumulates in a part in the circumferential direction CD on the radially inner side of the capacitor row 580R. Therefore, for example, it is possible to restrict an occurrence of an abnormality in the inverter device 80 due to an excessive rise in temperature of a part on the center side of the inverter device 80.

According to the present embodiment, the high voltage board 510 as a plate member is provided at a position spaced to the radially inner side from the inner peripheral surface 90*b* with respect to the inverter outer peripheral wall 91. Therefore, by fixing the smoothing capacitor portion 580 and the filter component 524 to the high voltage board 510, it is possible to easily implement a configuration in which the smoothing capacitor portion 580 and the filter component 524 are provided on the radially inner side of the arm switch unit 530.

According to the present embodiment, among the multiple smoothing capacitor portions 580, the group alignment component 580*c* is provided at a position aligned with the switch group 530G in the radial direction RD. In the configuration, since the group alignment component 580*c* is disposed on the radially inner side of the arm switch unit 530, the heat dissipation effect of the group alignment component 580*c* is enhanced, and a separation distance between the switch group 530G and the group alignment component 580*c* can be made as short as possible. Therefore, an energization path electrically connecting the arm switch unit 530 in the switch group 530G with the group alignment component 580*c* can be made as short as possible to be a shortest path. Accordingly, it is possible to reduce the loss caused by a parasitic inductance or the like in the energization path connecting the arm switch unit 530 and the group alignment component 580*c*.

According to the present embodiment, the inverter connector 96 is provided in the intermediate region Asw2 in the inverter outer peripheral wall 91. Therefore, it is possible to avoid heat dissipation of the arm switch unit 530 from the inverter outer peripheral wall 91 from being hindered by the inverter connector 96 in the switch region Asw1. Accordingly, it is possible to restrict the heat dissipation effect of the inverter outer peripheral wall 91 from being impaired by the inverter connector 96.

Moreover, the connector alignment component 524*b* among the multiple filter components 524 is provided at a position aligned with the inverter connector 96 in the radial direction RD. In the configuration, since the arm switch unit 530 is not provided on the radially outer side of the connector alignment component 524*b*, heat of the connector alignment component 524*b* easily escapes radially outward toward the inverter connector 96. Therefore, it is possible to restrict the heat of the filter component 524 from accumulating at the radially inner side of the arm switch unit 530.

In the configuration, a distance between the inverter connector 96 and the connector alignment component 524*b* can be made short as much as possible. Therefore, the power supply lines 570 and 571 connected to the connector alignment component 524*b* can be drawn out from the inverter connector 96 through a route as short as possible such as a shortest route. As described above, since an energization path such as the lines 141 and 142 formed by the power supply lines 570 and 571 can be shortened as much as possible, it is possible to reduce the loss caused by the parasitic inductance or the like in the lines 141 and 142.

According to the present embodiment, in the arm switch unit 530, the second plate surface 531*b* of the switch main body 531 is superimposed on the inner peripheral surface 90*b*. In the configuration, a heat transfer area over which heat transfers from the switch main body 531 to the inverter outer peripheral wall 91 can be increased as much as possible. Therefore, heat of the switch main body 531 is easily transferred to the inverter outer peripheral wall 91. The heat transfer effect of transferring heat from the switch main body 531 to the inverter outer peripheral wall 91 can be enhanced.

According to the present embodiment, since heat dissipated from the second plate surface 531*b* is more than heat dissipated from the first plate surface 531*a* in the switch main body 531, heat generated in the switch main body 531 can be transferred to the inverter outer peripheral wall 91 as much as possible. Accordingly, it is possible to implement a configuration in which heat easily transfers from the switch main body 531 to the inverter outer peripheral wall 91.

According to the present embodiment, in the arm switch unit 530, heat of the switch main body 531 is dissipated to the outside through the first heat dissipation path PH1, and heat of the terminals 532 to 535 is dissipated to the outside through the second heat dissipation path PH2 and the third heat dissipation path PH3. In this way, since the heat of the arm switch unit 530 is dissipated to the outside of the inverter outer peripheral wall 91 through multiple paths, the heat dissipation effect of the inverter device 80 can be enhanced.

<Configuration Group B>

Second Embodiment

In the first embodiment, the output busbar 603 is provided between the P busbar 601 and the N busbar 602. On the other hand, in a second embodiment, the output busbar 603 is not provided between the P busbar 601 and the N busbar 602. Configurations, operations, and effects not particularly described in the second embodiment are the same as those of the first embodiment. In the second embodiment, differences from the first embodiment described above will be mainly described.

Figure 29:
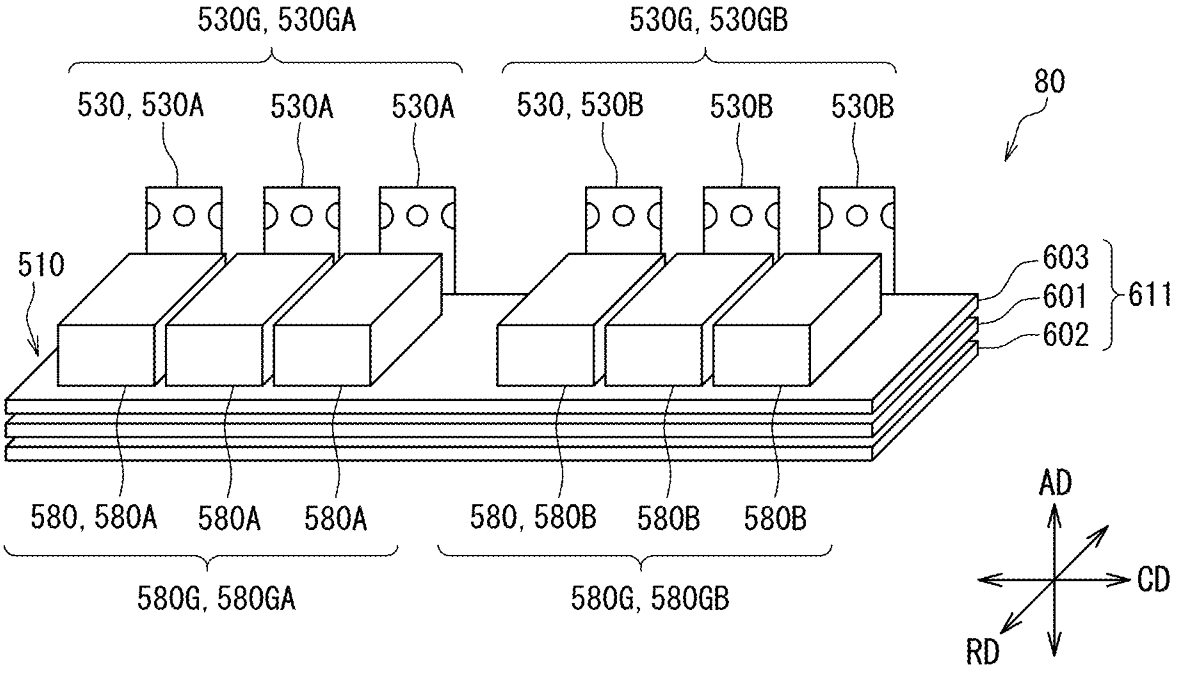
FIG. 29 is a schematic perspective view of a periphery of an arm switch unit of a high voltage board in the configuration group B according to a second embodiment.

As illustrated in FIG. 29, the P busbar 601 is provided between the N busbar 602 and the output busbar 603. The P busbar 601 is provided between the N busbar 602 and the output busbar 603 in each of the first busbar set 611 and the second busbar set 612. For example, the output busbar 603 in the first busbar set 611 is provided between the earth busbar 604 and the P busbar 601. The N busbar 602 in the second busbar set 612 is provided between the P busbar 601 and the earth busbar 604.

Figure 30:
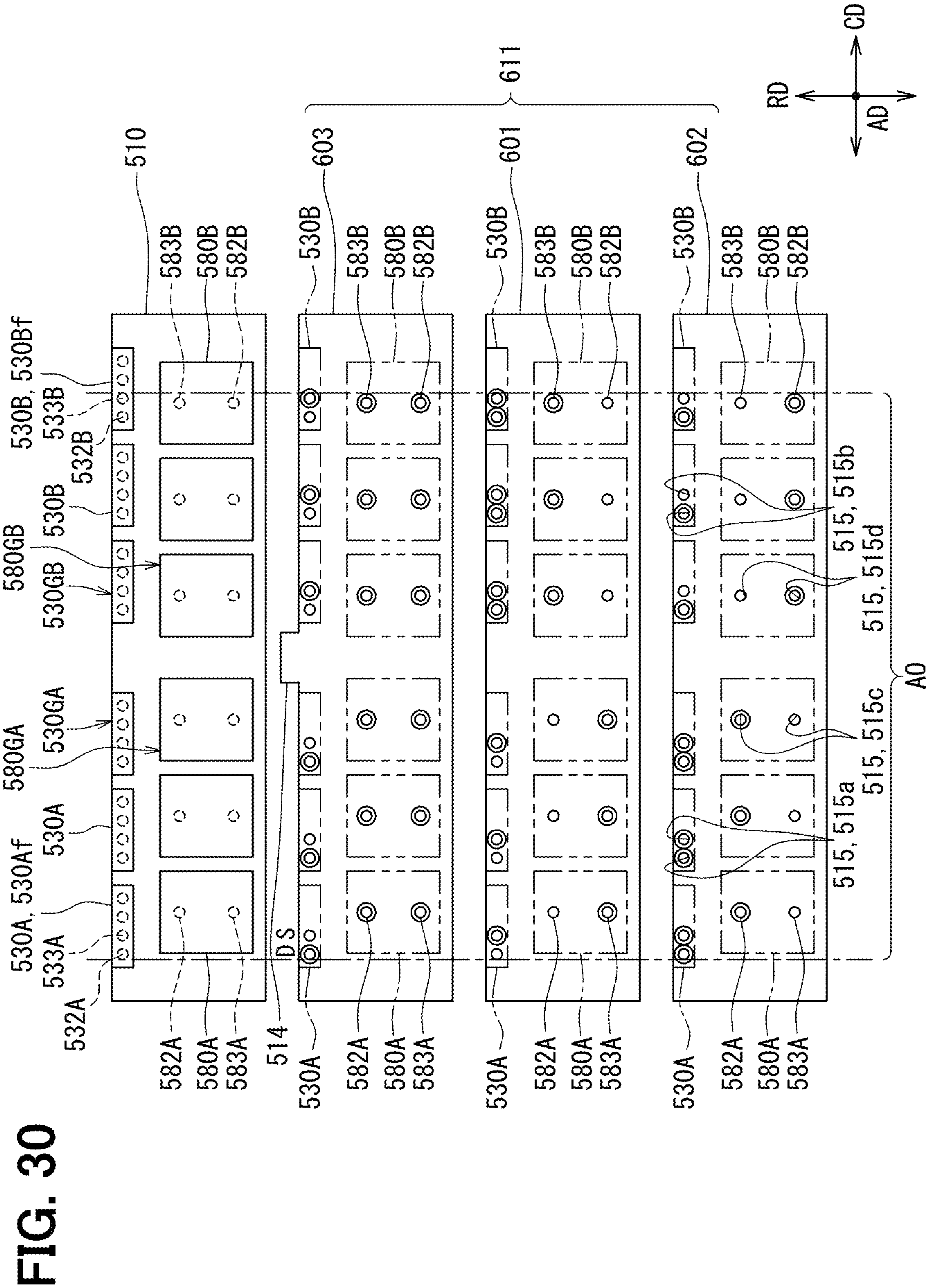
FIG. 30 is an exploded top view of the high voltage board.
Figure 31:
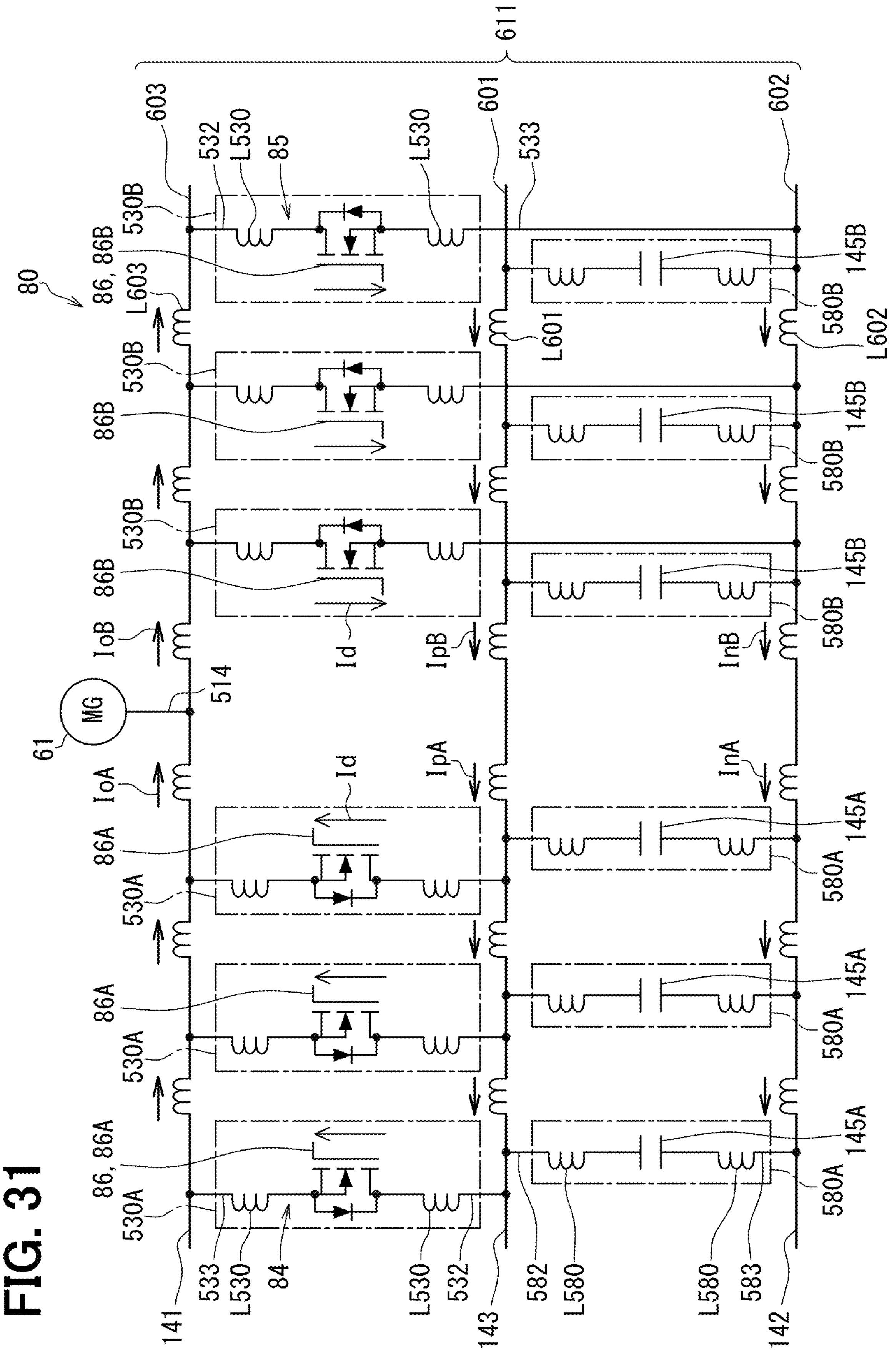
FIG. 31 is a circuit diagram illustrating the output current, the P current, and the N current.
Figure 32:
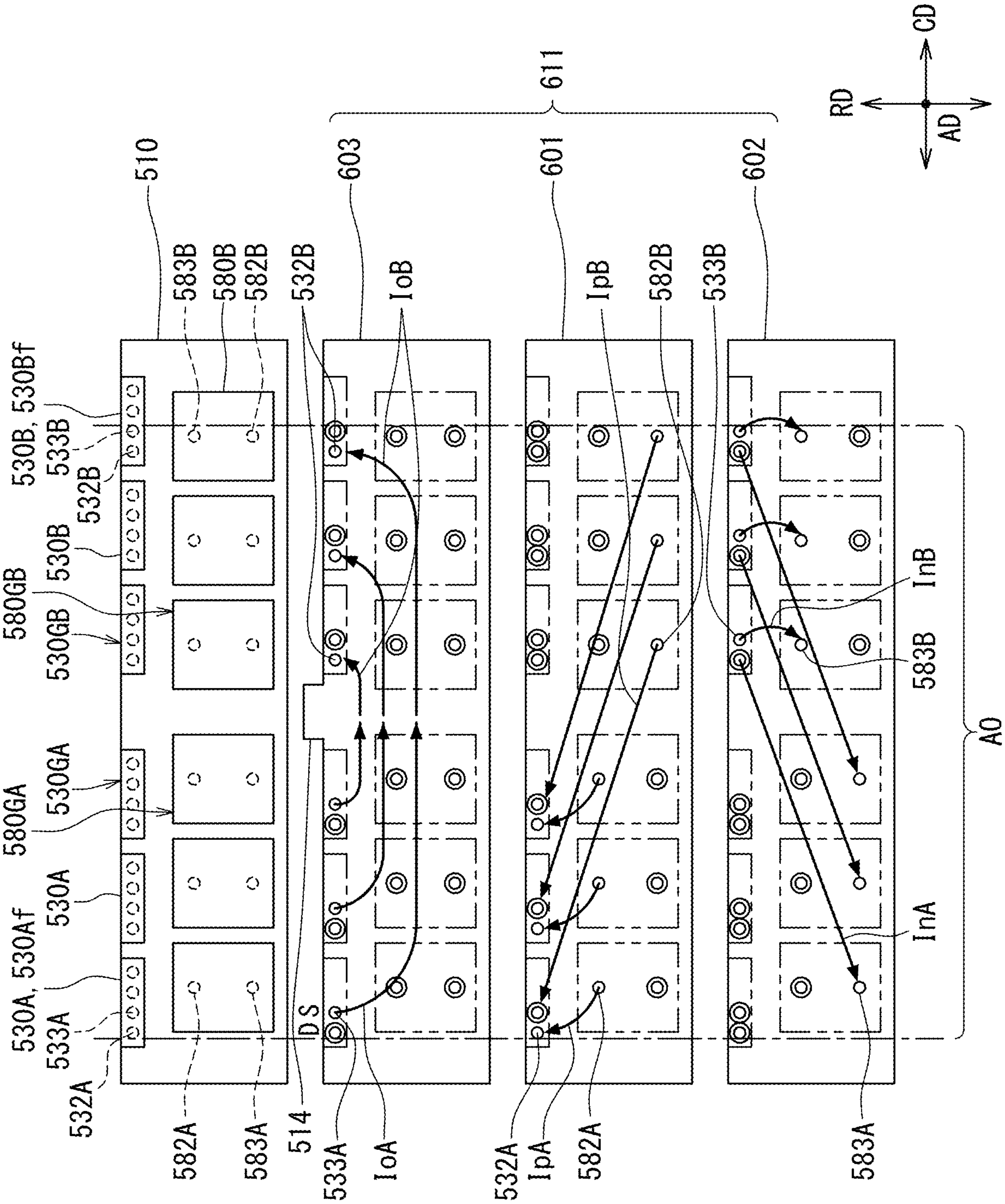
FIG. 32 is an exploded top view of the high voltage board for illustrating the output current, the P current, and the N current.

Also in the present embodiment, a connection relationship between the arm switch unit 530 and the smoothing capacitor portion 580 and the busbars 601 to 603 as illustrated in FIG. 30 is the same as that in the first embodiment. Flows of the currents IpA, IpB, InA, InB, IoA, and IoB in the busbars 601 to 603 as illustrated in FIGS. 31 and 32 are the same as those in the first embodiment.

An arrangement order of the P busbar 601, the N busbar 602, and the output busbar 603 may be any order. For example, the arrangement order of the busbars 601 to 603 may be different between the first busbar set 611 and the second busbar set 612. The busbars adjacent to each other in the axial direction AD may be the same type of busbar. For example, two P busbars 601 may be provided adjacent to each other in the axial direction AD. Further, regarding each of the busbar sets 611 and 612, one may be provided, or three or more may be provided. In addition, at least one of the P busbar 601, the N busbar 602, and the output busbar 603 may be provided in plurality.

Third Embodiment

In the first embodiment, the installation orientations of the upper capacitor portion 580A and the lower capacitor portion 580B in the radial direction RD are opposite from each other. On the other hand, in a third embodiment, the upper capacitor portion 580A and the lower capacitor portion 580B have the same installation orientation in the radial direction RD. Configurations, operations, and effects not particularly described in the third embodiment are the same as those of the first and second embodiments. In the third embodiment, differences from the first and second embodiments will be mainly described.

Figure 33:
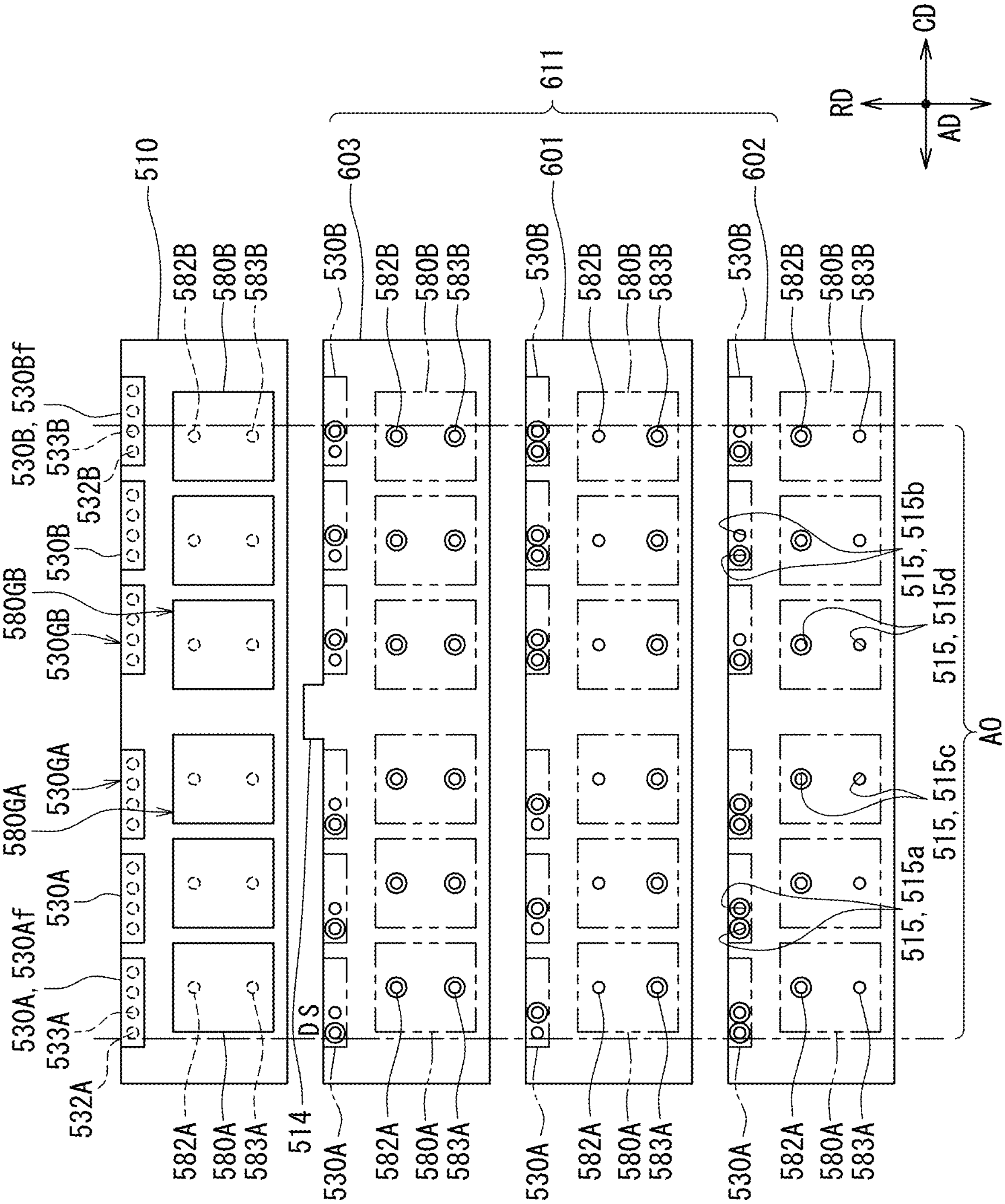
FIG. 33 is an exploded top view of a high voltage board according to a third embodiment.

As illustrated in FIG. 33, in both the upper capacitor portion 580A and the lower capacitor portion 580B, the P capacitor terminal 582 is provided at a position spaced to the radially outer side from the N capacitor terminal 583. The upper P capacitor terminal 582A and the lower P capacitor terminal 582B are located at positions spaced to the radially outer side from the upper N capacitor terminal 583A and the lower N capacitor terminal 583B.

Figure 34:
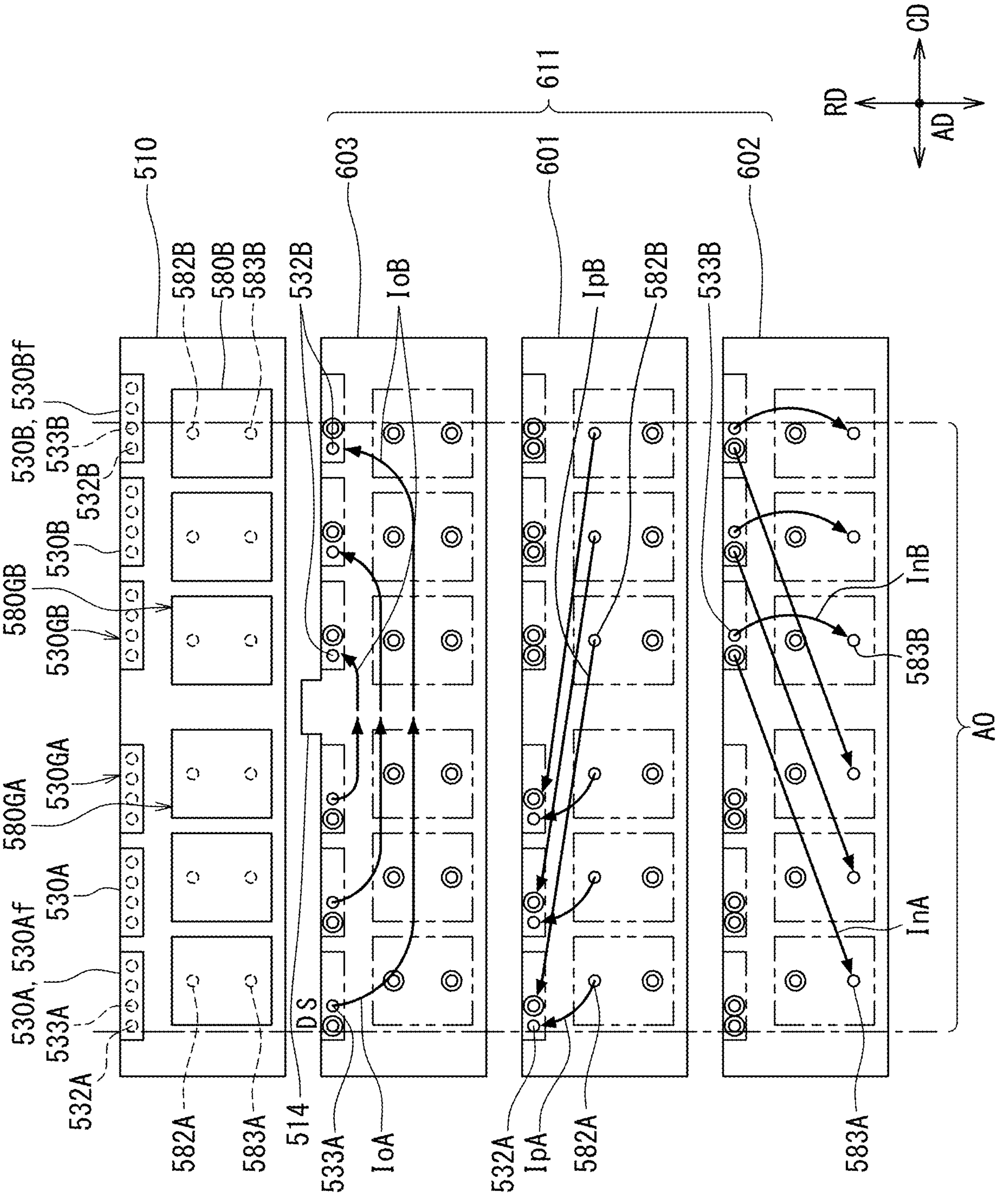
FIG. 34 is an exploded top view of the high voltage board for illustrating the output current, the P current, and the N current.

In the present embodiment, distances over which the P currents IpA and IpB and the N currents InA and InB flow in the radial direction RD are different from those in the first embodiment. As illustrated in FIG. 34, in the P busbar 601, both the upper P current IpA and the lower P current IpB flow into the upper drain terminal 532A from the P capacitor terminal 582 located on the radially outer side of the N capacitor terminal 583. In the N busbar 602, both the upper N current InA and the lower N current InB flowing out from the lower source terminal 533B flow into the N capacitor terminal 583 located on the radially inner side of the P capacitor terminal 582. Therefore, a total distance over which the P currents IpA and IpB flow in the radial direction RD in the P busbar 601 is smaller than a total distance over which the N currents InA and InB flow in the radial direction RD in the N busbar 602.

An installation orientation of the smoothing capacitor portion 580 may be different among multiple smoothing capacitor portions 580 in one capacitor group 580G. For example, in one upper capacitor group 580GA, multiple upper capacitor portions 580A may have different installation orientations. The installation orientation of the smoothing capacitor portion 580 may be different for each phase. For example, installation orientations of the U-phase smoothing capacitor portion 580 and the V-phase smoothing capacitor portion 580 may be different from each other. Further, installation orientations of all the smoothing capacitor portions 580 of the inverter device 80 may be the same.

In the smoothing capacitor portion 580, the P capacitor terminal 582 and the N capacitor terminal 583 may not be arranged in the radial direction RD. For example, the P capacitor terminal 582 and the N capacitor terminal 583 may be arranged in the circumferential direction CD or may be arranged in the axial direction AD. A direction in which the P capacitor terminal 582 and the N capacitor terminal 583 extend from the capacitor main body 581 may not be the axial direction AD. For example, the capacitor terminals 582 and 583 may extend in the circumferential direction CD or extend in the radial direction RD. Further, the P capacitor terminal 582 and the N capacitor terminal 583 may have different directions extending from the capacitor main body 581.

Fourth Embodiment

In the first embodiment, multiple earth busbars 604 are provided with respect to the busbars 601 to 603. On the other hand, in the fourth embodiment, only one earth busbar 604 is provided with respect to the busbars 601 to 603. Configurations, operations, and effects not particularly described in a fourth embodiment are the same as those of the first and second embodiments. In the fourth embodiment, differences from the first and second embodiments will be mainly described.

Figure 35:
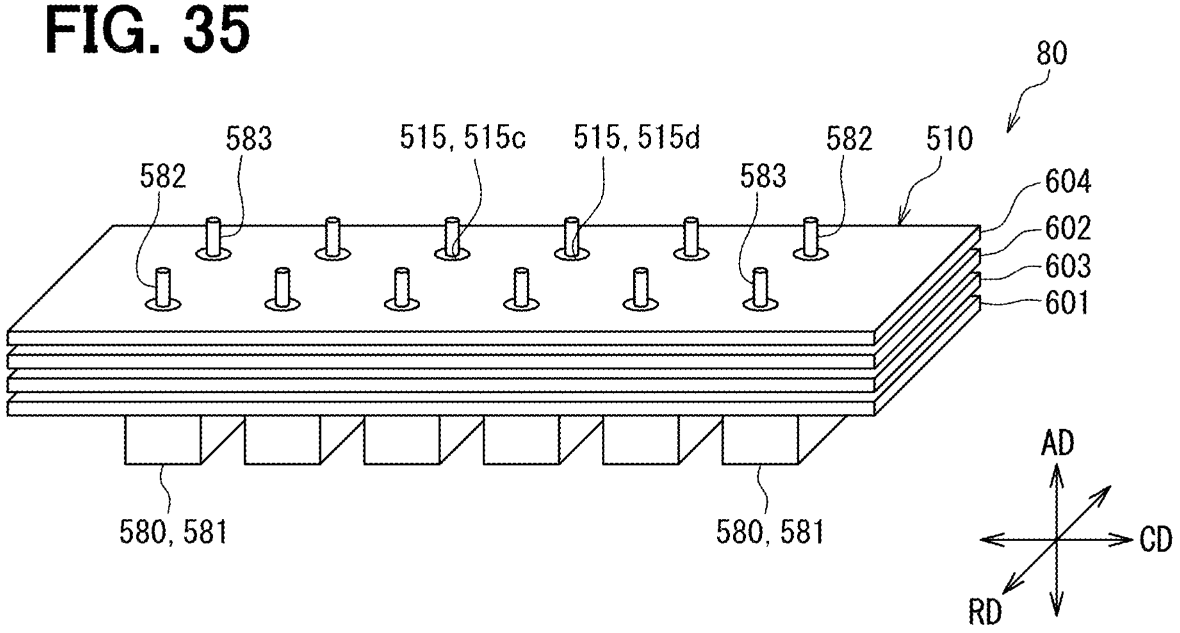
FIG. 35 is a perspective view of an internal structure of a high voltage board as viewed from a low voltage side according to a fourth embodiment.

As illustrated in FIG. 35, the earth busbar 604 is provided at only one of a pair of outermost positions in multiple plate-shaped conductors. The earth busbar 604 is provided, for example, only on a low voltage side in the axial direction AD with respect to the busbars 601 to 603. Regarding the earth busbar 604, the earth busbar 604 is not provided between the busbars 601 to 603 and the capacitor main body 581. The earth busbar 604 is provided on a side opposite to the capacitor main body 581 with the busbars 601 to 603 interposed therebetween in the axial direction AD.

The earth busbar 604 may be provided between the busbars 601 to 603. For example, the earth busbar 604 may be provided between the P busbar 601 and the N busbar 602. The earth busbar 604 may be provided between multiple busbar sets 611 and 612. For example, the earth busbar 604 may be provided between the first busbar set 611 and the second busbar set 612.

<Configuration Group C>

Fifth Embodiment

In the first embodiment, the second plate surface 531*b* is superimposed on the inner peripheral surface 90*b* in the switch main body 531. On the other hand, in the second embodiment, the main body base end portion 531*c* is superimposed on the inner peripheral surface 90*b* in the switch main body 531. Configurations, operations, and effects not particularly described in a fifth embodiment are the same as those of the first embodiment. In the fifth embodiment, differences from the first embodiment will be mainly described.

Figure 36:
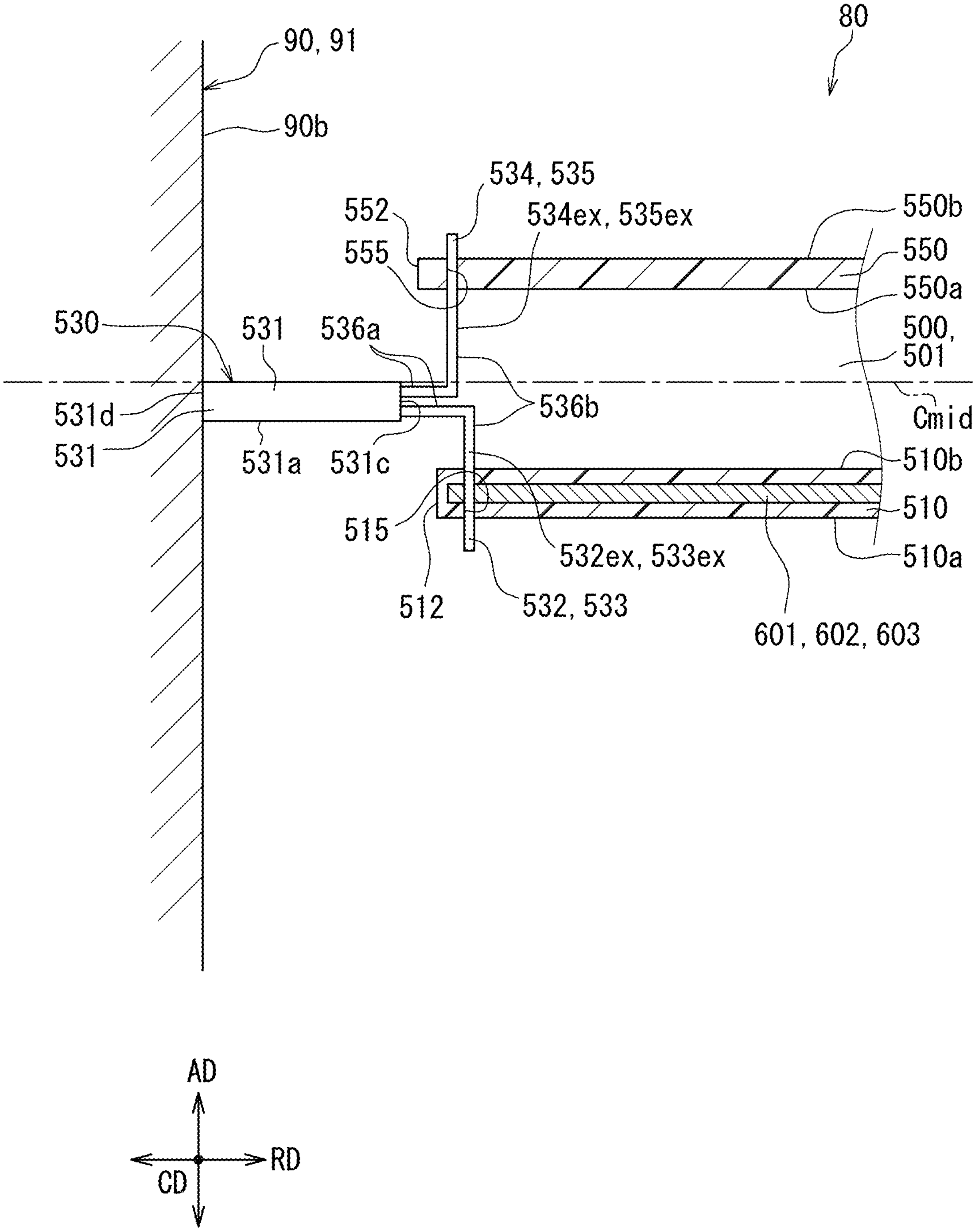
FIG. 36 is a schematic longitudinal sectional view of a periphery of an arm switch unit in the configuration group C according to a fifth embodiment.

As illustrated in FIG. 36, the plate-shaped switch main body 531 extends in a direction orthogonal to the axial direction AD. In the switch main body 531, the main body base end portion 531*c* is in contact with the inner peripheral surface 90*b*.

The switch main body 531 is provided between the high voltage board 510 and the drive board 550 in the axial direction AD. In the axial direction AD, the switch main body 531 is located at a position spaced apart from both the high voltage board 510 and the drive board 550. Also in the present embodiment, the switch main body 531 is located at a position closer to the high voltage board 510 than to the drive board 550. The switch main body 531 may be located at a position where the switch main body 531 straddles the board intermediate line Cmid in the axial direction AD or may be located at a position spaced apart from the board intermediate line Cmid in the axial direction AD.

The entire switch main body 531 is provided between the first high-voltage surface 510*a* and the second control surface 550*b* in the axial direction AD. The switch main body 531 does not protrude from the first high-voltage surface 510*a* to a high voltage side in the axial direction AD, and does not protrude from the second control surface 550*b* to a low voltage side. The entire switch main body 531 falls within a projection region obtained by projecting a board region to the radially outer side.

The terminals 532 to 535 are each bent in an L shape as a whole. In the terminals 532 to 535, the base end extension portion 536*a* extends toward the radially inner side from the switch main body 531. In the drain terminal 532 and the source terminal 533, the tip end extension portion 536*b* extends from the base end extension portion 536*a* toward the high voltage side in the axial direction AD. In the gate terminal 534 and the driver source terminal 535, the tip end extension portion 536*b* extends from the base end extension portion 536*a* toward the low voltage side in the axial direction AD.

Sixth Embodiment

In the first embodiment, the arm switch unit 530 is a four-terminal type switch module. On the other hand, in the second embodiment, multiple arm switch units 530 include a four-terminal type switch module and a six-terminal type switch module. Configurations, operations, and effects not particularly described in a sixth embodiment are the same as those of the first embodiment. In the sixth embodiment, differences from the first embodiment will be mainly described.

Figure 37:
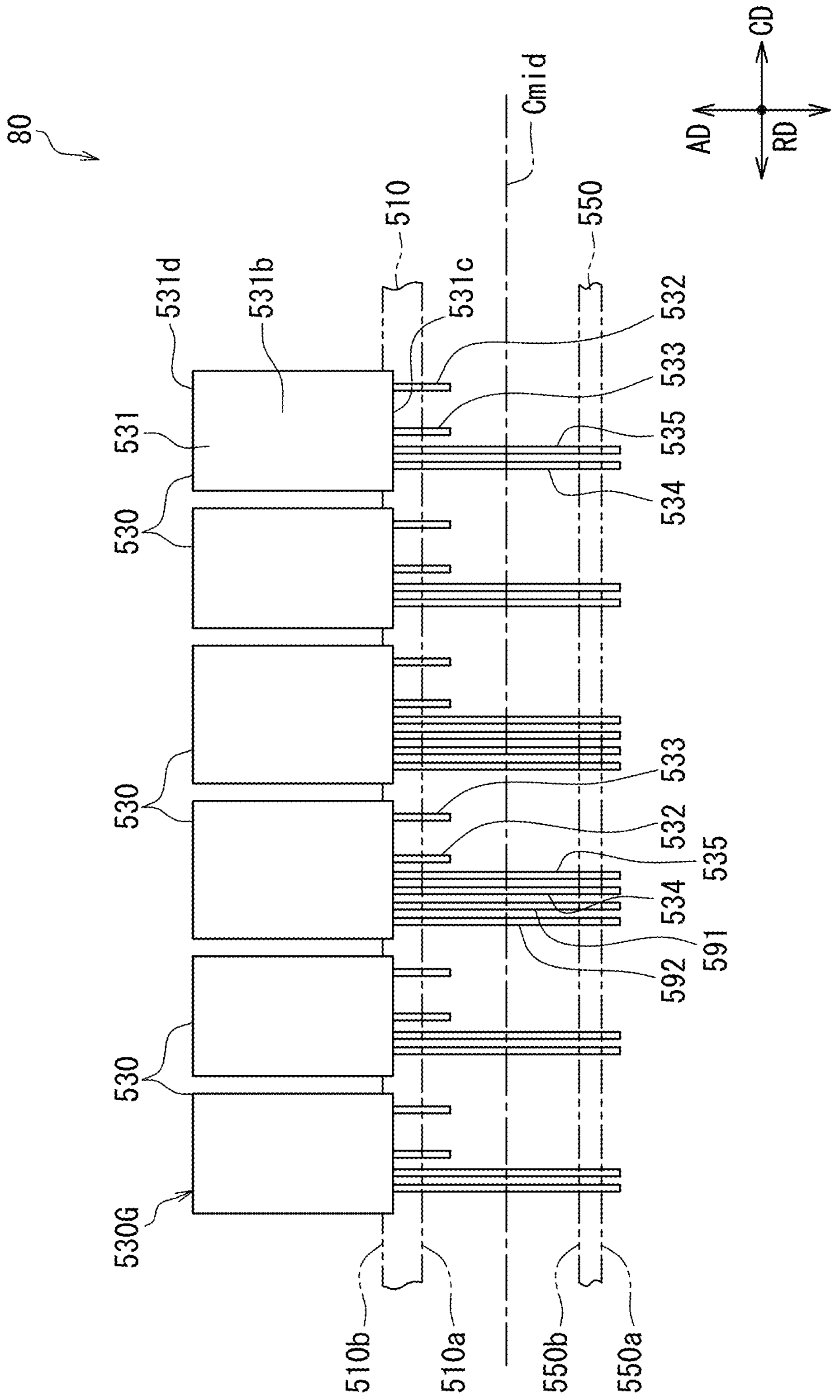
FIG. 37 is a view of a periphery of an arm switch unit according to a sixth embodiment as viewed from an outer side in a circumferential direction.

As illustrated in FIG. 37, the multiple arm switch units 530 include the four-terminal arm switch unit 530 and the six-terminal arm switch unit 530. In the present embodiment, the four-terminal type switch module is referred to as the four-terminal arm switch unit 530. Similarly, the six-terminal type switch module is referred to as the six-terminal arm switch unit 530. The four-terminal arm switch unit 530 and the six-terminal arm switch unit 530 are provided in one switch group 530G. In one switch group 530G, the four-terminal arm switch unit 530 and the six-terminal arm switch unit 530 are electrically connected in parallel. One switch group 530G includes, for example, multiple four-terminal arm switch units 530 and multiple six-terminal arm switch units 530.

The six-terminal arm switch unit 530 includes an anode terminal 591 and a cathode terminal 592 in addition to the terminals 532 to 535. The six-terminal arm switch unit 530 includes a temperature sensitive diode (not shown). The temperature sensitive diode is a temperature sensor that detects a temperature of the arm switch 86. The temperature sensitive diode can detect a temperature of the arm switch unit 530. The anode terminal 591 is connected to an anode of the temperature sensitive diode. The cathode terminal 592 is connected to a cathode of the temperature sensitive diode. The anode terminal 591 and the cathode terminal 592 are detection terminals and are electrically connected to the drive board 550.

The anode terminal 591 and the cathode terminal 592 are arranged in a width direction of the switch main body 531 together with the terminals 532 to 535. In the present embodiment, the anode terminal 591 and the cathode terminal 592 are arranged in the circumferential direction CD together with the terminals 532 to 535. The terminals 532 to 535, 591 and 592 may be shifted in the radial direction RD or may not be shifted in the radial direction RD.

Seventh Embodiment

In the sixth embodiment, the four-terminal arm switch unit 530 and the six-terminal arm switch unit 530 coexist in one switch group 530G. On the other hand, in the second embodiment, only one of the four-terminal arm switch unit 530 and the six-terminal arm switch unit 530 is provided in one switch group 530G. Configurations, operations, and effects not particularly described in a seventh embodiment are the same as those of the sixth embodiment. In the seventh embodiment, differences from the sixth embodiment will be mainly described.

Figure 38:
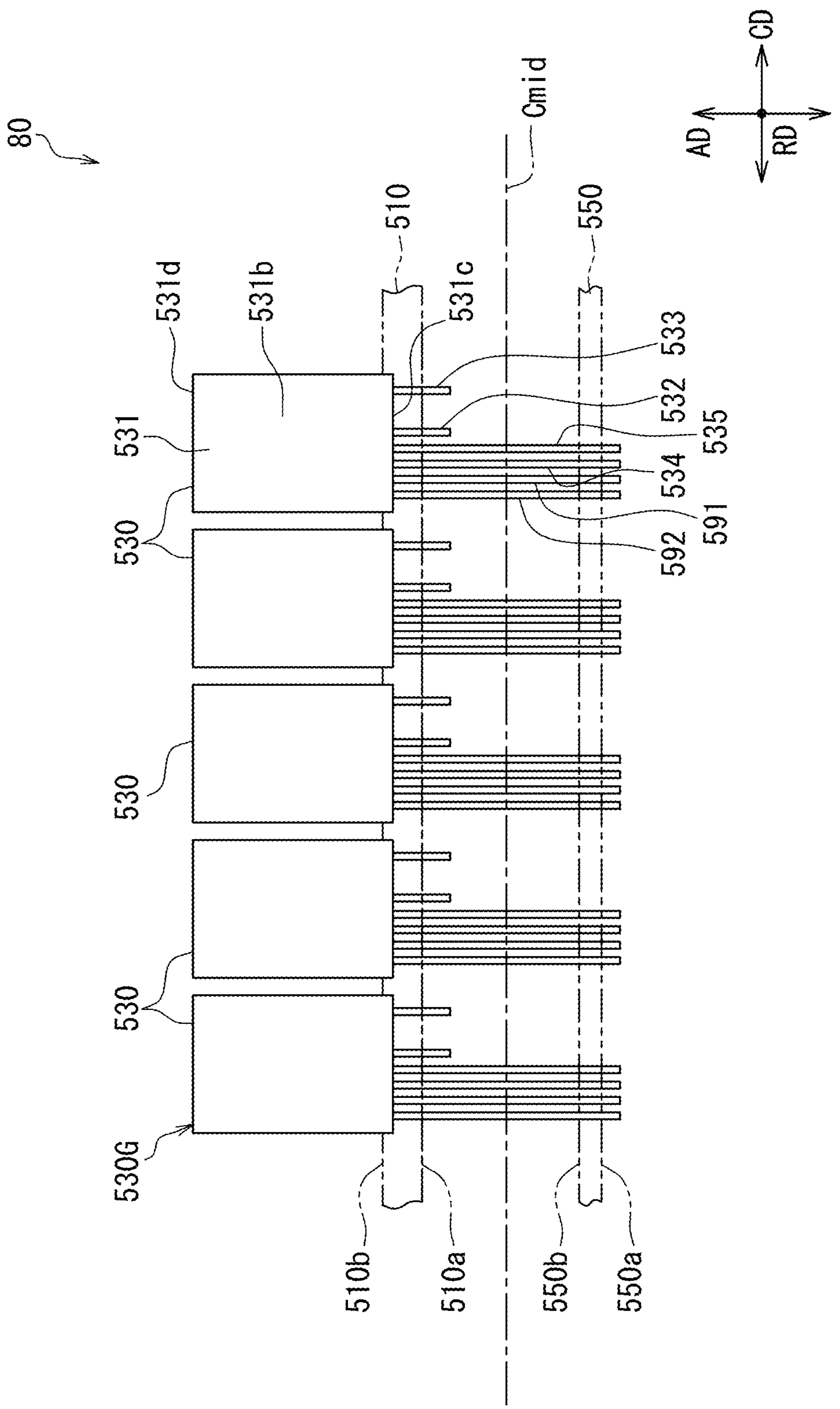
FIG. 38 is a view of a periphery of an arm switch unit according to a seventh embodiment as viewed from an outer side in a circumferential direction.

As illustrated in FIG. 38, only the six-terminal arm switch unit 530 out of the four-terminal arm switch unit 530 and the six-terminal arm switch unit 530 is provided in one switch group 530G.

All of the multiple arm switch units 530 provided in the inverter device 80 may be the six-terminal arm switch units 530. Multiple switch groups 530G provided in the inverter device 80 may include a switch group 530G including only the four-terminal arm switch units 530 and a switch group 530G including only the six-terminal arm switch units 530. Further, the multiple switch groups 530G may include a switch group 530G including only the four-terminal arm switch unit 530 or the six-terminal arm switch unit 530, and a switch group 530G including both the four-terminal arm switch unit 530 and the six-terminal arm switch unit 530.

Eighth Embodiment

In the sixth embodiment, the multiple arm switch units 530 include the six-terminal type switch module. On the other hand, in an eighth embodiment, multiple arm switch units 530 include a seven-terminal type switch module. Configurations, operations, and effects not particularly described in the eighth embodiment are the same as those of the first embodiment. In the eighth embodiment, differences from the first embodiment will be mainly described.

Figure 39:
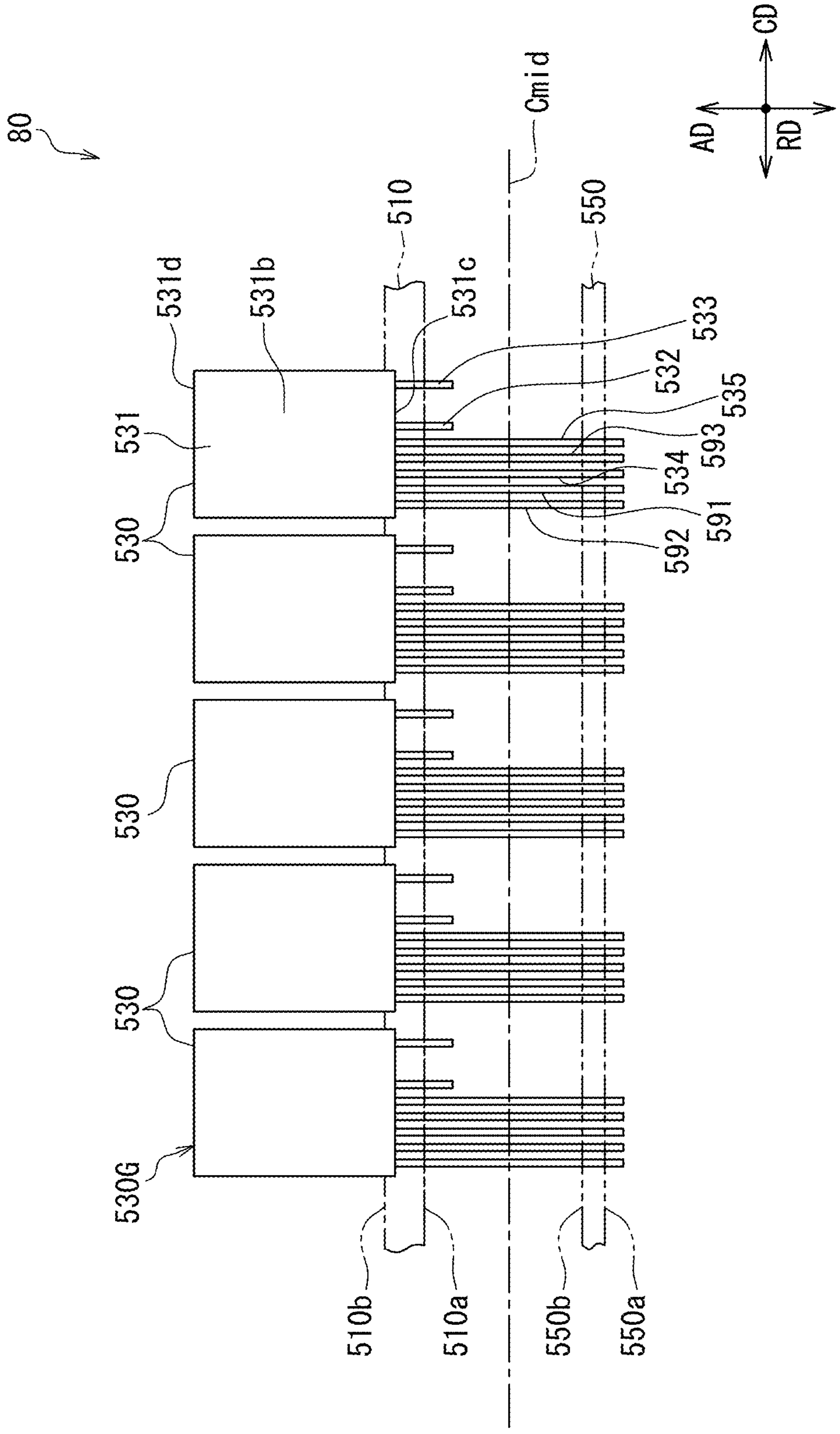
FIG. 39 is a view of a periphery of an arm switch unit according to an eighth embodiment as viewed from an outer side in a circumferential direction.

As illustrated in FIG. 39, the multiple arm switch units 530 include the seven-terminal arm switch unit 530. In the present embodiment, the seven-terminal type switch module is referred to as the seven-terminal arm switch unit 530. Multiple seven-terminal arm switch units 530 are provided in one switch group 530G. For example, only seven-terminal arm switch units 530 are provided in one switch group 530G.

The seven-terminal arm switch unit 530 includes a sense source terminal 593 in addition to the terminals 532 to 535, 591 and 592. The seven-terminal arm switch unit 530 includes a current detection unit (not shown). The current detection unit can detect a current flowing through the arm switch 86. The sense source terminal 593 is connected to the current detection unit. The sense source terminal 593 is a detection terminal and is electrically connected to the drive board 550.

The sense source terminal 593 is arranged in a width direction of the switch main body 531 together with the terminals 532 to 535, 591 and 592. In the present embodiment, the sense source terminal 593 is arranged in the circumferential direction CD together with the terminals 532 to 535, 591 and 592. The terminals 532 to 535 and 591 to 593 may be shifted in the radial direction RD or may not be shifted in the radial direction RD.

All of the multiple arm switch units 530 provided in the inverter device 80 may be the seven-terminal arm switch units 530. The multiple arm switch units 530 provided in the inverter device 80 may include multiple types of arm switch units 530. For example, the multiple arm switch units 530 may include at least one four-terminal arm switch unit 530, at least one six-terminal arm switch unit 530, and at least one seven-terminal arm switch unit 530. Further, multiple types of arm switch units 530 may be provided in one switch group 530G. For example, at least one four-terminal arm switch unit 530, at least one six-terminal arm switch unit 530, and at least one seven-terminal arm switch unit 530 may be provided in one switch group 530G.

Other Embodiments

The disclosure in the present description is not limited to the exemplary embodiments. The disclosure includes the exemplary embodiments and modifications made by those skilled in the art based on the exemplary embodiments. For example, the disclosure is not limited to a combination of components and elements described in the embodiments, and various modifications may be implemented. The disclosure may be implemented in various combinations. The disclosure may include an additional portion that can be added to the embodiments. The disclosure includes components and elements omitted from the embodiments. The disclosure includes the replacement or combination of components and elements between one embodiment and other embodiments. The disclosed technical scope is not limited to the description of the embodiments. The disclosed technical scope is indicated by the description of the claims, and should be construed to include all modifications within the meaning and scope equivalent to the description of the claims.

<Configuration Group A>

In each of the above-described embodiments, the multiple beam portions 501 may be located at any position in the circumferential direction CD and the axial direction AD as long as the multiple beam portions 501 are arranged in the circumferential direction CD. For example, the beam portion 501 may be located at a position closer to a low-voltage side end portion than to a high-voltage side end portion in the inverter outer peripheral wall 91, or may be located a position closer to the high-voltage side end portion than to the low-voltage side end portion. The beam portion 501 may be located at a position overlapping the inverter fin 92 in the radial direction RD.

In each of the above-described embodiments, the beam coupling portion 502 may not be in a ring shape as long as the beam coupling portion 502 couples the multiple beam portions 501. For example, the coupling opening 504 may not be provided in the beam coupling portion 502. A plate member such as the high voltage board 510 may not be fixed to the beam coupling portion 502 as long as the plate member is fixed to the beam portion 501. The component support portion 500 may not include the beam coupling portion 502 as long as the component support portion 500 includes the beam portion 501. For example, the component support portion 500 may include multiple independent beam portions 501. Also in this case, it is sufficient that the plate member such as the high voltage board 510 is fixed to the multiple beam portions 501 while extending across the multiple beam portions 501. It is sufficient that the plate member is fixed to at least one beam portion 501.

In each of the above-described embodiments, the beam portion 501 and the inverter outer peripheral wall 91 may not be integrally formed. For example, the beam portion 501 may be post-fitted to the inverter outer peripheral wall 91. The beam portion 501 and the inverter outer peripheral wall 91 may not be electrically connected to each other. For example, at least one of the beam portion 501 and the inverter outer peripheral wall 91 may not have conductivity or may have low conductivity. Further, the beam portion 501 and the inverter outer peripheral wall 91 may not be able to transfer heat. For example, at least one of the beam portion 501 and the inverter outer peripheral wall 91 may not have thermal conductivity or may have low thermal conductivity.

In each of the above-described embodiments, two plate members facing each other with the beam portion 501 interposed therebetween may be a circuit board. For example, the control board 560 may extend across multiple beam portions 501 and fixed to the multiple beam portions 501. Further, both of the two plate members facing each other with the beam portion 501 interposed therebetween may be the high voltage board 510, or may be a low-voltage board such as the drive board 550. The drive board 550 and the control board 560 may be integrated.

In each of the above-described embodiments, the plate member extending across and fixed to the multiple beam portions 501 may not be a circuit board such as the high voltage board 510. For example, as the plate member, a plate member made of glass having an insulation property may extend across and be fixed to the multiple beam portions 501. At least one of a first plate member such as the high voltage board 510 and a second plate member such as the drive board 550 may be a plate member that is not a circuit board.

In each of the above-described embodiments, the plate member such as the high voltage board 510 fixed to the beam portion 501 may not be in a ring shape. For example, the plate member may be a plate member having no opening such as the board opening 513. The plate member such as the high voltage board 510 may be provided on only one side of the beam portion 501 in the axial direction AD. On at least one side of the beam portion 501 in the axial direction AD, multiple plate members may be arranged in at least one of the radial direction RD and the circumferential direction CD along the beam portion 501.

In each of the above-described embodiments, the arm switch unit 530 may be provided on the low voltage side of the beam portion 501 as long as the arm switch unit 530 is provided at a position shifted from the beam portion 501 in the axial direction AD. The arm switch unit 530 may be provided at a position overlapping the beam portion 501 in the axial direction AD. For example, the arm switch unit 530 and the beam portion 501 may be arranged in the circumferential direction CD. Further, at least a part of the arm switch unit 530 may be provided at a position overlapping the plate member such as the high voltage board 510 in the axial direction AD. For example, a part of the arm switch unit 530 may enter between the high voltage board 510 and the drive board 550.

In each of the above-described embodiments, the plate surfaces 531*a* and 531*b* of the switch main body 531 may not be oriented orthogonally to the radial direction RD. For example, the switch main body 531 may be provided such that the plate surfaces 531*a* and 531*b* are oriented orthogonally to the axial direction AD. Further, the switch main body 531 may be provided such that the plate surfaces 531*a* and 531*b* are oriented orthogonally to the circumferential direction CD.

In each of the above-described embodiments, the switch main body 531 may be fixed to at least one of the plate member such as the high voltage board 510 and the inverter outer peripheral wall 91. For example, the switch main body 531 may be fixed to the high voltage board 510. The switch main body 531 may be provided at a position spaced to the radially inner side from the inverter outer peripheral wall 91. Even In the configuration, if the multiple arm switch units 530 are arranged along the inner peripheral surface 90*b*, heat of the arm switch unit 530 is easily applied to the inverter outer peripheral wall 91.

In each of the above-described embodiments, the multiple arm switch units 530 may be arranged in the circumferential direction CD in multiple rows rather than in one row. The multiple rows may be arranged in the axial direction AD or may be arranged in the radial direction RD. For example, multiple arm switch units 530 provided in one switch group 530G may be arranged in two rows. Further, two switch groups 530G each including multiple arm switch units 530 arranged in one row may be arranged in the axial direction AD. A flat surface may be formed at the inner peripheral surface 90*b*, and the multiple arm switch units 530 may be arranged on the flat surface in a concentrated manner as a power module.

In each of the above-described embodiments, the switch group 530G may be provided at a position overlapping the beam portion 501 in the circumferential direction CD. For example, one switch group 530G may be provided at a position straddling the beam portion 501 in the circumferential direction CD. One switch group 530G may extend between two beam portions 501 adjacent to each other in the circumferential direction CD.

<Configuration Group B>

In each of the above-described embodiments, the upper arm switch unit 530A and the lower arm switch unit 530B may not include an output control terminal such as the driver source terminal 535. For example, as illustrated in FIG. 22, the driving power supply 620 may apply a control voltage to the source terminal 533 and the gate terminal 534. That is, the arm switch unit 530 may be a three-terminal type switch module. The arm switch unit 530 includes the drain terminal 532, the source terminal 533, and the gate terminal 534, but does not include the driver source terminal 535. When the first switch unit 530A1 and the second switch unit 530A2 are of the three-terminal type, a current imbalance is also likely to occur if a difference occurs between the inductance Ls1 and the inductance Ls2 as in the first embodiment. Therefore, when the first switch unit 530A1 and the second switch unit 530A2 are of the three-terminal type, the current imbalance can be restricted by reducing the inductance L603 as in the first embodiment.

In each of the above-described embodiments, as long as a high potential current such as the upper P current IpA, a low potential current such as the upper N current InA, and an output current such as the upper output current IoA flow through the overlap region AO, the upper arm switch unit 530A and the lower arm switch unit 530B may be provided in any manner. For example, the upper arm switch unit 530A and the lower arm switch unit 530B may be provided at positions shifted in the axial direction AD and the radial direction RD. One upper arm switch unit 530A and one lower arm switch unit 530B may be provided instead of multiple upper arm switch units 530A and multiple lower arm switch units 530B. The upper arm switch unit 530A and the lower arm switch unit 530B may be provided on the boards 510, 550, 560, the component support portion 500, and the like. The upper arm switch unit 530A and the lower arm switch unit 530B may be provided at positions spaced to the radially inner side from the inner peripheral surface 90*b*.

In each of the above-described embodiments, as long as the high potential current such as the upper P current IpA, the low potential current such as the upper N current InA, and the output current such as the upper output current IoA flow through the overlap region AO, a capacitor component such as the smoothing capacitor portion 580 may be provided in any manner. For example, the smoothing capacitor portion 580 may be provided at a position spaced from the upper arm switch unit 530A and the lower arm switch unit 530B in the circumferential direction CD and the axial direction AD. The smoothing capacitor portion 580 may be provided at a position spaced from the overlap region AO. Only one smoothing capacitor portion 580 may be provided with respect to the upper arm switch unit 530A and the lower arm switch unit 530B. The capacitor component may not be the smoothing capacitor portion 580. For example, the X capacitor portion 528 may be provided as the capacitor component.

In each of the above-described embodiments, an extending direction in which the busbars 601 to 603 extend may not be the circumferential direction CD. For example, in a configuration in which the busbars 601 to 603 are provided with respect to a portion linearly extending in a predetermined direction in the inverter outer peripheral wall 91, the extending direction of the busbars 601 to 603 is the predetermined direction. A direction in which the busbars 601 to 603 are stacked may be the circumferential direction CD, the radial direction RD, or the like.

In each of the above-described embodiments, a high potential conductor, a low potential conductor, and an output conductor may not be busbars as long as the high potential conductor, the low potential conductor, and the output conductor are conductors. The high potential conductor, the low potential conductor, and the output conductor may not have a plate shape as long as the high potential conductor, the low potential conductor, and the output conductor extend along one another.

In each of the above-described embodiments, it is sufficient that at least one of the high potential conductor and the low potential conductor extends along the output conductor. For example, a configuration is assumed in which only one of the high potential conductor and the low potential conductor extends along the output conductor. Also In the configuration, in the overlap region AO in which the output currents IoA and IoB flow, it is sufficient that either the P currents IpA and IpB or the N currents InA and InB flow in a reverse direction to the output currents IoA and IoB in the circumferential direction CD. In the configuration, the smoothing capacitor portion 580 corresponds to a parallel component, and either the P currents IpA and IpB or the N currents InA and InB correspond to a parallel current. One of the P busbar 601 and the N busbar 602 corresponds to a power conductor.

According to this configuration, in the overlap region AO, the parallel current flowing through one of the P busbar 601 and the N busbar 602 is reversed in the circumferential direction CD from the output currents IoA and IoB flowing through the output busbar 603. Therefore, a magnetic field produced by the parallel current and a magnetic field produced by the output currents IoA and IoB cancel each other out, and thus a parasitic inductance generated in one of the P busbar 601 and the N busbar 602 and a parasitic inductance generated in the output busbar 603 can be reduced.

<Configuration Group C>

In each of the above-described embodiments, the main body heat dissipation portion 538 may be provided at any portion of the switch main body 531. It is preferable that the main body heat dissipation portion 538 is provided in a portion of the switch main body 531 which is in contact with the inverter outer peripheral wall 91. For example, in a configuration in which the main body base end portion 531*c* in the switch main body 531 is in contact with the inner peripheral surface 90*b*, the main body heat dissipation portion 538 is preferably provided at the main body base end portion 531*c* so as to be in contact with the inner peripheral surface 90*b*.

In each of the above-described embodiments, a power terminal such as the drain terminal 532 may straddle the board intermediate line Cmid in the axial direction AD. For example, in a configuration in which the switch main body 531 is located on the low voltage side with respect to the board intermediate line Cmid, the power terminal straddle the board intermediate line Cmid in the axial direction AD. A control terminal such as the gate terminal 534 may not straddle the board intermediate line Cmid in the axial direction AD. For example, in the configuration in which the switch main body 531 is located on the low voltage side with respect to the board intermediate line Cmid, the control terminal can be disposed on the low voltage side with respect to the board intermediate line Cmid.

In each of the above-described embodiments, the switch main body 531 may be provided in any orientation. The switch main body 531 may be provided in an orientation orthogonal to the axial direction AD as illustrated in FIG. 36, for example, or may be provided in an orientation orthogonal to the circumferential direction CD.

In each of the above-described embodiments, a position where the switch main body 531 is provided may not be a position closer to the high voltage board 510 than to the drive board 550. For example, the switch main body 531 may be provided at a position closer to the drive board 550 than to the high voltage board 510. Of the switch main body 531, a portion provided between the first high-voltage surface 510*a* and the second control surface 550*b* in the axial direction AD may not be the main body base end portion 531*c*. For example, at least the main body tip end portion 531*d* falls within a projection region obtained by projecting a board region toward the radially outer side.

In each of the above-described embodiments, as long as the multiple arm switch units 530 are arranged in the circumferential direction CD along the outer peripheral ends 512 and 552, the switch main body 531 may not be provided on the inner peripheral surface 90*b*. For example, the switch main body 531 may be provided at a position spaced to the radially inner side from the inner peripheral surface 90*b*. The switch main body 531 may be provided on at least one of the high voltage board 510 and the drive board 550. From the viewpoint of restricting a decrease in the operation accuracy of the drive board 550 due to noise from the switch main body 531, the switch main body 531 is preferably not provided on the drive board 550.

In each of the above-described embodiments, a power outer peripheral end such as the outer peripheral end 512 and a control outer peripheral end such as the outer peripheral end 552 may extend intermittently in the circumferential direction CD. As a configuration in which the power outer peripheral end and the control outer peripheral end extend intermittently in the circumferential direction CD, for example, there is a configuration in which multiple recess portions recessed toward the radially inner side are provided in the circumferential direction CD in the power outer peripheral end and the control outer peripheral end. Also In the configuration, if a power terminal such as the drain terminal 532 is connected between two recess portions adjacent to each other in the circumferential direction CD at a power connection object such as the high voltage board 510, a variation in length of multiple power terminals can be restricted. Similarly, if a control terminal such as the gate terminal 534 is connected between two recess portions adjacent to each other in the circumferential direction CD at a control connection object such as the drive board 550, a variation in length of multiple control terminals can be restricted.

In each of the above-described embodiments, a power outer peripheral end and a control outer peripheral end may not be in a ring shape as long as the power outer peripheral end and the control outer peripheral end extend in the circumferential direction CD. For example, multiple power outer peripheral ends and multiple control outer peripheral ends may be arranged in the circumferential direction CD. Similarly, the arm switch row 530R may not be in a ring shape as long as the arm switch row 530R extends in the circumferential direction CD. For example, multiple arm switch rows 530R may be arranged in the circumferential direction CD.

In each of the above-described embodiments, a power connection object and a control connection object may not be circuit boards. For example, the P busbar 601, the N busbar 602, and the output busbar 603 serving as power connection objects may be provided independently of the high voltage board 510. The power connection object and the control connection object may not be arranged in the axial direction AD. For example, the control connection object may be provided on the radially inner side of the power connection object.

<Configuration Group D>

In each of the above-described embodiments, as long as the arm switch unit 530 and the inverter outer peripheral wall 91 are capable of heat transfer, any portion of the arm switch unit 530 may be fixed to the inverter outer peripheral wall 91. For example, in the switch main body 531, at least one of the main body base end portion 531*c* and the main body tip end portion 531*d* may be fixed to the inner peripheral surface 90*b*. In the arm switch unit 530, the terminals 532 to 535 may be fixed to the inverter outer peripheral wall 91.

In each of the above-described embodiments, in one arm switch row 530R, it is sufficient that the arm switch unit 530 may be arranged in a predetermined number in the circumferential direction CD in at least a part of the row in the circumferential direction CD. The arm switch row 530R may be multiple rows instead of one row. For example, two arm switch rows 530R may be arranged in the axial direction AD. In the arm switch row 530R, multiple arm switch units 530 may be arranged at equal intervals. For example, the arm switch unit 530 may be disposed regardless of positions of the inverter fin 92 and the beam portion 501. The arm switch row 530R may not be in a ring shape. For example, the arm switch row 530R may be provided only on a part of the inverter outer peripheral wall 91 in the circumferential direction CD. Further, as long as the multiple arm switch units 530 are arranged in the circumferential direction CD, the multiple arm switch units 530 may not form the arm switch row 530R.

These modifications of the arm switch row 530R may be similarly applied to the capacitor row 580R and the filter row 524R. For example, in a configuration in which the capacitor row 580R has two rows, the two capacitor rows 580R may be arranged in the radial direction RD.

In each of the above-described embodiments, as long as the arm switch unit 530 is in contact with the inner peripheral surface 90*b*, the arm switch unit 530 may be directly fixed to the inverter outer peripheral wall 91, or may be indirectly fixed to the inverter outer peripheral wall 91. As a configuration in which the arm switch unit 530 is directly fixed to the inverter outer peripheral wall 91, there is a configuration in which the switch main body 531 is fixed to the inner peripheral surface 90*b* with an adhesive or the like as in the first embodiment. Even when not fixed to the inner peripheral surface 90*b*, the switch main body 531 is fixed to the inverter outer peripheral wall 91 via the terminals 532 to 535, the boards 510 and 550, and the component support portion 500. That is, the arm switch unit 530 is indirectly fixed to the inverter outer peripheral wall 91 via the high voltage board 510, the drive board 550, and the component support portion 500.

In each of the above-described embodiments, it is sufficient that the filter row 524R includes at least one type of filter component 524. For example, it is sufficient that the filter row 524R is formed including at least one of the common mode coil portion 525, the normal mode coil portion 526, the Y capacitor portion 527, and the X capacitor portion 528.

In each of the above-described embodiments, in a minor heat component row, the filter row 524R may be provided on the radially outer side of the capacitor row 580R. In one minor heat component row, the smoothing capacitor portion 580 and the filter component 524 may coexist. Further, a plate member provided with a minor heat component row such as the capacitor row 580R may not be the high voltage board 510 as long as the plate member is a circuit board, or may not be a circuit board. For example, the capacitor row 580R may be provided on a plate member made of glass.

<Common>

In each of the above-described embodiments, it is sufficient that a cover member such as the inverter lid portion 99 is provided on at least one of the high voltage side and the low voltage side of the inverter housing 90. The cover member may be formed by a thick plate member or may be formed by a thin plate member. The cover member may have a heat insulating property. For example, in a configuration in which a cover member having a heat insulating property is provided between the motor housing 70 and the inverter housing 90, heat of the motor device 60 is restricted from being transferred to the inverter device 80 by the cover member. Heat dissipation to the outside of the inverter can be promoted if a cover member on the opposite side of the motor housing 70 is a member having high thermal conductivity, for example, aluminum. In the configuration, the cooling effect of the inverter device 80 can be improved by the cover member. Further, the cover member may not be provided on either the high voltage side or the low voltage side of the inverter housing 90.

In each of the above-described embodiments, the inverter fin 92 may not be provided on the inverter outer peripheral wall 91 as long as heat is dissipated to the outside from the outer peripheral surface 90*a* and the cover member. Alternatively, a water cooling passage may be provided instead of the inverter fin 92. The inverter housing 90 may not have an annular shape as long as the inverter housing 90 is formed in a ring shape as a whole. For example, it is sufficient that the inverter outer peripheral wall 91 is formed in a polygonal shape in a top view instead of being annular in a top view. The polygonal shape is preferably, for example, a polygon having five sides or more.

Figure 40:
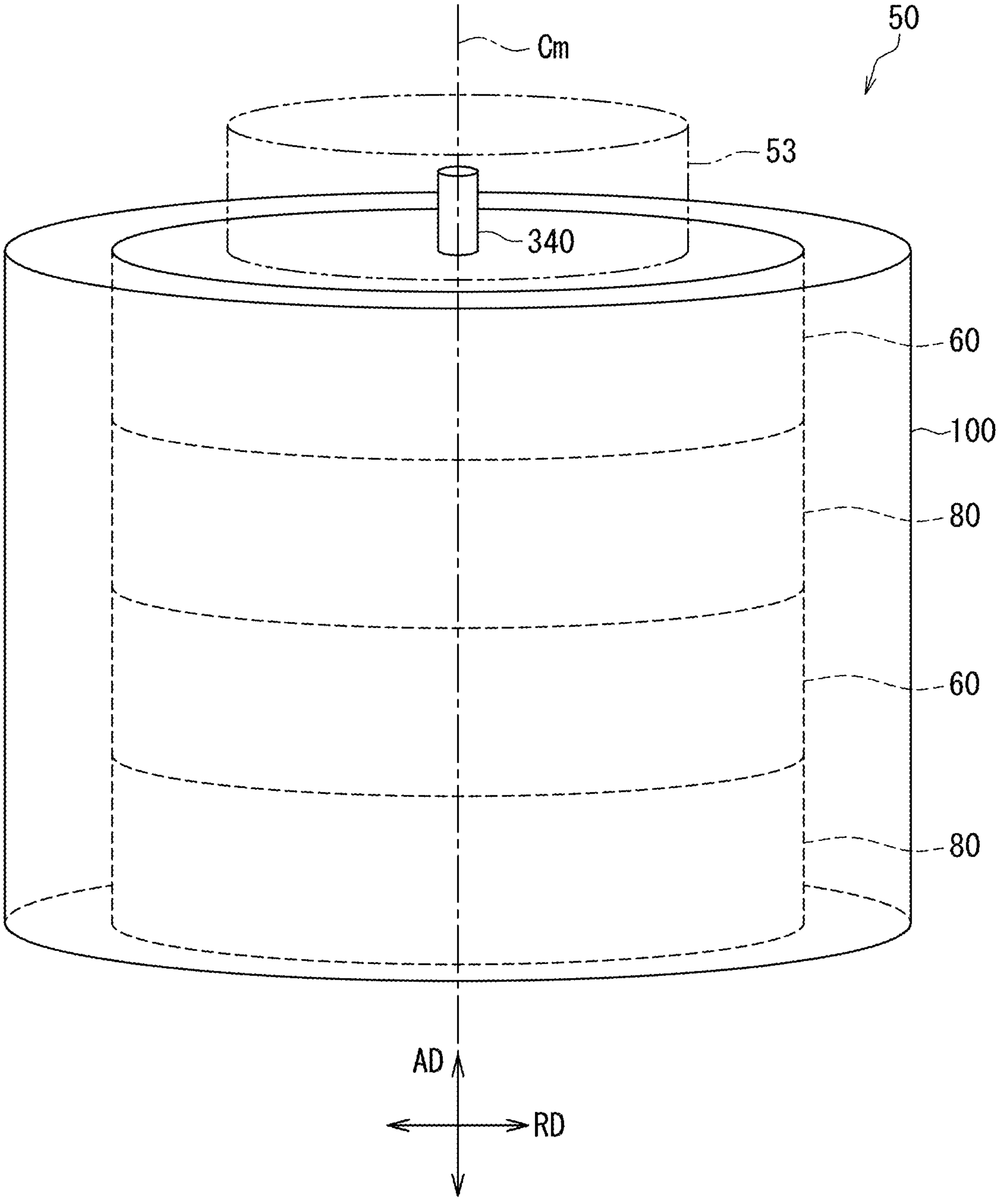
FIG. 40 is a perspective view illustrating a modification of an EPU.

In each of the above-described embodiments, the EPU 50 may include, in plurality, at least one of the motor device 60 and the inverter device 80. For example, as illustrated in FIG. 40, one EPU 50 may include two motor devices 60 and two inverter devices 80. In a configuration in which the EPU 50 includes, in plurality, at least one of the motor device 60 and the inverter device 80, all the motor devices 60 and all the inverter devices 80 may be arranged in the axial direction AD. In the configuration, for example, as illustrated in FIG. 40, the motor device 60 and the inverter device 80 may be alternately arranged. In the configuration, two motor devices 60 may be arranged adjacent to each other in the axial direction AD, or two inverter devices 80 may be arranged adjacent to each other in the axial direction AD. The inverter device 80 may be sandwiched between multiple motor devices 60, or one or more motor devices 60 may be sandwiched between multiple inverter devices 80.

It is preferable that the motor device 60 and the inverter device 80 are easily stacked in the axial direction AD. For example, in a configuration in which multiple inverter devices 80 are stacked in the axial direction AD, their respective inverter outer peripheral walls 91 preferably has the same shape and size in a top view. Accordingly, it is possible to deal with design changes such as redundancy improvement, output increase, and multiphase implementation of the EPU 50 by the motor device 60 and the inverter device 80. Further, in the EPU 50, the motor device 60 and the inverter device 80 may be arranged in the radial direction RD.

Figure 41:
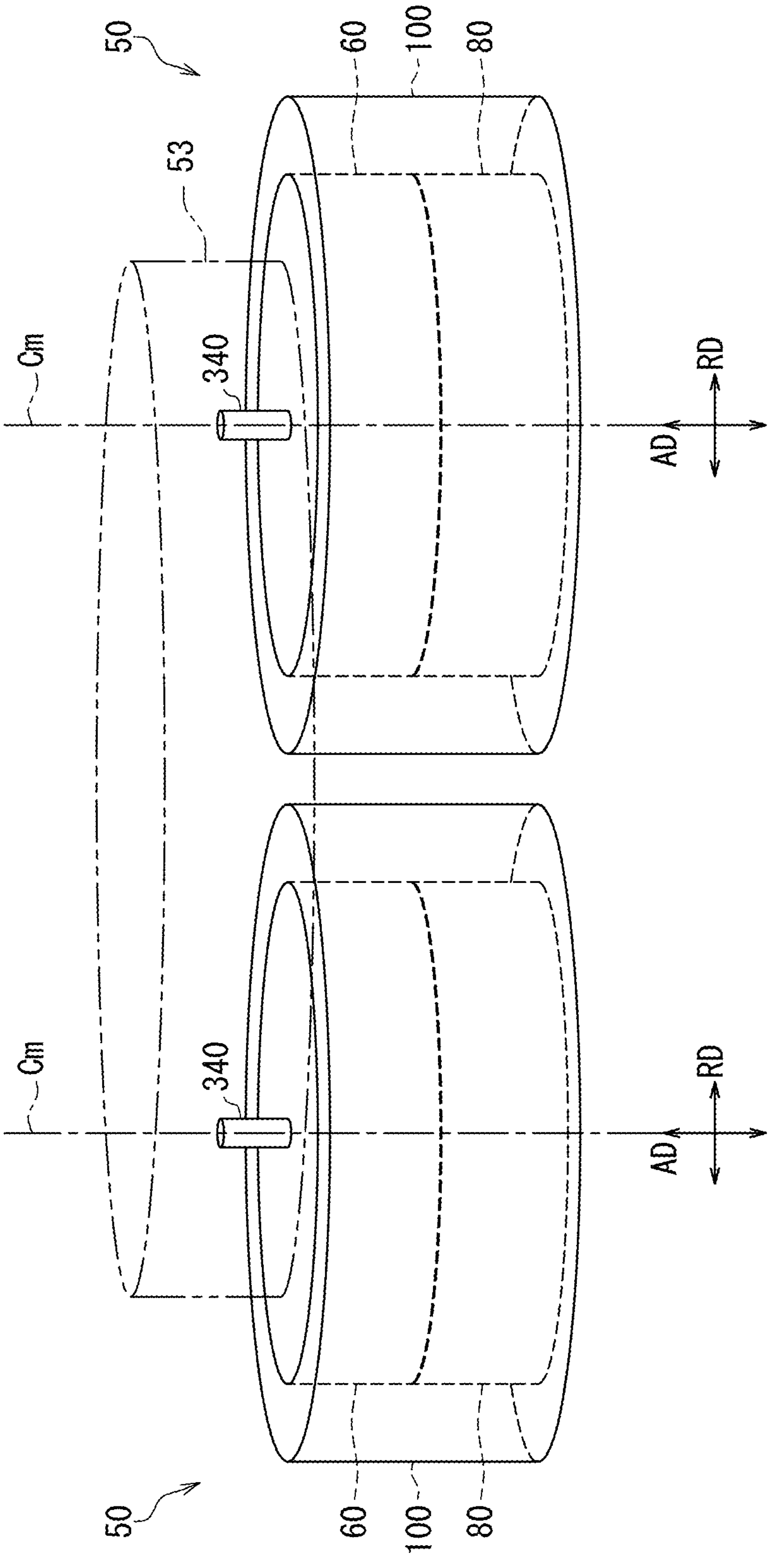
FIG. 41 is a perspective view illustrating a modification of an EPU.

In each of the above-described embodiments, at least one EPU 50 may be provided for an object to be driven such as a wheel and a rotary wing. For example, multiple EPUs 50 may be provided for one object to be driven. As illustrated in FIG. 41, two EPUs 50 may be provided for one speed reducer 53. The multiple EPUs 50 may be arranged in the radial direction RD.

In each of the above-described embodiments, the motor electric magnetic circuit 61 may be a radial gap motor. In the motor electric magnetic circuit 61, for example, the stator is provided on the radially outer side of the rotor. The rotor may be either an inner rotor or an outer rotor.

[Feature A1]

A power conversion device (80) for converting electric power, the power conversion device includes: a case (90) that includes an outer peripheral wall (91) extending in a ring shape; multiple beam portions (501) that extend toward an inner side from the outer peripheral wall in a radial direction (RD) of the outer peripheral wall and are arranged in a circumferential direction (CD) of the outer peripheral wall; a plate member (510, 550) that extends in a plate shape in a direction orthogonal to an axial direction (AD) of the outer peripheral wall and is fixed to the multiple beam portions while extending across the multiple beam portions; and a mounted component (146, 147, 525 to 528, 580) that is electrically connected and is mounted on the plate member.

[Feature A2]

The power conversion device according to feature A1, further includes: a first plate member (510) that is provided as the plate member on one side of the beam portion in the axial direction; and a second plate member (550) that is provided as the plate member on a side opposite to the first plate member with the beam portion interposed therebetween in the axial direction.

[Feature A3]

The power conversion device according to feature A2 is provided. The first plate member is a high voltage board (510) to which a high voltage is applied, and the second plate member is a low-voltage board (550) to which a low voltage lower than the high voltage is applied.

[Feature A4]

The power conversion device according to any one of features A1 to A3, further includes: multiple switch components (530) each of which includes a conversion switch (86) configured to convert electric power, that are arranged in the circumferential direction along an outer peripheral end (512, 552) of the plate member, and that are fixed to an inner peripheral surface (90*b*) of the outer peripheral wall.

[Feature A5]

The power conversion device according to feature A4, further includes: multiple switch groups (539) each of which includes multiple switch components arranged in the circumferential direction and that are arranged in the circumferential direction along the outer peripheral end of the plate member. The beam portion extends toward the inner side from the outer peripheral wall between two switch groups adjacent to each other in the circumferential direction.

[Feature A6]

The power conversion device according to feature A4 or A5 is provided. The switch component includes a switch main body (531) including a switch element, and a switch terminal (532 to 535) extending from the switch main body, and the switch main body is provided at a position spaced from the beam portion and the plate member.

[Feature A7]

The power conversion device according to any one of features A4 to A6, further includes: a heat dissipation fin (92) that extends toward an outer side in the radial direction from the outer peripheral wall and dissipates heat to an outside. The switch component is provided at a position aligned with the heat dissipation fin in the radial direction.

[Feature A8]

The power conversion device according to any one of features A1 to A7, further includes: a beam coupling portion (502) that is provided at a position spaced to the inner side in the radial direction from the outer peripheral wall and couples the multiple beam portions.

[Feature A9]

The power conversion device according to feature A8 is provided. The beam coupling portion extends in a ring shape in the circumferential direction.

[Feature A10]

The power conversion device according to any one of features A1 to A9 is provided. The beam portion and the outer peripheral wall are capable of heat transfer.

[Feature A11]

The power conversion device according to any one of features A1 to A10 is provided. The beam portion and the outer peripheral wall are electrically connected to each other.

[Feature A12]

A rotary electric machine unit (50) to be driven by a supply of electric power, the rotary electric machine unit includes: a rotary electric machine (60) that includes a rotor (300) and a stator (200); and a power conversion device (80) that converts electric power to be supplied to the rotary electric machine.

The power conversion device includes a case (90) that includes an outer peripheral wall (91) extending in a ring shape and is fixed to the rotary electric machine, multiple beam portions (501) that extend toward an inner side from the outer peripheral wall in a radial direction (RD) of the outer peripheral wall and are arranged in a circumferential direction (CD) of the outer peripheral wall, a plate member (510, 550) that extends in a plate shape in a direction orthogonal to an axial direction (AD) of the outer peripheral wall and is fixed to the multiple beam portions while extending across the multiple beam portions, and a mounted component (146, 147, 525 to 528, 580) that is electrically connected and is mounted on the plate member.

[Feature A13]

The rotary electric machine unit according to feature A12 is provided. In the power conversion device, the outer peripheral wall is a device outer peripheral wall (91).

The rotary electric machine includes an electric machine outer peripheral wall (71) that extends in a ring shape, accommodates the rotor and the stator, and is aligned with the device outer peripheral wall in the axial direction, and a cover portion (62) that is fixed to the electric machine outer peripheral wall and covers the rotor and the stator from a device outer peripheral wall side, and the power conversion device includes a heat insulating portion (545) that is provided between the plate member and the cover portion, that extends along the cover portion, and that has a heat insulating property.

[Feature A14]

A power conversion device that is a power conversion device or an inverter device (80) for converting electric power, the power conversion device includes: a case (90) including a ring-shaped outer peripheral wall (91); a transistor switch (530) provided on an inner side of the outer peripheral wall; a cooling fin (92) provided on an outer side of the outer peripheral wall; multiple beam portions (501) that extend toward the inner side from the outer peripheral wall in a radial direction (RD) of the outer peripheral wall and are arranged in a circumferential direction (CD) of the outer peripheral wall; a plate member (510, 550) that extends in a plate shape in a direction orthogonal to an axial direction (AD) of the outer peripheral wall and is fixed to the multiple beam portions while extending across the multiple beam portions; and a mounted component (146, 147, 525 to 528, 580) mounted on the plate member.

[Feature A15]

A rotary electric machine unit (50) to be driven by a supply of electric power. The rotary electric machine unit includes: a rotary electric machine (60) that includes a rotor (300) and a stator (200); and a power conversion device (80) that converts electric power to be supplied to the rotary electric machine.

The power conversion device is a power conversion device or an inverter device (80) for converting electric power, and includes a case (90) including a ring-shaped outer peripheral wall (91), a transistor switch (530) provided on an inner side of the outer peripheral wall, a cooling fin (92) provided on an outer side of the outer peripheral wall, multiple beam portions (501) that extend toward the inner side from the outer peripheral wall in a radial direction (RD) of the outer peripheral wall and are arranged in a circumferential direction (CD) of the outer peripheral wall, a plate member (510, 550) that extends in a plate shape in a direction orthogonal to an axial direction (AD) of the outer peripheral wall and is fixed to the multiple beam portions while extending across the multiple beam portions, and a mounted component (146, 147, 525 to 528, 580) mounted on the plate member.

[Feature B1]

A power conversion device (80) for converting electric power, the power conversion device includes: a high potential conductor (601) on a high potential side that extends in an extending direction (CD) and to which electric power is supplied; a low potential conductor (602) on a low potential side that extends in the extending direction along the high potential conductor and to which electric power is supplied; an output conductor (603) that extends in the extending direction along the high potential conductor and the low potential conductor and is configured to output electric power; an upper switch component (530A) on the high potential side configured to perform switching to convert electric power; a lower switch component (530B) on the low potential side configured to perform switching to convert electric power; and a capacitor component (580, 580A, 580B) that is electrically connected in parallel to the upper switch component and the lower switch component.

The upper switch component and the lower switch component are connected to the output conductor at positions spaced apart from each other in the extending direction such that an output current (IoA, IoB) flows through the output conductor from the upper switch component toward the lower switch component in the extending direction.

The capacitor component and the upper switch component are connected to the high potential conductor such that, in an overlap region (AO) overlapping the output current in the extending direction, a high potential current (IpA, IpB) flows through the high potential conductor from the capacitor component toward the upper switch component in a reverse direction to the output current.

The lower switch component and the capacitor component are connected to the low potential conductor such that, in the overlap region, a low potential current (InA, InB) flows through the low potential conductor from the lower switch component toward the capacitor component in a reverse direction to the output current.

[Feature B2]

The power conversion device according to feature B1 is provided. Multiple upper switch components included in one phase and multiple lower switch components included in one phase are arranged in the extending direction along the high potential conductor, the low potential conductor, and the output conductor.

[Feature B3]

The power conversion device according to feature B1 or B2, further includes: a case (90) including an outer peripheral wall (91) extending in a ring shape in a circumferential direction (CD) that is the extending direction.

The high potential conductor, the low potential conductor, and the output conductor extend in the circumferential direction along an inner peripheral surface (90*b*) of the outer peripheral wall.

The multiple upper switch components included in one phase and the multiple lower switch components included in one phase are arranged in the circumferential direction along the inner peripheral surface.

[Feature B4]

The power conversion device according to feature B3 is provided. The upper switch component and the lower switch component are located at a position spaced to an outer side in a radial direction (RD) from the high potential conductor, the low potential conductor, and the output conductor, and are provided on the inner peripheral surface.

[Feature B5]

The power conversion device according to feature B3 or B4, further includes: an upper capacitor component (580A) as the capacitor component that is provided at a position aligned with the upper switch component in a radial direction (RD) of the outer peripheral wall and spaced to an inner side in the radial direction from the upper switch component; and a lower capacitor component (580B) as the capacitor component that is provided at a position aligned with the lower switch component in the radial direction and spaced to the inner side in the radial direction from the lower switch component.

The upper capacitor component and the lower capacitor component include a high capacitor terminal (582) connected to the high potential conductor and a low capacitor terminal (583) connected to the low potential conductor.

In one of the upper capacitor component and the lower capacitor component, the high capacitor terminal is provided on an outer side in the radial direction with respect to the low capacitor terminal, and in the other, the low capacitor terminal is provided on the outer side in the radial direction with respect to the high capacitor terminal.

[Feature B6]

The power conversion device according to any one of features B1 to B5, further includes: an upper switch group (530GA) including multiple upper switch components that are included in one phase and are arranged in the extending direction; and a lower switch group (530GB) aligned with the upper switch group in the extending direction and including multiple lower switch components that are included in the phase same as the multiple upper switch components in the upper switch group and are arranged in the extending direction.

The overlap region is a region extending in the extending direction to extend from a farthest upper component (530Af) located farthest from the lower switch group among the multiple upper switch components in the upper switch group to a farthest lower component (530Bf) located farthest from the upper switch group among the multiple lower switch components in the lower switch group.

[Feature B7]

The power conversion device according to any one of features B1 to B6, further includes: a first capacitor group (580GA) including multiple first capacitor components (580A) as the capacitor component that are aligned with the upper switch component in an orthogonal direction (RD) orthogonal to the extending direction and that are arranged in the extending direction; and a second capacitor group (580GB) including multiple second capacitor components (580B) as the capacitor component that are aligned with the lower switch component in the orthogonal direction and that are arranged in the extending direction. The overlap region extends in the extending direction to extend from the first capacitor group to the second capacitor group.

[Feature B8]

The power conversion device according to any one of features B1 to B7 is provided. The high potential conductor, the low potential conductor, and the output conductor are each formed in a plate shape, and plate surfaces thereof face one another.

[Feature B9]

The power conversion device according to any one of features B1 to B8, further includes: multiple plate-shaped conductors (601 to 604) each of which has conductivity and is formed in a plate shape and that are stacked such that plate surfaces thereof face one another. The multiple plate-shaped conductors include the high potential conductor, the low potential conductor, and the output conductor, and the output conductor is provided between a first plate portion (601) and a second plate portion (602) among the multiple plate-shaped conductors.

[Feature B10]

The power conversion device according to feature B9 is provided. The multiple plate-shaped conductors include a ground conductor (604) that extends in the extending direction along the high potential conductor, the low potential conductor, and the output conductor and that is grounded, and the ground conductor is provided at at least one of a pair of outermost positions in the multiple plate-shaped conductors.

[Feature B11]

The power conversion device according to any one of features B1 to B10 is provided. Multiple high potential conductors, multiple low potential conductors, and multiple output conductors are provided. The upper switch component is connected to each of the multiple high potential conductors and is connected to each of the multiple output conductors. The lower switch component is connected to each of the multiple output conductors and is connected to each of the multiple low potential conductors, and the capacitor component is connected to each of the multiple high potential conductors and is connected to each of the multiple low potential conductors.

[Feature B12]

The power conversion device according to any one of features B1 to B11, further includes: an upper and lower arm circuit (83) electrically connected between the high potential conductor and the low potential conductor. The upper switch component includes an upper arm switch (86A) provided in an upper arm (84) of the upper and lower arm circuit, and the lower switch component includes a lower arm switch (86B) provided in a lower arm (85) of the upper and lower arm circuit.

[Feature B13]

A power conversion device (80) for converting electric power, the power conversion device includes: a high potential conductor (601) on a high potential side that extends in an extending direction (CD) and to which electric power is supplied; a low potential conductor (602) on a low potential side that extends in the extending direction along the high potential conductor and to which electric power is supplied; an output conductor (603) that extends in the extending direction along the high potential conductor and the low potential conductor and is configured to output electric power; an upper switch component (530A) that includes an upper input terminal (532A) connected to the high potential conductor and an upper output terminal (533A) connected to the output conductor and is configured to perform switching to convert electric power; a lower switch component (530B)

that includes a lower input terminal (532B) connected to the output conductor and a lower output terminal (533B) connected to the low potential conductor and is configured to perform switching to convert electric power; and a capacitor component (580, 580A, 580B) that includes a high capacitor terminal (582) connected to the high potential conductor and a low capacitor terminal (583) connected to the low potential conductor and is electrically connected in parallel to the upper switch component and the lower switch component.

The upper output terminal and the lower input terminal are connected to the output conductor at positions spaced apart from each other in the extending direction.

The upper input terminal and the high capacitor terminal are connected to the high potential conductor such that at least one of the upper input terminal and the high capacitor terminal is positioned between the upper output terminal and the lower input terminal and that the upper input terminal and the high capacitor terminal are spaced apart in the extending direction.

The lower output terminal and the low capacitor terminal are connected to the low potential conductor such that at least one of the lower output terminal and the low capacitor terminal is positioned between the upper output terminal and the lower output terminal and that the lower output terminal and the low capacitor terminal are spaced apart in the extending direction.

[Feature B14]

A power conversion device (80) for converting electric power, the conversion device includes: a power conductor (601, 602) that extends in an extending direction (CD) and to which electric power is supplied; an output conductor (603) that extends in the extending direction along the power conductor and is configured to output electric power; an upper switch component (530A) on a high potential side configured to perform switching to convert electric power; a lower switch component (530B) on a low potential side configured to perform switching to convert electric power; and a parallel component (580, 580A, 580B) that is electrically connected in parallel to the upper switch component and the lower switch component.

The upper switch component and the lower switch component are connected to the output conductor at positions spaced apart from each other in the extending direction such that an output current (IoA, IoB) flows through the output conductor from the upper switch component toward the lower switch component in the extending direction.

The parallel component and one of the upper switch component and the lower switch component are connected to the power conductor such that, in an overlap region (AO) overlapping the output current in the extending direction, a parallel current (IpA, IpB, InA, InB) flows through the power conductor between the parallel component and the one of the upper switch component and the lower switch component in a reverse direction to the output current.

[Feature C1]

A power conversion device (80) for converting electric power, the power conversion device includes: a case (90) that includes an outer peripheral wall (91) extending in a ring shape; a switch component (530) that includes a power terminal (532, 533) to which electric power is supplied, a control terminal (534, 535) configured to control conversion of electric power, and a switch main body (531) supporting the power terminal and the control terminal, and that performs switching to convert electric power; a power connection object (510) that includes a power outer peripheral end (512) extending in a circumferential direction (CD) of the outer peripheral wall along an inner peripheral surface (90*b*) of the outer peripheral wall and that is electrically connected to the power terminal; and a control connection object (550) that includes a control outer peripheral end (552) extending in the circumferential direction along the inner peripheral surface and that is electrically connected to the control terminal. Multiple switch components are arranged in the circumferential direction along the power outer peripheral end and the control outer peripheral end.

[Feature C2]

The power conversion device according to feature C1 is provided. The switch main body is provided at a position closer to the power connection object than to the control connection object.

[Feature C3]

The power conversion device according to feature C1 or C2 is provided. The control terminal includes a control connecting portion (534*ex*, 535*ex*) connecting the switch main body and the control connection object, and the power terminal includes a power connecting portion (532*ex*, 533*ex*) shorter than the control connecting portion and connecting the switch main body and the power connection object.

[Feature C4]

The power conversion device according to any one of features C1 to C3 is provided. The power terminal is in a turn-back shape of extending from the switch main body in a direction away from the power connection object in an axial direction (AD) of the outer peripheral wall and then extending in a direction approaching the power connection object.

[Feature C5]

The power conversion device according to any one of features C1 to C4 is provided. The power connection object is a power board (510) extending in a direction orthogonal to an axial direction (AD) of the outer peripheral wall. The control connection object is an object board (550) extending in the direction orthogonal to the axial direction. The power board and the object board are arranged in the axial direction.

[Feature C6]

The power conversion device according to feature C5 is provided. The power terminal is provided at a position spaced to a power board side from an intermediate position between the power board and the object board in the axial direction.

[Feature C7]

The power conversion device according to feature C5 or C6 is provided. The power board includes a power busbar (601, 602, 603) extending along the control outer peripheral end which is an outer peripheral end of the power board. The power terminal is electrically connected to the power board by being connected to the power busbar.

[Feature C8]

The power conversion device according to any one of features C1 to C7 is provided. The power outer peripheral end and the control outer peripheral end extend in a ring shape in the circumferential direction. A switch row (530R) formed by the multiple switch components arranged in the circumferential direction extends in a ring shape in the circumferential direction.

[Feature C9]

The power conversion device according to any one of features C1 to C8 is provided. The switch main body is provided on the inner peripheral surface.

[Feature C10]

The power conversion device according to feature C9 is provided. The switch main body has, as a pair of plate surfaces, an inner plate surface (531*a*) facing inward in a radial direction (RD) of the outer peripheral wall and an outer plate surface (531*b*) facing outward in the radial direction. Heat dissipated from the outer plate surface is more than heat dissipated from the inner plate surface.

[Feature D1]

A power conversion device (80) for converting electric power, the power conversion device includes: a case (90) that includes an outer peripheral wall (91) extending in a ring shape; and multiple heat generation components (530) that are arranged in a circumferential direction (CD) of the outer peripheral wall, are in contact with an inner peripheral surface (90*b*) of the outer peripheral wall, and generate heat by energization. An outer peripheral surface (90*a*) of the outer peripheral wall is a heat dissipation surface that dissipates heat, which is transferred from the heat generation component to the inner peripheral surface, to an outside.

[Feature D2]

The power conversion device according to feature D1, further includes: multiple minor heat components (524, 580) that are provided on an inner side with respect to the heat generation component (530) in a radial direction (RD) of the outer peripheral wall, are arranged in the circumferential direction, and generate less heat by energization than the heat generation component.

[Feature D3]

The power conversion device according to feature D2 is provided. A heat generation component row (530R) formed by the multiple heat generation components arranged in the circumferential direction extends in a ring shape in the circumferential direction. A minor heat component row (524R, 580R) formed by the multiple minor heat components arranged in the circumferential direction extends in a ring shape in the circumferential direction on the inner side with respect to the heat generation component row in the radial direction.

[Feature D4]

The power conversion device according to feature D2 or D3, further includes: multiple first minor heat components (580) as the minor heat component that are arranged in the circumferential direction; and multiple second minor heat components (524) as the minor heat component that are provided on the inner side with respect to the first minor heat component in the radial direction, are arranged in the circumferential direction, and generate less heat by energization than the first minor heat component.

[Feature D5]

The power conversion device according to feature D4 is provided. A first component row (580R) formed by the multiple first minor heat components arranged in the circumferential direction extends in a ring shape in the circumferential direction. A second component row (524R) formed by the multiple second minor heat components arranged in the circumferential direction extends in a ring shape in the circumferential direction on the inner side with respect to the first component row in the radial direction.

[Feature D6]

The power conversion device according to any one of features D2 to D5, further includes: a plate member (510) that is provided at a position spaced to the inner side in the radial direction from the inner peripheral surface and extends in a plate shape in a direction orthogonal to an axial direction (AD) of the outer peripheral wall. The multiple minor heat components are fixed to the plate member.

[Feature D7]

The power conversion device according to any one of features D2 to D6, further includes: Multiple heat generation groups (530G) arranged in the circumferential direction each of which includes multiple heat generation components arranged in the circumferential direction; and a group alignment component (580*c*) as the minor heat component provided at a position aligned with the heat generation group in the radial direction.

[Feature D8]

The power conversion device according to any one of features D2 to D7, further includes: multiple concentration regions (Asw1) arranged in the circumferential direction in each of which multiple heat generation components are concentrated; multiple intermediate regions (Asw2) arranged in the circumferential direction in each of which no heat generation component is provided and each of which is provided between two concentration regions adjacent to each other in the circumferential direction; an external connector (96) that is provided in the intermediate region on the outer peripheral wall and electrically connects the heat generation component to an external device (31); and a connector alignment component (524*b*) as a minor heat component that is provided at a position aligned with the external connector in the radial direction.

[Feature D9]

The power conversion device according to any one of features D1 to D8 is provided. The heat generation component includes a plate-shaped component main body (531) and a component terminal (532 to 535) extending from the component main body, and an outer plate surface (531*b*) of the component main body is in contact with the outer peripheral wall while being superimposed on the inner peripheral surface.

[Feature D10]

The power conversion device according to feature D9 is provided. In the component main body, heat dissipated from the outer plate surface is more than heat dissipated from an inner plate surface (531*a*) facing an opposite side to the outer plate surface.

[Feature D11]

The power conversion device according to feature D9 or D10, further includes: a connection board (510, 550) to which a component terminal is connected; and a board support portion (500) that is fixed to the outer peripheral wall and supports the connection board is provided. in the heat generation component, heat of the component main body is dissipated to an outside from the outer peripheral surface via the outer peripheral wall, and heat of the component terminal is dissipated to the outside from the outer peripheral surface via the board support portion and the outer peripheral wall.

What is claimed is:

1. A power conversion device configured to convert electric power, the power conversion device comprising:

a case that includes an outer peripheral wall extending in a ring shape;

a switch component that includes a power terminal to which electric power is to be supplied, a control terminal configured to control conversion of electric power, and a switch main body supporting the power terminal and the control terminal, and configured to perform switching to convert electric power;

a power connection object that includes a power outer peripheral end extending in a circumferential direction of the outer peripheral wall along an inner peripheral surface of the outer peripheral wall and electrically connected to the power terminal; and a control connection object that includes a control outer peripheral end extending in the circumferential direction along the inner peripheral surface and electrically connected to the control terminal, wherein multiple switch components are arranged in the circumferential direction along the power outer peripheral end and the control outer peripheral end.

2. The power conversion device according to claim 1, wherein the switch main body is provided at a position closer to the power connection object than to the control connection object.

3. The power conversion device according to claim 1, wherein the control terminal includes a control connecting portion connecting the switch main body and the control connection object, and the power terminal includes a power connecting portion shorter than the control connecting portion and connecting the switch main body and the power connection object.

4. The power conversion device according to claim 1, wherein the power terminal is in a turn-back shape extending from the switch main body in a direction away from the power connection object in an axial direction of the outer peripheral wall and further extending in a direction toward the power connection object.

5. The power conversion device according to claim 1, wherein the power connection object is a power board extending in a direction orthogonal to an axial direction of the outer peripheral wall, the control connection object is an object board extending in the direction orthogonal to the axial direction, and the power board and the object board are arranged in the axial direction.

6. The power conversion device according to claim 5, wherein the power terminal is provided at a position spaced toward the power board from an intermediate position between the power board and the object board in the axial direction.

7. The power conversion device according to claim 5, wherein the power board includes a power busbar extending along the control outer peripheral end which is an outer peripheral end of the power board, and the power terminal is electrically connected to the power board by being connected to the power busbar.

8. The power conversion device according to claim 1, wherein the power outer peripheral end and the control outer peripheral end extend in a ring shape in the circumferential direction, and a switch row formed by the multiple switch components arranged in the circumferential direction extends in a ring shape in the circumferential direction.

9. The power conversion device according to claim 1, wherein the switch main body is provided on the inner peripheral surface.

10. The power conversion device according to claim 9, wherein the switch main body has, as a pair of plate surfaces, an inner plate surface facing inward in a radial direction of the outer peripheral wall and an outer plate surface facing outward in the radial direction, and heat dissipated from the outer plate surface is more than heat dissipated from the inner plate surface.

* * * * *